US009323886B2

(12) United States Patent
Fukushige et al.

(10) Patent No.: US 9,323,886 B2
(45) Date of Patent: Apr. 26, 2016

(54) PERFORMANCE PREDICTING APPARATUS, PERFORMANCE PREDICTING METHOD, AND PROGRAM

(71) Applicant: HONDA MOTOR CO., LTD., Tokyo (JP)

(72) Inventors: Takahiro Fukushige, Wako (JP); Yusuke Uda, Wako (JP); Tokitomo Ariyoshi, Wako (JP); Yuki Okuma, Wako (JP); Tatsuya Okabe, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 487 days.

(21) Appl. No.: 13/926,104

(22) Filed: Jun. 25, 2013

(65) Prior Publication Data
US 2013/0346047 A1   Dec. 26, 2013

(30) Foreign Application Priority Data

Jun. 26, 2012   (JP) ................. 2012-142995
Jun. 26, 2012   (JP) ................. 2012-143085
Jun. 26, 2012   (JP) ................. 2012-143228
Jun. 26, 2012   (JP) ................. 2012-143229
Jun. 26, 2012   (JP) ................. 2012-143380
Jun. 26, 2012   (JP) ................. 2012-143381

(51) Int. Cl.
*G06F 17/50*   (2006.01)
*G06F 17/30*   (2006.01)

(52) U.S. Cl.
CPC .................. *G06F 17/5095* (2013.01)

(58) Field of Classification Search
USPC ........ 703/1, 2; 706/25, 45; 700/108; 707/737
See application file for complete search history.

(56) References Cited

U.S. PATENT DOCUMENTS 4,855,923 A  *  8/1989  Fullmer .............. B23P 19/00
                                                  700/108
7,899,652 B2    3/2011  Lu et al.
(Continued)

FOREIGN PATENT DOCUMENTS

JP   02-228763 A   9/1990
JP   04-367956 A   12/1992
(Continued)

OTHER PUBLICATIONS

Contour Based Shape Tweening by DP Matching, Sep. 2005, Ayako Takabatake, Hironobu Fujiyoshi (Chubu University), English translation included.

(Continued)

*Primary Examiner* — Thai Phan
(74) *Attorney, Agent, or Firm* — Rankin, Hill & Clark LLP

(57) ABSTRACT

A performance predicting apparatus includes an approximate model storage unit configured to store approximate models each of which is associated with one of categories, and which are used to calculate functional performance based on feature values, a feature value extracting unit configured to extract the feature values from shape data representing a shape of an object, a selection unit configured to select one of the approximate models to be used from the approximate models stored in the approximate model storage unit depending on the feature values extracted by the feature value extracting unit, and a performance calculating unit configured to calculate functional performance based on the feature values extracted by the feature value extracting unit using the approximate model selected by the selection unit.

41 Claims, 27 Drawing Sheets

(56) References Cited

U.S. PATENT DOCUMENTS

| | | | |
|---|---|---|---|
| 8,396,870 B2* | 3/2013 | Birdwell | G06F 17/30333 707/737 |
| 2008/0016016 A1* | 1/2008 | Mitarai | G06K 9/00288 706/25 |
| 2010/0057416 A1 | 3/2010 | Peterman et al. | |
| 2010/0150452 A1 | 6/2010 | Kamei | |
| 2010/0332475 A1* | 12/2010 | Birdwell | G06F 17/30333 707/737 |
| 2011/0040542 A1 | 2/2011 | Sendhoff et al. | |

FOREIGN PATENT DOCUMENTS

| | | |
|---|---|---|
| JP | 06-004843 U | 1/1994 |
| JP | 06-148038 A | 5/1994 |
| JP | 06-187315 A | 7/1994 |
| JP | 07-046761 A | 2/1995 |
| JP | 07-065168 A | 2/1995 |
| JP | 11-213026 A | 8/1999 |
| JP | 2000-339147 | 12/2000 |
| JP | 2006-194616 A | 7/2006 |
| JP | 2010-061439 | 3/2010 |
| JP | 2010-067259 A | 3/2010 |
| JP | 2010-146161 A | 7/2010 |
| JP | 2010-176368 A | 8/2010 |
| JP | 2011-040054 | 2/2011 |
| WO | 2008/114687 A1 | 9/2008 |
| WO | 2008/133235 | 11/2008 |

OTHER PUBLICATIONS

Tanaka, et al, "A Method of Learning BP Network by Expanding the Distribution of Category", IEICE Transactions on Communications, The Institute of Electronics, Information and Communication Engineers, Feb. 25, 1998, vol. J81-D-II, No. 2, pp. 293-300, with partial English translation, 11 pages.

Japanese Office Action, Application No. JP 2012-143085, dated Dec. 18, 2015 with English Translation, 6 pages.

Japanese Office Action, Application No. JP 2012-143381, dated Dec. 18, 2015 with English Translation, 6 pages.

Japanese Office Action, Application No. JP 2012-143380, dated Jan. 12, 2016 with English Translation, 6 pages.

* cited by examiner

FIG. 6

| VEHICLE TYPE | FIRST FEATURE VALUE | | | | | Cd VALUE |
|---|---|---|---|---|---|---|
| | $x_1$ | $x_2$ | $x_3$ | ---------- | $x_m$ | |
| D0 | ... | ... | ... | ---------- | ... | ... |
| D1 | ... | ... | ... | ---------- | ... | ... |
| D2 | ... | ... | ... | ---------- | ... | ... |
| ⋮ | ⋮ | ⋮ | ⋮ | | ⋮ | ⋮ |
| Dn | ... | ... | ... | ---------- | ... | ... |

FIG. 7

| VEHICLE TYPE | SECOND FEATURE VALUE | | | | | Cd VALUE |
|---|---|---|---|---|---|---|
| | $x_1$ | $x_2$ | $x_3$ | ---------- | $x_s$ | |
| D0 | ... | ... | ... | ---------- | ... | ... |
| D1 | ... | ... | ... | ---------- | ... | ... |
| D2 | ... | ... | ... | ---------- | ... | ... |
| ⋮ | ⋮ | ⋮ | ⋮ | | ⋮ | ⋮ |
| Dn | ... | ... | ... | ---------- | ... | ... |

FIG. 24

| VEHICLE TYPE | FIRST FEATURE VALUE | | | | | Cd VALUE |
|---|---|---|---|---|---|---|
| | X1 | X2 | X3 | ---------- | Xm | |
| D0 | ... | ... | ... | ---------- | ... | ... |
| D1 | ... | ... | ... | ---------- | ... | ... |
| D3 | ... | ... | ... | ---------- | ... | ... |
| ⋮ | ⋮ | ⋮ | ⋮ | | ⋮ | ⋮ |
| Dn | ... | ... | ... | ---------- | ... | ... |

FIG. 25

| VEHICLE TYPE | SECOND FEATURE VALUE | | | | | Cd VALUE |
|---|---|---|---|---|---|---|
| | X1 | X2 | X3 | ---------- | Xs | |
| D0 | ... | ... | ... | ---------- | ... | ... |
| D1 | ... | ... | ... | ---------- | ... | ... |
| D3 | ... | ... | ... | ---------- | ... | ... |
| ⋮ | ⋮ | ⋮ | ⋮ | | ⋮ | ⋮ |
| Dn | ... | ... | ... | ---------- | ... | ... |

PERFORMANCE PREDICTING APPARATUS, PERFORMANCE PREDICTING METHOD, AND PROGRAM

CROSS-REFERENCE TO RELATED APPLICATIONS

Priorities are claimed on Japanese Patent Applications No. 2012-142995, filed Jun. 26, 2012, No. 2012-143085, filed Jun. 26, 2012, No. 2012-143380, filed Jun. 26, 2012, No. 2012-143381, filed Jun. 26, 2012, No. 2012-143228, filed Jun. 26, 2012, and No. 2012-143229, filed Jun. 26, 2012, the contents of which are entirely incorporated herein by reference.

BACKGROUND OF THE INVENTION

1. Field of the Invention

The present invention relates to a performance predicting apparatus, a performance predicting method, and a program which predict functional performance of an object from its shape.

2. Description of Related Art

A computer supporting method is known which predicts various functional performances of an object based on design information representing the shape of the object. For example, Japanese Unexamined Patent Application, First Publication No. 2011-40054 (Patent Document 1) discloses that functional performance of an object, the design of which is changed by a computer aided design (CAD) system or the like, is calculated using an approximate model. In Japanese Unexamined Patent Application, First Publication No. 2010-61439 (Patent Document 2), a new parameter for interpolating neighboring parameters is created and it is determined whether the created parameter is proper based on solutions calculated using a plurality of objective functions for the created parameter. Japanese Unexamined Patent Application, First Publication No. 2000-339147 (Patent Document 3) discloses that one relational approximate expression is selected based on factor information representing conditions for software development out of a plurality of relational approximate expressions used to calculate an estimated workload and the estimated workload is calculated using the selected relational approximate expression. It is preferable that an approximate model have a feature value into which the shape of a predetermined part is quantified from a plurality of design information pieces used to create the approximate model as an input parameter thereof. PCT International Publication for Patent Application No. WO2008/133235 (Patent Document 4) discloses a technique of extracting feature points such as a fingerprint image through pattern matching. "Contour Based Shape Tweening by DMatching", written by Ayako TAKABATAKE and Hironobu FUJIYOSHI, Tokai-Section Joint Conference on Electrical and Related Engineering, September, 2005 (Non-patent Document 1), discloses a technique of extracting feature points of a profile shape using DP matching.

As described above, the techniques of predicting functional performance from design information of an object using an approximate model are known. However, when the shape of an object is complex and the amount of design information is large such as when an object is a vehicle and aerodynamic performance is calculated as the functional performance, prediction and calculation of functional performance of objects having different shapes using only a single approximate model may lower prediction accuracy. Patent Documents 1 to 4 do not mention how to predict functional performance with high accuracy when the amount of design information of an object is large.

When it is intended to extract a feature value from design information, it is necessary to specify feature points which are points forming a shape represented by the feature value. As a method of extracting feature points, it can be considered that a user of a system watches design information with their eyes and specifies feature points one by one; however, it is not practical to manually extract feature points from a large amount of design information for creating an approximate model.

In the method disclosed in Patent Document 4, pixels of an image are used as elements of multidimensional data used for pattern matching. However, a cross-sectional image of a three-dimensional shape is sparse. Accordingly, when multidimensional data having pixels as elements is used, there is a problem in that the extraction accuracy of feature points is lowered.

In the method disclosed in Non-patent Document 1, the lengths of line segments connecting the center of gravity of a profile shape to points on a profile line are used as the element of multidimensional data used for pattern matching. However, in this case, there is also a problem in that an inter-pattern linking error range may be wide and satisfactory accuracy may not be obtained.

In order to enhance the accuracy of an approximate model, it is necessary to create an approximate model using as much design information representing different shapes as possible. However, since capacity of a storage device storing the design information is limited, the amount of design information which can be stored in the storage device is limited. Therefore, design information not contributing to enhancement of the accuracy of an approximate model need not be recorded in the storage device.

When it is intended to enhance approximation accuracy (accuracy of aerodynamic performance calculated by a CFD) of an approximate model, it is necessary to increase the number of types of feature values which are the parameters of the approximate model.

Accordingly, when an approximate model is created, the number of feature values constituting the approximate model increases and the time necessary for creating the approximate model also increases.

When feature values of an approximate model simply increase, none of the feature values contribute to estimation of aerodynamic performance; however, some feature values may serve as noise in estimation of aerodynamic performance.

Only feature values previously known to contribute to approximation of aerodynamic performance have been used to create the approximate model; however, the types of feature values vary depending on the structure of an object approximated by an approximate model, and thus it is not possible to set feature values contributing to aerodynamic performance in advance in creating an approximate model.

As the number of designs as samples increases, the approximation accuracy of functional performance to be estimated rises.

However, as the number of designs increases, the time necessary to create an approximate model also increases.

It is desirable that the number of samples by which an approximate model satisfies predetermined approximation accuracy is known in advance. However, since the number of samples varies depending on the complexity of an object approximated by the approximate model, the number of samples cannot be set in advance.

Therefore, when the number of feature values or samples is set to be small, the approximation accuracy of a created approximate expression is lowered. On the other hand, when the number of feature values or samples is set to large, feature values serving as noise in estimation are included and the time necessary for creating an approximate model increases unnecessarily.

SUMMARY OF THE INVENTION

The present invention is made in consideration of the above-mentioned circumstances and an object thereof is to provide a performance predicting apparatus, a performance predicting method, and a program, which can efficiently determine a plurality of feature points of an object and can accurately predict functional performance even when the shape of the object is complex and the amount of design information is large.

An aspect of the invention provides a performance predicting apparatus including: an approximate model storage unit configured to store approximate models each of which is associated with one of categories, and which are used to calculate functional performance based on feature values; a feature value extracting unit configured to extract the feature values from shape data representing a shape of an object; a selection unit configured to select one of the approximate models to be used from the approximate models stored in the approximate model storage unit depending on the feature values extracted by the feature value extracting unit; and a performance calculating unit configured to calculate functional performance based on the feature values extracted by the feature value extracting unit using the approximate model selected by the selection unit.

The above performance predicting apparatus may further include an approximate model creating unit configured to create the approximate models associated with the categories using sets of the feature values and functional performance values of a learning object shape.

In the above performance predicting apparatus, the approximate model storage unit may store, in association with the categories, information on colors of parts of the object shape representing a strength of association with the functional performance, and the performance predicting apparatus may further include an output unit configured to read the information on colors of parts stored in the approximate model storage unit based on the category corresponding to that of the approximate model selected by the selection unit, and to display the object shape represented by the shape data in the colors of parts represented by the read information.

Another aspect of the invention provides a performance predicting method which is performed by a performance predicting apparatus including an approximate model storage unit configured to store approximate models each of which is associated with one of categories, and which are used to calculate functional performance based on feature values, the performance predicting method including: a feature value extracting step of causing a feature value extracting unit to extract the feature values from shape data representing a shape of an object; a selection step of causing a selection unit to select one of the approximate models to be used from the approximate models stored in the approximate model storage unit depending on the feature values extracted in the feature value extracting step; and a performance calculating step of causing a performance calculating unit to calculate functional performance based on the feature values extracted in the feature value extracting step using the approximate model selected in the selection step.

Another aspect of the invention provides a program causing a computer used as a performance predicting apparatus to serve as: an approximate model storage unit configured to store approximate models each of which is associated with one of categories, and which are used to calculate functional performance based on feature values; a feature value extracting unit configured to extract the feature values from shape data representing a shape of an object; a selection unit configured to select one of the approximate models to be used from the approximate models stored in the approximate model storage unit depending on the feature values extracted by the feature value extracting unit; and a performance calculating unit configured to calculate functional performance based on the feature values extracted by the feature value extracting unit using the approximate model selected by the selection unit.

The above performance predicting apparatus may further include a feature point determining device configured to determine and provide feature points of the object to the feature value extracting unit, and the feature point determining device may include: a profile shape data calculating unit configured to calculate profile shape data including at least an angle formed by line segments connecting a point to two points adjacent to the point for each of a plurality of points on a profile line of the object; a model storage unit configured to store profile shape data of a plurality of points on a profile line of a model object approximating the object and positions of feature points on the profile line in an associated manner; and a feature point specifying unit configured to specify positions of feature points of the object corresponding to the feature points stored in the model storage unit by performing pattern matching on the profile shape data calculated by the profile shape data calculating unit based on the profile shape data stored in the model storage unit.

In the above performance predicting apparatus, the feature point determining device may include a profile line extracting unit configured to extract an outermost profile line in a cross section of the object from three-dimensional data representing the shape of the object, and the model storage unit may store information of the outermost profile line in a cross section of three-dimensional data representing the shape of the model object as information of the profile line of the model object.

In the above performance predicting apparatus, the profile shape data may include lengths of line segments connecting the center of gravity of a region surrounded with the profile line to points on the profile line.

In the above performance predicting apparatus, the model storage unit may store a plurality of sets of information of the profile line and positions of the feature points, and the feature point specifying unit may perform the pattern matching using the set representing the profile line similar to the profile line of the object out of the sets of the information of the profile line and the positions of the feature points stored in the model storage unit.

The above performance predicting apparatus may further include a model recording unit configured to record the profile shape data calculated by the profile shape data calculating unit on the model storage unit.

In the above performance predicting apparatus, the feature point specifying unit may perform the pattern matching using DP matching.

In the above performance predicting apparatus, the profile line extracting unit may extract an outermost profile line of the object in a plurality of cross sections parallel to each other from three-dimensional data representing the shape of the object, the profile shape data calculating unit may calculate the profile shape data of the profile lines extracted by the profile line extracting unit, and the feature point specifying unit may specify three-dimensional coordinates of the feature points of the object by performing the pattern matching on the profile shape data calculated by the profile shape data calculating unit based on the profile shape data stored in the model storage unit.

In the above performance predicting apparatus, the profile shape data may include values relevant to brightness of points on the profile line.

The above performance predicting method may further include a feature point determining step using a feature point determining device configured to determine feature points of an object, and the feature point determining step may include: a step of causing a profile shape data calculating unit to calculate profile shape data including at least an angle formed by line segments connecting a point to two points adjacent to the point for each of a plurality of points on a profile line of the object; and a step of causing a feature point specifying unit to specify positions of feature points of the object corresponding to the feature points stored in a model storage unit, which is configured to store profile shape data of a plurality of points on a profile line of a model object approximating the object and positions of feature points on the profile line in an associated manner, by performing pattern matching on the profile shape data calculated by the profile shape data calculating unit based on the profile shape data stored in the model storage unit.

The above program may cause a feature point determining device configured to determine feature points of an object to serve as: a profile shape data calculating unit configured to calculate profile shape data including at least an angle formed by line segments connecting a point to two points adjacent to the point for each of a plurality of points on a profile line of the object; and a feature point specifying unit configured to specify positions of feature points of the object corresponding to the feature points stored in a model storage unit, which is configured to store profile shape data of a plurality of points on a profile line of a model object approximating the object and positions of feature points on the profile line in an associated manner, by performing pattern matching on the profile shape data calculated by the profile shape data calculating unit based on the profile shape data stored in the model storage unit, and the feature point determining device may provide the specified feature points to the feature value extracting unit.

The performance predicting apparatus may further include an approximate model creating device configured to create the approximate model, and the approximate model creating device may include: a first feature value extracting unit configured to create a first feature value table representing a first feature value of each structure model, which is extracted from the shapes of a plurality of structure models; a second feature value extracting unit configured to extract a second feature value which is a feature value contributing to estimation of the functional performance out of the first feature values of the first feature value table and to create a second feature value table; and an approximate model creating unit configured to create the approximate model which is an approximate expression for estimating the functional performance using the second feature values in the second feature value table.

In the above performance predicting apparatus, the second feature value extracting unit may extract the first feature value, in which a first weighting coefficient to be multiplied by the first feature values in a linear approximate model is equal to or more than a predetermined reduction threshold value, as the second feature value when creating the linear approximate model representing a linear relationship between the first feature values and the functional performance from a plurality of different shapes of the structure models.

In the above performance predicting apparatus, the approximate model creating unit may acquire a second weighting coefficient of each of a plurality of functions from the second feature values and creates the approximate model when constructing the approximate model including the plurality of functions representing correspondence between the functional performance and the second feature values from a plurality of different shapes of the structure models.

In the above performance predicting apparatus, the second feature value extracting unit may perform a process of extracting the second feature values from the first feature values using the linear approximate model in a VBSR method having the first feature value as a main variable and having the functional performance as a dependent variable.

In the above performance predicting apparatus, the approximate model creating unit may create the approximate model for estimating the functional performance using an approximate expression in a kriging method having the second feature value as a main variable and having the functional performance as a dependent variable.

The above performance predicting method may further include an approximate model creating step of creating the approximate model, and the approximate model creating step may include: a first feature value extracting step of causing a first feature value extracting unit to create a first feature value table representing a first feature value of each structure model, which is extracted from the shapes of the plurality of structure models; a second feature value extracting step of causing a second feature value extracting unit to extract a second feature value which is a feature value contributing to estimation of the functional performance out of the first feature values of the first feature value table and to create a second feature value table; and an approximate model creating step of causing an approximate model creating unit to create the approximate model which is an approximate expression for estimating the functional performance using the second feature values in the second feature value table.

The above program may cause the computer to perform operations of an approximate model creating device configured to create the approximate model, the computer may be caused to serve as: a first feature value extracting unit configured to create a first feature value table representing a first feature value of each structure model, which is extracted from the shapes of the plurality of structure models; a second feature value extracting unit configured to extract a second feature value which is a feature value contributing to estimation of the functional performance out of the first feature values of the first feature value table and creating a second feature value table; and an approximate model creating unit configured to create the approximate model which is an approximate expression for estimating the functional performance using the second feature values in the second feature value table.

The above performance predicting apparatus may further include an approximate model creating device configured to create the approximate model, the approximate model creating device may include: a sampling unit configured to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data; a distance calculating unit configured to calculate distances of the coordinate points of the sample group in the coordinate space for each of the second set number of coordinate points; a sample exclusion determining unit configured to compare the calculated distances with a predetermined distance threshold value; a morphing unit configured to perform a morphing process on a base shape using the morphing data to create a learning shape; and an approximate model creating unit configured to create the approximate model using the base shape and the learning shape, wherein the sampling unit samples the first set number of coordinate points in the first sampling and samples the second set number of coordinate points in the subsequent sampling when repeatedly sampling the morphing data, and the sample exclusion determining unit may merge the coordinate points, which are sampled by the second set number and of which the distances are greater than the distance threshold value, into the sample group as new morphing data.

The above performance predicting apparatus may further include a performance estimating unit configured to determine approximate accuracy of the approximate model, the sampling unit may sample test morphing data different from the morphing data used to create the approximate model from the design space, the performance estimating unit may determine the approximation accuracy using the functional performance value acquired using the test morphing data, and the approximate model creating unit may re-create an approximate model based on the morphing data of the sample group including the new morphing data acquired by the sampling unit.

In the above performance predicting apparatus, the experimental design method may be a Latin hyper square method, and the coordinate axes of the design space may be divided into a predetermined division number, hyper squares are constructed in the design space, and the coordinates of the hyper squares are used as the coordinate points.

In the above performance predicting apparatus, the distance threshold value may be set as a distance of a coordinate point at which the morphing data sampled at the second time or subsequently thereto have the same morphing result as morphing data in the sample group.

The above performance predicting method may further include an approximate model creating step of creating the approximate model, and the approximate model creating step include: a sampling step of causing a sampling unit to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data; a distance calculating step of causing a distance calculating unit to calculate distances of the coordinate points of the sample group in the coordinate space for each of the second set number of coordinate points; a sample exclusion determining step of causing a sample exclusion determining unit to compare the calculated distances with a predetermined distance threshold value; a morphing step of causing a morphing unit to perform a morphing process on a base shape using the morphing data to create a learning shape; and an approximate model creating step of causing an approximate model creating unit to create the approximate model using the base shape and the learning shape, the sampling unit may sample the first set number of coordinate points in the first sampling and samples the second set number of coordinate points in the subsequent sampling when repeatedly sampling the morphing data, and the sample exclusion determining unit may merge the coordinate points, which are sampled by the second set number and of which the distances are greater than the distance threshold value, into the sample group as new morphing data.

The above program may cause the computer to perform an approximate model creating of creating the approximate model, the computer may be caused to serve as: a sampling unit configured to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data; a distance calculating unit configured to calculate distances of the coordinate points of the sample group in the coordinate space for each of the second set number of coordinate points; a sample exclusion determining unit configured to compare the calculated distances with a predetermined distance threshold value; a morphing unit configured to perform a morphing process on a base shape using the morphing data to create a learning shape; and an approximate model creating unit configured to create the approximate model using the base shape and the learning shape, the sampling unit may sample the first set number of coordinate points in the first sampling and samples the second set number of coordinate points in the subsequent sampling when repeatedly sampling the morphing data, and the sample exclusion determining unit may merge the coordinate points, which are sampled by the second set number and of which the distances are greater than the distance threshold value, into the sample group as new morphing data.

The above performance predicting apparatus may further include a model applying device, and the model applying device may include: a storage unit configured to store a plurality of calculation models used to calculate a solution from input data; a data input unit configured to read the input data; a calculation model selecting unit configured to select at least one calculation model to be used out of the plurality of calculation models stored in the storage unit based on the input data read by the data input unit; and a calculation unit configured to calculate the solution from the input data using the calculation model selected by the calculation model selecting unit.

In the above performance predicting apparatus, the calculation model selecting unit may calculate an estimated value quantitatively representing that each of the plurality of calculation models is appropriately applied to the input data and selects the calculation model having the highest estimated value, and the calculation unit may calculate the solution from the input data using the calculation model selected by the calculation model selecting unit.

In the above performance predicting apparatus, the calculation model selecting unit may calculate an estimated value quantitatively representing that each of the plurality of calculation models is appropriately applied to the input data, and select at least one calculation model to be used out of the plurality of calculation models based on the calculated estimated value, and the calculation unit may calculate the solution from the input data using the calculation model selected by the calculation model selecting unit and the estimated value calculated from the selected calculation model.

In the above performance predicting apparatus, the calculation unit may weight and add solutions calculated from the input data using the calculation models selected by the calculation model selecting unit based on the estimated values calculated form the calculation models used for the calculation and calculates the solution.

In the above performance predicting apparatus, the plurality of approximate models may be classified and one class may include at least one approximate model.

The above performance predicting method may further include a model applying step which is performed by the model applying device including a storage unit configured to store a plurality of calculation models used to calculate a solution from input data, and the model applying step may include: a data input step of causing a data input unit to read the input data; a selection step of causing a calculation model selecting unit to select at least one calculation model to be used out of the plurality of calculation models stored in the storage unit based on the input data read in the data input step; and a calculation step of causing a calculation unit to calculate the solution from the input data using the calculation model selected in the selection step.

The above program may cause the computer used as a model applying device which is a part of the performance predicting apparatus to serve as: a storage unit configured to store a plurality of calculation models used to calculate a solution from input data; a data input unit configured to read the input data; a calculation model selecting unit configured to select at least one calculation model to be used out of the plurality of calculation models stored in the storage unit based on the input data read by the data input unit; and a calculating unit configured to calculate the solution from the input data using the calculation model selected by the calculation model selecting unit.

The above performance predicting apparatus may further include a recording permission determining device configured to determine whether new data should be entered into a storage device configured to store data including a plurality of parameters, and the recording permission determining device may include: an additional data acquiring unit configured to acquire new data; a position specifying unit configured to specify a position in a parameter space having the parameters of the new data acquired by the additional data acquiring unit as elements; a density determining unit configured to determine whether a density of the data stored in the storage device at the position specified by the position specifying unit is high; and a recording permission determining unit configured to determine that the new data acquired by the additional data acquiring unit should be entered into the storage device when the density determining unit determines that the density of the data at the position specified by the position specifying unit is low.

The above performance predicting apparatus may further include: a gravity center specifying unit configured to specify a position of the center of gravity of a data group stored in the storage device in the parameter space; a recorded data distance calculating unit configured to calculate the distance from the center of gravity specified by the gravity center specifying unit to a corresponding data piece for each piece of data stored in the storage device; and an additional data distance calculating unit configured to calculate the distance from the center of gravity specified by the gravity center specifying unit to new data acquired by the additional data acquiring unit, and the density determining unit may determine whether the density of the data at the position specified by the position specifying unit is high using the distance calculated by the additional data distance calculating unit and the distance calculated by the recorded data distance calculating unit.

In the above performance predicting apparatus, the density determining unit may determine that the density of the data at the position specified by the position specifying unit is low when the distance calculated by the addition data distance calculating unit is larger than the maximum value of the distance of the calculated by the recorded data distance calculating unit.

The above performance predicting apparatus may further include: a presence rate calculating unit that calculates a rate of data which is present within a predetermined distance range including the distance calculated by the additional data distance calculating unit based on the number of data pieces stored in the storage device, and the density determining unit may determine that the density of data at the position specified by the position specifying unit is low when the rate calculated by the presence rate calculating unit is equal to or less than a predetermined threshold value.

The above performance predicting method may further include a recording permission determining step performed by a recording permission determining unit configured to determine whether new data should be entered into a storage device configured to store data including a plurality of parameters, and the recording permission determining step may include: a step of causing an additional data acquiring unit to acquire new data; a step of causing a position specifying unit to specify a position in a parameter space having the parameters of the new data acquired by the additional data acquiring unit as elements; a step of causing a density determining unit to determine whether a density of the data stored in the storage device at the position specified by the position specifying unit is high; and a step of causing a recording permission determining unit to determine that the new data acquired by the additional data acquiring unit should be entered into the storage device when the density determining unit determines that the density of the data at the position specified by the position specifying unit is low.

The above program may cause the computer to serve as a recording permission determining device which is a part of the performance predicting apparatus and which is configured to determine whether new data should be entered into a storage device configured to store data including a plurality of parameters, and wherein the recording permission determining device may include: an additional data acquiring unit configured to acquire new data; a position specifying unit configured to specify a position in a parameter space having the parameters of the new data acquired by the additional data acquiring unit as elements; a density determining unit configured to determine whether a density of the data stored in the storage device at the position specified by the position specifying unit is high; and a recording permission determining unit configured to determine that the new data acquired by the additional data acquiring unit should be entered into the storage device when the density determining unit determines that the density of the data at the position specified by the position specifying unit is low.

According to the aspects of the invention, it is possible to accurately predict functional performance even when the design of an object is large-scaled and complex.

BRIEF DESCRIPTION OF THE DRAWINGS

FIG. 6 is a diagram illustrating a first feature value table according to the first embodiment.

FIG. 7 is a diagram illustrating a second feature value table according to the first embodiment.

FIG. 24 is a diagram illustrating a first feature table in which a first feature value and a Cd value are described for each vehicle design of base vehicles or learning vehicles by vehicle types.

FIG. 25 is a diagram illustrating a second feature table in which a second feature value and a Cd value are described for each vehicle design of base vehicles or learning vehicles by vehicle types.

DETAILED DESCRIPTION OF THE INVENTION

Hereinafter, embodiments of the invention will be described with reference to the accompanying drawings.
(Brief Description)

Figure 1:
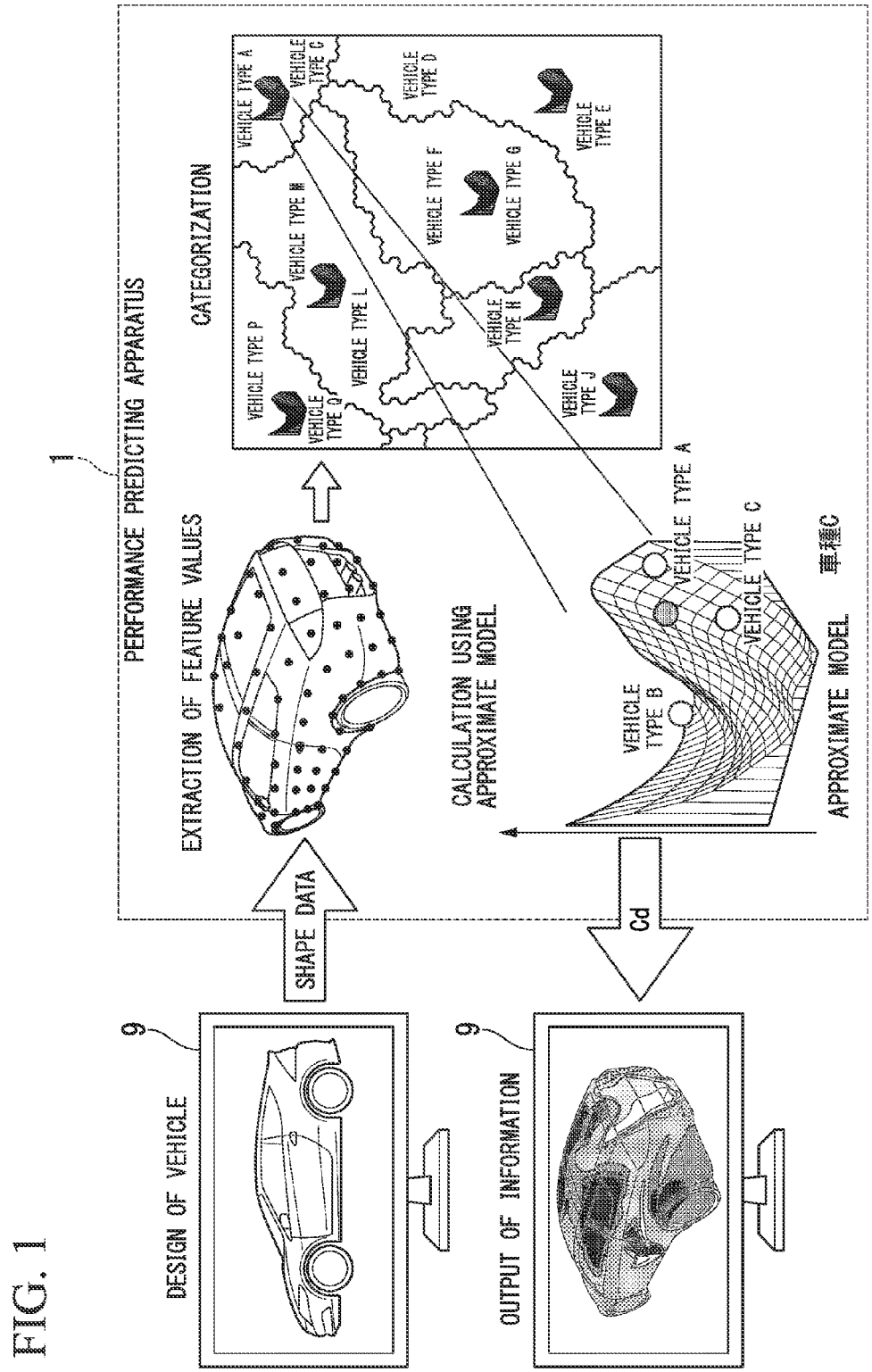
FIG. 1 is a diagram illustrating schematic processes in a performance predicting system according to a first embodiment of the invention.

FIG. 1 is a diagram illustrating schematic processes in a performance predicting system according to a first embodiment of the invention. The performance predicting system can be constructed as a client-server system and includes a performance predicting apparatus 1 as a server and designer terminals 9 as a client.

In the first embodiment, an example where an object of which functional performance should be predicted is a vehicle and functional performance to be predicted is aerodynamic performance will be described. A vehicle shape and aerodynamic performance of a vehicle have a close relationship. The performance predicting apparatus 1 according to the first embodiment creates approximate models for calculating an aerodynamic value (functional performance value) from feature values acquired from a vehicle shape (object shape) for each category of a vehicle. When receiving shape data of a vehicle (hereinafter, referred to as "design vehicle") designed by a designer using the designer terminal 9, the performance predicting apparatus 1 extracts the feature values representing the features of the vehicle shape from the received shape data. The performance predicting apparatus 1 selects an approximate model of what category to use from the extracted feature values of the design vehicle and calculates a coefficient of drag (hereinafter, referred to as "Cd value") as an aerodynamic performance value from the feature values of the design vehicle using the selected approximate model. The designer terminal 9 receives the Cd value from the performance predicting apparatus 1 and displays the received Cd value.
(Entire Configuration)

Figure 2:
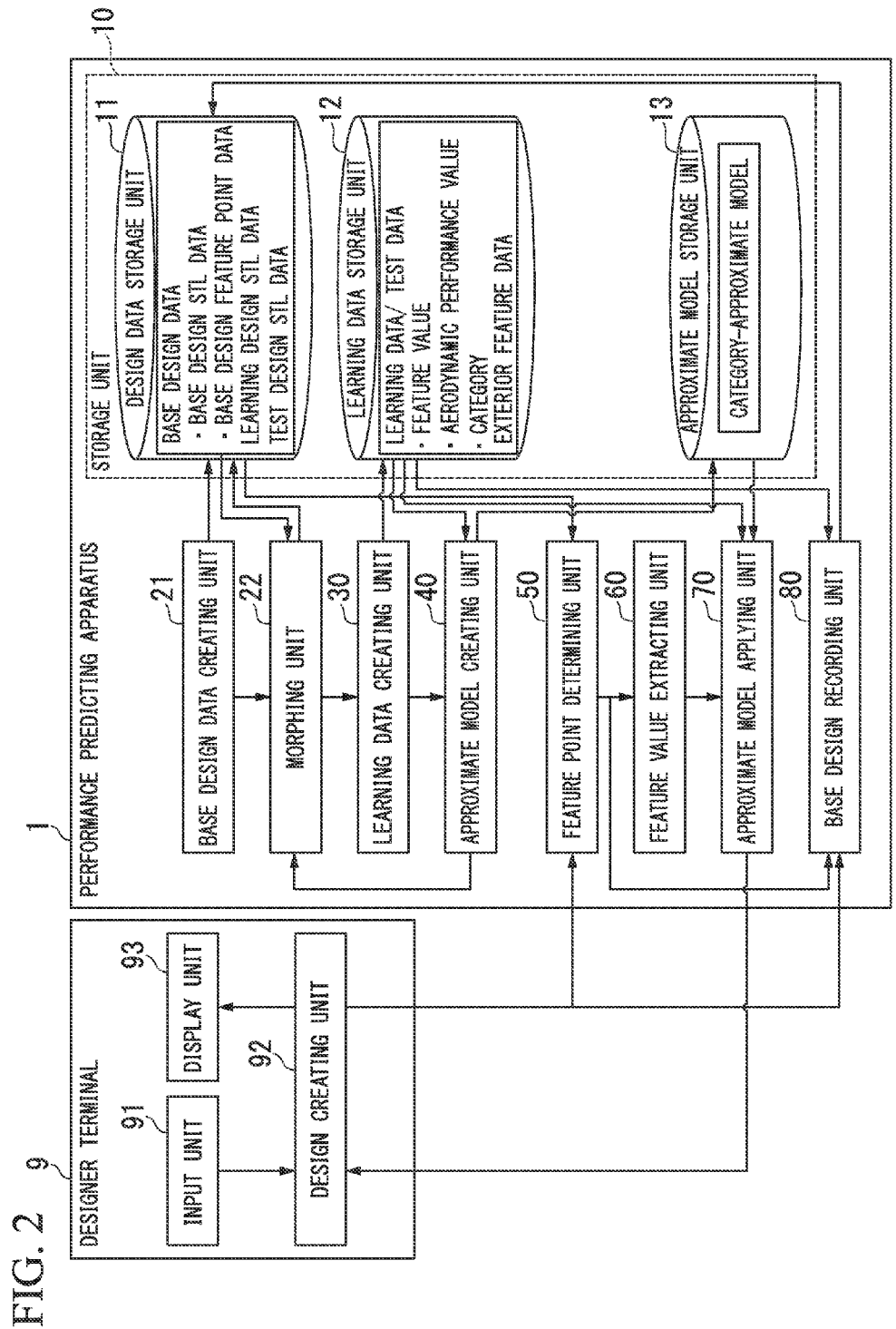
FIG. 2 is a block diagram illustrating the configuration of a performance predicting system according to the first embodiment.

FIG. 2 is a block diagram illustrating the configuration of the performance predicting system according to the first embodiment and extracts and shows only functional blocks associated with the first embodiment.

The performance predicting apparatus 1 is embodied by one or more computers and includes a storage unit 10, a base design data creating unit 21, a morphing unit 22, a learning data creating unit 30, an approximate model creating unit 40, a feature point determining unit 50, a feature value extracting unit 60, an approximate model applying unit 70, and a base design recording unit 80.

The storage unit 10 includes a design data storage unit 11, a learning data storage unit 12, and an approximate model storage unit 13.

The design data storage unit 11 stores base design data, learning design STL (Standard Triangulated Language) data, and test STL data. The base design data includes base design STL data of a base vehicle and base design feature point data. The base vehicle is a vehicle from which a learning vehicle which is a vehicle for creating an approximate model is created through morphing. The base design STL data expresses the vehicle shape of the base vehicle using STL data of a general format for expressing a three-dimensional shape. The base design feature point data represents feature points of the vehicle shape of the base vehicle. The feature points are used to extract a feature value. Examples of the feature value include a positioning coordinate of a predetermined position of a vehicle body, an angle of the surface, and a curvature. The learning design STL data is STL data representing the vehicle shape of a learning vehicle. The test STL data is STL data representing the vehicle shape of a test design used to estimate accuracy of an approximate model under creation.

The learning data storage unit 12 stores learning data, test data, and exterior feature data. The learning data includes feature values, aerodynamic performance values, and categories of each base vehicle and each learning vehicle. The test data includes feature values, aerodynamic performance values, and categories of each test design. The exterior feature data represents exterior features of each base vehicle and each learning vehicle. The approximate model storage unit 13 stores an approximate model of each category. An approximate model is a predicted approximate expression for calculating the aerodynamic performance values by receiving the feature values as an input parameter.

The base design data creating unit 21 creates base design STL data from CAD (Computer Aided Design) data representing the vehicle shape of a base vehicle and enters the created base design STL data into the design data storage unit 11. The morphing unit 22 deforms the vehicle shape of the base vehicle represented by the base design STL data based on determined conditions through a morphing technique according to the related art to create the vehicle shape of a learning vehicle, and enters the learning design STL data representing the created vehicle shape into the design data storage unit 11.

The learning data creating unit 30 reads the base design STL data and the learning design STL data, as the STL data used to create the learning data, from the design data storage unit 21. The learning data creating unit 30 calculates the aerodynamic performance values and calculates the feature values using CFD (Computational Fluid Dynamics) and the STL data used to create the learning data. When categorizing the base vehicles and the learning vehicles based on the exterior feature data created from the STL data used to create the learning data, the learning data creating unit 30 enters the learning data in which the features values, the aerodynamic performance values, and the categories of each base vehicle and each learning vehicle into the learning data storage unit 12. The approximate model creating unit 40 creates an approximate model from the learning data stored in the learning data storage unit 12 by categories, and enters the created approximate models into the approximate model storage unit 13.

The feature point determining unit 50 matches the vehicle shape of the base vehicle with the vehicle shape of the design vehicle created by the designer terminal 9, and determines the feature points of the design vehicle corresponding to the feature points of the base vehicle based on the matching result. The feature value extracting unit 60 extracts the feature values based on the feature points of the design vehicle determined by the feature point determining unit 50 and dimensional data of the design vehicle. The approximate model applying unit 70 selects an approximate model to be used based on the feature values of the design vehicle extracted by the feature value extracting unit 60. When reading the selected approximate model from the approximate model storage unit 13, the approximate model applying unit 70 calculates the aerodynamic performance values from the feature values of the design vehicle using the read approximate model and outputs the calculated aerodynamic performance values to the designer terminal 9. The base design recording unit 80 additionally enters the STL data of the design vehicle and the feature point data as data of a new base vehicle into the design data storage unit 11.

The designer terminal 9 is a computer such as a personal computer and includes an input unit 91, a design creating unit 92, and a display unit 93.

The input unit 91 includes a keyboard or a mouse, and receives an input from a designer. The display unit 93 is a display and displays an image. The design creating unit 92 can be embodied by a known CAD (Computer Aided Design) application for vehicle design and creates design data representing a vehicle shape of a design vehicle based on information input through the input unit 91. The design creating unit 92 receives the aerodynamic performance values of a design vehicle calculated by the approximate model applying unit 70 from the performance predicting apparatus 1 and displays the received aerodynamic performance values on the display unit 93.

In the drawing, only a single designer terminal 9 is shown; however, a plurality of designer terminals may be provided. The performance predicting apparatus 1 may include the input unit 91, the design creating unit 92, and the display unit 93.

(Overall Flow)

Figure 3:
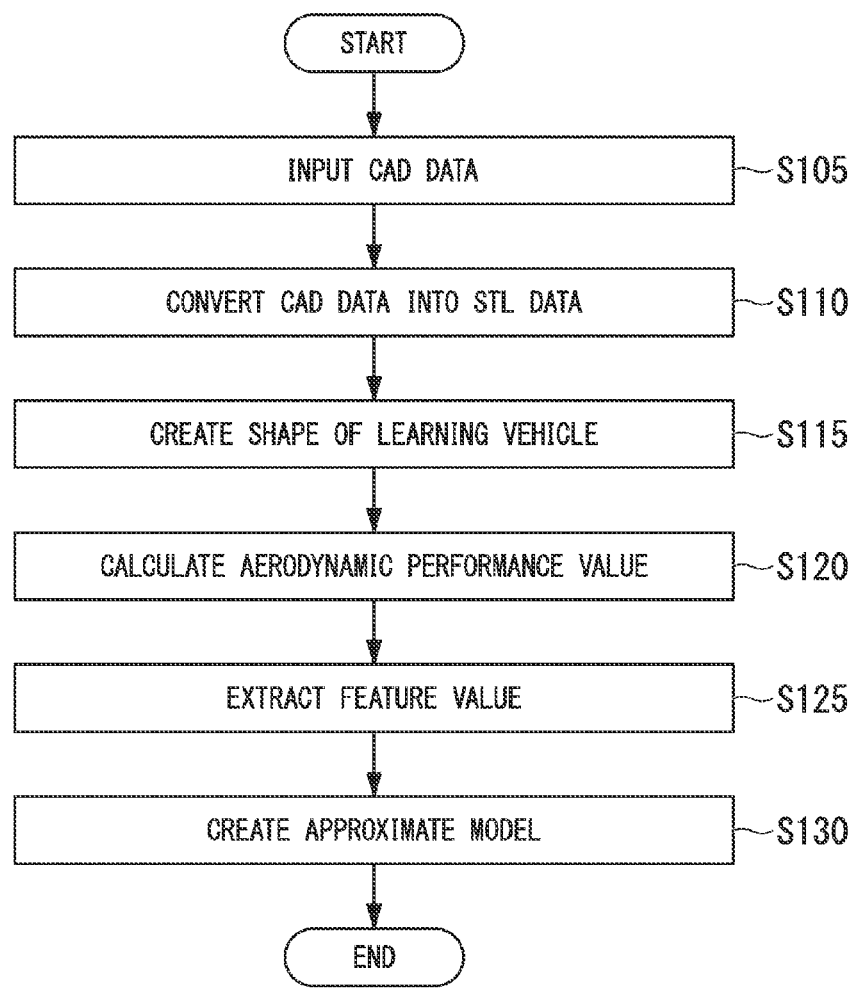
FIG. 3 is a flowchart illustrating the flow of operations of an approximate model creating process in the performance predicting apparatus 1 according to the first embodiment.

FIG. 3 is a flowchart illustrating the flow of operations of an approximate model creating process in the performance predicting apparatus 1.

First, the base design data creating unit 21 reads the CAD data of a base vehicle (step S105), and converts the read CAD data into based design STL data (step S110). The base design data creating unit 21 enters the base design STL data created for each base vehicle into the design data storage unit 11 so as to be stored therein. A user enters base design feature point data of each base vehicle into the design data storage unit 11.

A set of existing feature values and aerodynamic performance values (learning data) is required for creating an approximate model for estimating the aerodynamic performance values. Learning data acquired from the previously-created STL data can be used to create the approximate model; however, the amount of data may be insufficient for creating an approximate model with good accuracy. Therefore, by creating new STL data (learning design STL data) similar to the previously-created STL data (base design STL data) through a morphing process, the insufficiency of the amount of learning data is compensated for.

Therefore, first, the morphing unit 22 reads the base design STL data from the design data storage unit 11. The morphing unit 22 performs a morphing process of deforming the vehicle shape of the base vehicle under the conditions determined through an experimental design method and creating a vehicle shape of a learning vehicle (step S115). For example, an XYZ coordinate system having an X axis which is a horizontal axis in a front-rear direction of a vehicle, a Y axis which is a horizontal axis in a right-left direction, and a Z axis which is a vertical axis is assumed. The morphing unit 22 deforms the vehicle shape by displacing lattice points, which are located around a part to be deformed as control points out of the lattice points placed on the vehicle shape represented by the base design STL data, in the X direction, the Y direction, and the Z direction. The morphing unit 22 creates learning design STL data representing the vehicle shape of each learning vehicle created through the morphing process and enters the created learning design STL data into the design data storage unit 11. Similarly, the morphing unit 22 performs a morphing process of deforming the vehicle shape of the base vehicle and creating the vehicle shape of a test design under the conditions determined through the experimental design method, creates the test design STL data, and enters the created test design STL data into the design data storage unit 11.

The learning data creating unit 30 reads the learning design STL data created by the base design data creating unit 21 and the learning design STL data created by the morphing unit 22, as the STL data used to create the learning data, from the design data storage unit 11.

The learning data creating unit 30 creates spatial lattices for the vehicle shape represented by the STL data used to create the learning data, calculates the pressure and the velocity distribution for each lattice through the CFD, and acquires the aerodynamic performance values therefrom (step S120). The learning data creating unit 30 calculates the feature values of the vehicle from the STL data used to create the learning data (step S125). The learning data creating unit 30 performs the same process as performed when the STL data used to create the learning data is used, acquires the aerodynamic performance values based on the test design STL data read from the design data storage unit 11, and calculates the feature values of the vehicle.

Subsequently, the learning data creating unit 30 categorizes the base vehicles, the learning vehicles, and the test designs. The exterior of a vehicle is multi-dimensionally expressed, for example, using values such as a vehicle height, a vehicle width, a vehicle length, an A-pillar angle, and a wheel base as elements. Therefore, the learning data creating unit 30 acquires the exterior feature values representing the exterior features of the vehicle from the STL data used to create the learning data and the test design STL data, and creates exterior feature data which is multidimensional data having the acquired exterior feature values as elements. The learning data creating unit 30 categorizes the base vehicles, the learning vehicles, and the test designs through a self-organizing map method using the created exterior feature data. Accordingly, the base vehicles, the learning vehicles, and the test designs are classified into categories such as a box car, a wagon, a compact car, a sports car, a sedan, and an SUV (Sports Utility Vehicle). A user may input categories. After the base vehicles, the learning vehicles, and the test designs are categorized, the learning data creating unit 30 enters learning data in which the feature values, the aerodynamic performance values, and the categories of the base vehicles and the learning vehicles are correlated with each other into the learning data storage unit 12, and enters test data in which the feature values, the aerodynamic performance values, and the categories of the test designs are correlated with each other into the learning data storage unit 12. The learning data creating unit 30 enters the exterior feature data of the base vehicles and the learning vehicles into the learning data storage unit 12.

The approximate model creating unit 40 reads sets of the feature value and the aerodynamic performance value of the learning vehicle and the base vehicle in the same category from the learning data stored in the learning data storage unit 12, and creates an approximate model from the sets of the feature value and the aerodynamic performance value (step S130). In the process of creating an approximate model, the approximate model creating unit 40 estimates the approximate model under creation using the test data stored in the learning data storage unit 12, and increases the amount of learning data until an approximate model with high accuracy is created. The approximate model creating unit 40 enters the created approximate model into the approximate model storage unit 13 in correlation with the category corresponding to the set of the feature value and the aerodynamic performance used to create the approximate model. The created approximate model is an aerodynamic performance predicting approximate expression using only the feature values determined to have an influence on the aerodynamic performance as a parameter by the corresponding category. Since only the feature values determined to have an influence on the aerodynamic performance are used for the approximate model, the time necessary to calculate the aerodynamic performance is reduced, compared with a case where all the feature values are used. Depending on the categories, the approximate models are different from each other in the number of feature values to be used in addition to the coefficients of the feature values. The details of the approximate model creating process will be described later.

Figure 4:
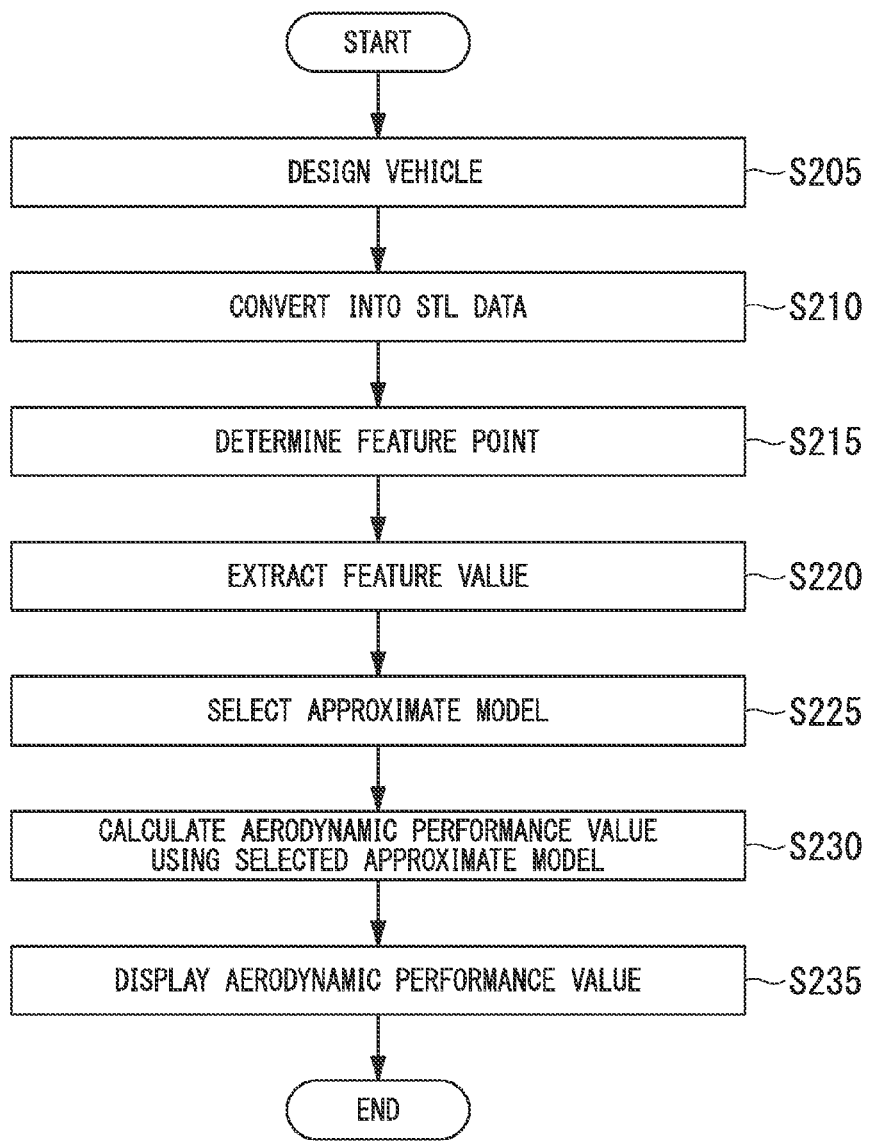
FIG. 4 is a flowchart illustrating the flow of operations of a performance predicting process in the performance predicting apparatus 1 according to the first embodiment.

FIG. 4 is a flowchart illustrating the flow of operations of the performance predicting process performed by the performance predicting apparatus 1.

The design creating unit 92 of the designer terminal 9 creates the vehicle shape of a design vehicle based on an instruction input by the designer. When the designer inputs an instruction to start up the performance predicting function and inputs dimensional data of the design vehicle through the input unit 91, the design creating unit 92 outputs the design data representing the vehicle shape created by the design creating unit 92 as shape data representing the vehicle shape of the design vehicle and the dimensional data input through the input unit 91 to the performance predicting apparatus 1.

The feature point determining unit 50 of the performance predicting apparatus 1 converts the design data received from the designer terminal 9 into STL data (step S210). The feature point determining unit 50 reads the base design STL data stored in the design data storage unit 11. The feature point determining unit 50 matches a profile shape of a cross section of a vehicle represented by the STL data of the design vehicle created in step S210 with a profile shape of a cross section of the vehicle represented by the base design STL data of the base vehicle most similar to the design vehicle. For example, DP (Dynamic Programmed) matching is used for this matching. The feature point determining unit 50 performs a matching process on the profile shapes of the cross sections at a plurality of positions of the vehicle, and determines the feature points of the design vehicle corresponding to the feature points of the base vehicle based on the matching result (step S215). For example, several thousands of feature points are determined. The details of the feature point determining process will be described later.

Subsequently, the feature value extracting unit 60 extracts the feature values from the three-dimensional coordinates of the feature points of the design vehicle determined by the feature point determining unit 50 in step S215 and the dimensional data of the design vehicle received in step S205 (step S220). For example, the feature value of the curvature of a bumper is calculated from the coordinates of a plurality of feature points on the bumper, and the feature value of a window angle is calculated from the coordinates of a plurality of feature points on the window. The coordinates of predetermined feature points serve as a feature value.

The feature values such as the vehicle height, the vehicle width, and the vehicle length can be acquired from the dimensional data of the design vehicle. Here, for example, several hundreds to thousands of feature values are acquired.

The approximate model applying unit 70 calculates an estimated value quantitatively representing that application to the feature values of the design vehicle extracted by the feature value extracting unit 60 in step S220 is proper for each approximate model of each category. Here, the approximate model applying unit 70 calculates the probability that the design vehicle belongs to each category as an estimated value based on the feature values of the design vehicle. The approximate model applying unit 70 selects an approximate model of what category to use based on the calculated probability (step S225). The approximate model applying unit 70 reads the selected approximate model from the approximate model storage unit 13 and calculates the aerodynamic performance value based on the feature values of the design vehicle using the read approximate model (step S230). The approximate model applying unit 70 outputs the Cd value, which is the calculated aerodynamic performance value, to the designer terminal 9.

The approximate model applying unit 70 creates sensitivity display screen data in which parts of a vehicle body (body) of the design vehicle are displayed in colors corresponding to the sensitivity of the Cd value of the corresponding parts, and outputs the created sensitivity display screen data to the designer terminal 9. The sensitivity of the Cd value is calculated by processing the data stored in the learning data storage unit 12. Therefore, for example, the colors of the parts determined based on the approximate models are stored in advance in the approximate model storage unit 13 for each category and information of the colors of the parts is read to correspond to the category of the design vehicle. The approximate model applying unit 70 creates the sensitivity display screen data in which the vehicle body of the design vehicle is displayed in the read colors of the parts. The design creating unit 92 of the designer terminal 9 displays the received Cd value and the sensitivity display screen data on the display unit 93 (step S235).

In order to create an approximate model of a new category, the base design recording unit 80 records STL data and feature point data of a design vehicle newly created by the designer terminal 9 as new base design data to the design data storage unit 11. On the other hand, since the capacity of the storage unit 10 is limited, it is preferable that data on the approximate model with satisfactory accuracy not be entered into the design data storage unit 11. Therefore, the base design recording unit 80 determines whether or not the data of the design vehicle newly created by the designer terminal 9 should be additionally entered into the learning data storage unit 12.

First, the base design recording unit 80 reads the exterior feature data of all the learning data stored in the learning data storage unit 12 and calculates the center of gravity when the read exterior feature data is arranged in a linear space. When calculating the distance from the center of gravity to the exterior feature data of the learning data, the base design recording unit 80 calculates an existence ratio of the exterior feature data based on the calculated distance. The existence ratio represents the density of the learning data in a design space which is a linear space in which the exterior feature data is arranged. The base design recording unit 80 creates the exterior feature data from the STL data of the design vehicle and calculates the distance from the center of gravity. The base design recording unit 80 determines the density of the learning data in the design space from the existence ratio of the exterior feature data of the learning data by the distance from the center of gravity calculated for the design vehicle. When it is determined that the density is low, the base design recording unit 80 records the STL data do the feature point data of the design vehicle as the new base design data on the design data storage unit 11. Thereafter, the performance predicting apparatus 1 performs the approximate model creating process shown in FIG. 3.

The detailed configurations and operations of the approximate model creating unit 40, the feature point determining unit 50, and the approximate model applying unit 70 will be described below.

Detailed Configuration and Operation of Approximate Model Creating Unit 40

Figure 5:
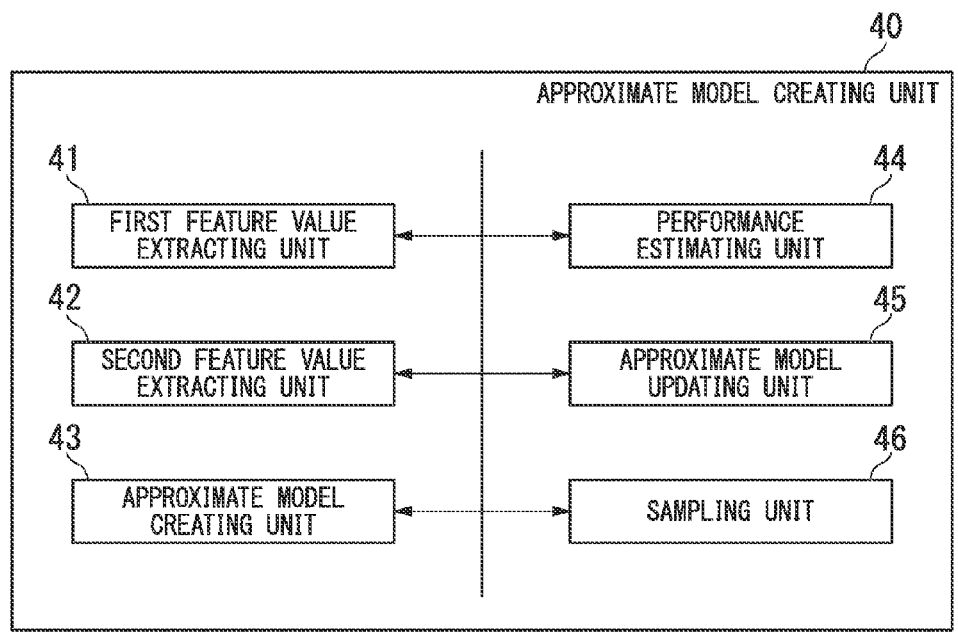
FIG. 5 is a block diagram illustrating a detailed configuration of an approximate model creating unit 40 according to the first embodiment.

FIG. 5 is a block diagram illustrating the detailed configuration of the approximate model creating unit 40. In FIG. 5, the approximate model creating unit 40 includes a first feature value extracting unit 41, a second feature value extracting unit 42, an approximate model creating unit 43, a performance estimating unit 44, an approximate model updating unit 45, and a sampling unit 46.

The first feature value extracting unit 41 reads the feature values and the Cd values of designs of the base vehicles and the learning vehicles from the learning data stored in the learning data storage unit 12 for each category, and enters the read values into a predetermined feature value table template to create a first feature value table shown in FIG. 6.

In FIG. 6, design D0 to design Dn in the vehicle type column represent base vehicles or learning vehicles, and the first feature values including the feature values ($X_1$ to $X_m$) extracted from each vehicle design and the Cd values are shown therein.

Referring to FIG. 5 again, in each of the categories, the second feature value extracting unit 42 extracts the second feature values from the first feature values by performing the model learning using the technique of using the ARD (Automatic Relevance Determination) for a model learning such as a VBSR (Variational Bayesian Sparse Progression) technique, and by removing the feature values not contributing to estimation of the Cd values which are aerodynamic performance values from the first feature values (which will be described later in detail).

The second feature value extracting unit 42 enters the feature values and the Cd values extracted for the base vehicle and the learning vehicle into a predetermined feature value table template, and creates the second feature table shown in FIG. 7 for each category.

Similarly to FIG. 6, in FIG. 7, design D0 to design Dn in the vehicle type column represent base vehicles or learning vehicles, and the feature values ($X_1$ to $X_s$) and the Cd values extracted for each design are described therein. Here, m and s satisfy the relationship of m>s.

Referring to FIG. 5 again, the approximate model crating unit 43 creates an approximate model approached by a plurality of functions (basis functions) and weighting coefficients of the functions from the second feature values and the Cd values of the second feature value table. Here, the approximate model crating unit 43 performs a model learning process (to be described later) of calculating coefficients (kriging coefficients in case of the kriging method) of the basis functions so as to pass through the feature values through the use of a kriging method or an SVR (Support Vector Regression) method.

The performance estimating unit 44 estimates the prediction accuracy of the approximate model created by the approximate model crating unit 43 using any one of three indices of index A, index B, and index C described below.

Index A is a correlation coefficient between a predicted value acquired from the approximate model and a calculated value acquired by calculation using CFD. Index B is a mean square error of the predicted value acquired from the approximate model and the calculated value acquired by calculation using CFD. Index C is the percentage of correct answers representing at what percentage the performance of a design pair can be predicted when the design pair is extracted from pairs used for the model learning.

The approximate model updating unit 45 calculates the approximation accuracy of the approximate model using any one of index A, index B, and index C. The approximate model updating unit 45 determines that an approximate model with predetermined accuracy is created when the used index is greater than a predetermined threshold value, and ends the approximate model creating process. The threshold value used herein is set in advance to correspond to the approximation accuracy necessary for estimation using the approximate model. At this time, the approximate model updating unit 45 extracts and uses a test design newly sampled from the learning data storage unit 12 using the experimental design method, unlike the creation of the approximate model, when calculating the index.

On the other hand, when any one of the indices A, B, and C is not greater than the predetermined threshold value, the approximate model updating unit 45 determines that an approximate model with predetermined accuracy is not created, and continuously performs the approximate model creating process.

The sampling unit 46 creates a plurality of learning morphing data pieces using an experimental design method (such as a Latin hyper square method or an LPτ method). The learning morphing data represents morphing conditions for creating the learning STL data representing a learning vehicle shape so as to uniformly distribute variation magnitudes of coordinates of lattice points in the base design STL data in the design space. This design space is a multidimensional space including an axis representing the varying distance for each lattice point within a coordinate variation allowable range of the lattice points in the base design STL data of a base vehicle. The sampling unit 46 outputs the learning morphing data used to create an approximate model to the morphing unit 22.

The sampling unit 46 creates test morphing data similarly to the learning morphing data and outputs the test morphing data to the morphing unit 22. The test morphing data represents morphing conditions for creating test design STL data used to calculate the approximation accuracy of the created approximate model. The test design STL data represents the vehicle shape of a test design different from that of the learning design STL data.

The morphing unit 22 morphs the base design STL data based on the learning morphing data and the test morphing data, and creates the learning design STL data and the test design STL data.

Hereinafter, a process of reducing the feature values not contributing to calculation of the Cd value from the first feature values, which is performed by the second feature value extracting unit 42, will be described below. In the following description, it is assumed that model learning based on the VBSR method is used as an example of the ADR technique.

The second feature value extracting unit 42 performs model learning, that is, a feature value reduction process, using an VBSR predicting approximate expression of Equation 1.

$$y_{mean} = \mu + \sum_{i=1}^{D} \theta_i x_i \quad (1)$$

In Equation 1, $y_{mean}$ represents an average value of the Cd values which are performance values, $x_i$ represents a feature value, $\mu$ represents a bias, $\theta_i$ represents a weighting coefficient of the feature value $x_i$, and D represents the number of types of feature values x valid in prediction using the model expression. The predicting approximate expression of Equation 1 is constituted by a simple linear coupling of a feature value and a weighting coefficient, expresses a line in one dimension, and expresses a plane in two dimensions.

In order to find the weighting coefficient having the relationship of Equation 1, the second feature value extracting unit 42 performs the following calculation.

First, a posterior distribution expressed by Equation 2 in the base estimation is expressed by Equation 3 through factorization in a variational Bayesian method. That is, the probability distribution of the Cd values (y) is calculated using a hidden variable α and the weighting coefficient θ as random variables.

$P(\theta, \alpha|y)$ represents the posterior probability indicating a set of θ and α with respect to an average Cd value. $P(y|\theta)$ represents a prior probability of the average Cd value with respect to θ, $P(\theta, \alpha)$ represents a prior probability of θ with respect to α, and $P(\alpha)$ represents a prior probability of α.

$$P(\theta, \alpha | y) = \frac{\int P(y|\theta) P(\theta|y) P(\alpha) d\alpha}{\iint P(y|\theta) P(\theta|\alpha) P(\alpha) d\alpha d\theta} \quad (2)$$

$$P(\theta, \alpha | y) = Q(\theta) Q(\alpha) \quad (3)$$

For Equation 3, the second feature value extracting unit 42 calculates $Q(\theta)$ and $Q(\alpha)$ in which $E(Q(\theta))$ and $E(Q(\alpha))$ are the maximum using Equations 4 and 5 based on Laplace approximation.

$$E(Q(\theta)) = \log Q(\theta) \approx -\frac{1}{2}(\theta - \bar{\theta})^t H(\theta - \bar{\theta}) + const \quad (4)$$

$$E(Q(\alpha)) = \log Q(\alpha) = \sum_{i=1}^{D} \left[ -\frac{1}{2} \langle \theta_i^2 \rangle_{Q(\theta)} \alpha_i - \frac{1}{2} \log \alpha_i \right] + const \quad (5)$$

In Equation 4, H represents a Hessian matrix. In Equation 5, $\langle \theta_i^2 \rangle_{Q(\theta)}$ represents the expected value of $\theta_i^2$ in $Q(\theta)$.

The second feature value extracting unit 42 performs an initialization process of $\alpha_i=1$ (i=1, 2, ..., D) and $\theta_i=0$ (i=1, 2, ..., D), calculates a gradient ∂E/∂θ, and calculates the hessian matrix through $\partial E^2/\partial \theta \partial \theta^t$ from this gradient. In this Hessian matrix, $\theta^t$ represents a transposed matrix of θ.

The second feature value extracting unit 42 sequentially updates θ in Equation 4 using a Newton method. The second feature value extracting unit 42 calculates and updates α in Equation 5 using the updated θ.

When the updating is performed, the second feature value extracting unit 42 deletes $\theta_i$ less than a predetermined reduction threshold value, newly calculates $\partial E/\partial \theta$, calculates the Hessian matrix using $\partial E^2/\partial\theta\partial\theta^t$, and updates θ and α using Equations 4 and 5. Here, the reduction threshold value is set in advance to the value of the coefficient θ not contributing to estimation of the Cd value and experimentally acquired through a simulation result or the like.

The second feature value extracting unit 42 calculates the gradient and repeatedly performs the process of updating θ and α until the point at which $\theta_i$ less than the reduction threshold value disappears.

When $\theta_i$ less than the reduction threshold value disappears, the second feature value extracting unit 42 deletes the Cd values in the first feature values and creates the second feature value table shown in FIG. 7 newly using the remaining feature values as the second feature values.

The approximate model creating process based on the model learning using the second feature values, which is performed by the approximate model crating unit 43, will be described below. In the following description, it is assumed that the model learning using the kriging method is used as an example.

The approximate model crating unit 43 finally find a kriging prediction expression as an approximate model expressed by Equation 6. Equation 6 is an approximate model for estimating a predicted value $y_a$ based on a function $f_i(x_i)$ depending on the feature values $x_i$ and based on the weighting coefficient $C_i$ thereof.

$$y_a = C_0 + \sum_{i=1}^{N} C_i f_i(x_i) \tag{6}$$

In Equation 6, the weighting coefficient $C_i$ and the function $f_i(x_i)$ are expressed by Equations 7 and 8. The subscript i represents a number indicating data of a design used to create the approximate model.

$$C_i = (R(x_i, x_j)^{-1}(y_a - I\mu)) \tag{7}$$

$$f_i(x_i) = R(x, x_i) \tag{8}$$

In Equation 7, $R(x_i, x_j)^{-1}$ represents an inverse matrix of a spatial correlation matrix of the feature values, and the spatial correlation matrix $R(x_i, x_j)$ is expressed by Equations 9 and 10. $R(x, x_i)$ is a matrix representing the spatial position relationship between the feature values in prediction and the feature values in the second feature values, and $R(x_i, x_j)$ is a matrix representing the position relationship between the feature values in the second feature values. The coefficient β in Equation 9 is expressed by Equation 10.

$$R(x_i, x_j) = \prod_{d=1}^{D} e^{-\beta} \tag{9}$$

$$\beta = \theta^d |x_i^d - x_j^d|^{p^d} \tag{10}$$

In Equation 9, D represents the number of feature values constituting an approximate model. The subscript d in Equation 10 represents the number representing the feature values. θ represents a kriging coefficient and is a numerical value used to determine the spatial correlation range. Here, p represents the numeral value used to determine the smoothness of the spatial correlation relationship.

The vertical matrix $r_r$ in the correlation matrix R of Equation 9 is expressed by Equation 11. In Equation 11, the subscript t represents a transposition.

$$r_r{}^t = (R(x, x_1), R(x, x_2), \ldots, R(x, x_N)) \tag{11}$$

In Equation 6, the bias $C_0$ is expressed by Equation 12. In Equation 12, I represents a unit vector.

$$C_0 = \frac{I^t R(x_i, x_j)^{-1} y}{I^t R(x_i, x_j)^{-1} I} \tag{12}$$

The kriging coefficient θ is calculated for each feature value $x^d$, and is determined so as to maximize the likelihood Ln in Equation 13.

$$\ln(Ln) = -\frac{1}{2}\ln(\sigma^2) - \frac{1}{2}\ln|R(x_i, x_j)| \tag{13}$$

In Equation 13, the approximate variance value $\sigma^2$ is calculated by Equation 14. In Equation 14, N represents the number of designs (base vehicles and learning vehicles) used to create the approximate model.

$$\sigma^2 = \frac{(y - I\mu)^t R(x_i, x_j)^{-1}(y - I\mu)}{N} \tag{14}$$

The approximate model creating unit 43 calculates the kriging coefficient θ in which the above-mentioned ln (Ln) is maximized for each feature value. A gradient method, a simulated annealing method, a genetic algorithm, or the like using Equation 13 is used as the optimization method of the kriging coefficient θ and the coefficient p. In the first embodiment, in order to prevent convergence on the local optimal solution, a global search is performed using an genetic algorithm, and then a simulated annealing method is used to cause the ln (Ln) to converge on the maximum.

The process of estimating prediction accuracy of an approximate expression, which is performed by the performance estimating unit 44, will be described below. The performance estimating unit 44 calculates an index for estimating the approximate accuracy of an approximate model using any one of Equations 15, 16, and 17. Expressions 15, 16, and 17 calculate index A (correlation coefficient $r_p$), index B (mean square error RMSE), and index C (percentage of correct answers τ), respectively.

$$r_p = \frac{\sum_{n=1}^{N}(y_n - ye_n)(y' - ye')}{\sqrt{\sum_{n=1}^{N}(y_n - ye_n)^2}\sqrt{\sum_{n=1}^{N}(y' - ye')^2}} \tag{15}$$

$$RMSE = \sqrt{\sum_{n=1}^{N}|y_n - y'|/N} \tag{16}$$

In Equations 15 and 16, $y_n$ represents the Cd value calculated through the CFD for each design, and y' is the average of $y_n$. In addition, $ye_n$ represents the Cd estimated using the approximate model for each design and y' is the average value of $ye_n$. N represents the number of designs used to create the approximate model.

$$\tau = 100 \times (N_{cp} - N_{dp}) / \left(\frac{1}{2}n(n-1)\right) \quad (17)$$

In Equation 17, $N_{dp}$ represents the number of pairs of which succeeds in tendency prediction, $N_{cp}$ represents the number of pairs failing in tendency prediction, and n represents the number of designs used to create the approximate model. The success in tendency prediction means that the Cd value calculated through the CFD and the Dc value calculated using the approximate model are equal to each other in magnitude in a design pair. On the other hand, the fail in tendency prediction means that the Cd value calculated through the CFD and the Dc value calculated using the approximate model are not equal to each other in magnitude in a design pair.

Figure 8:
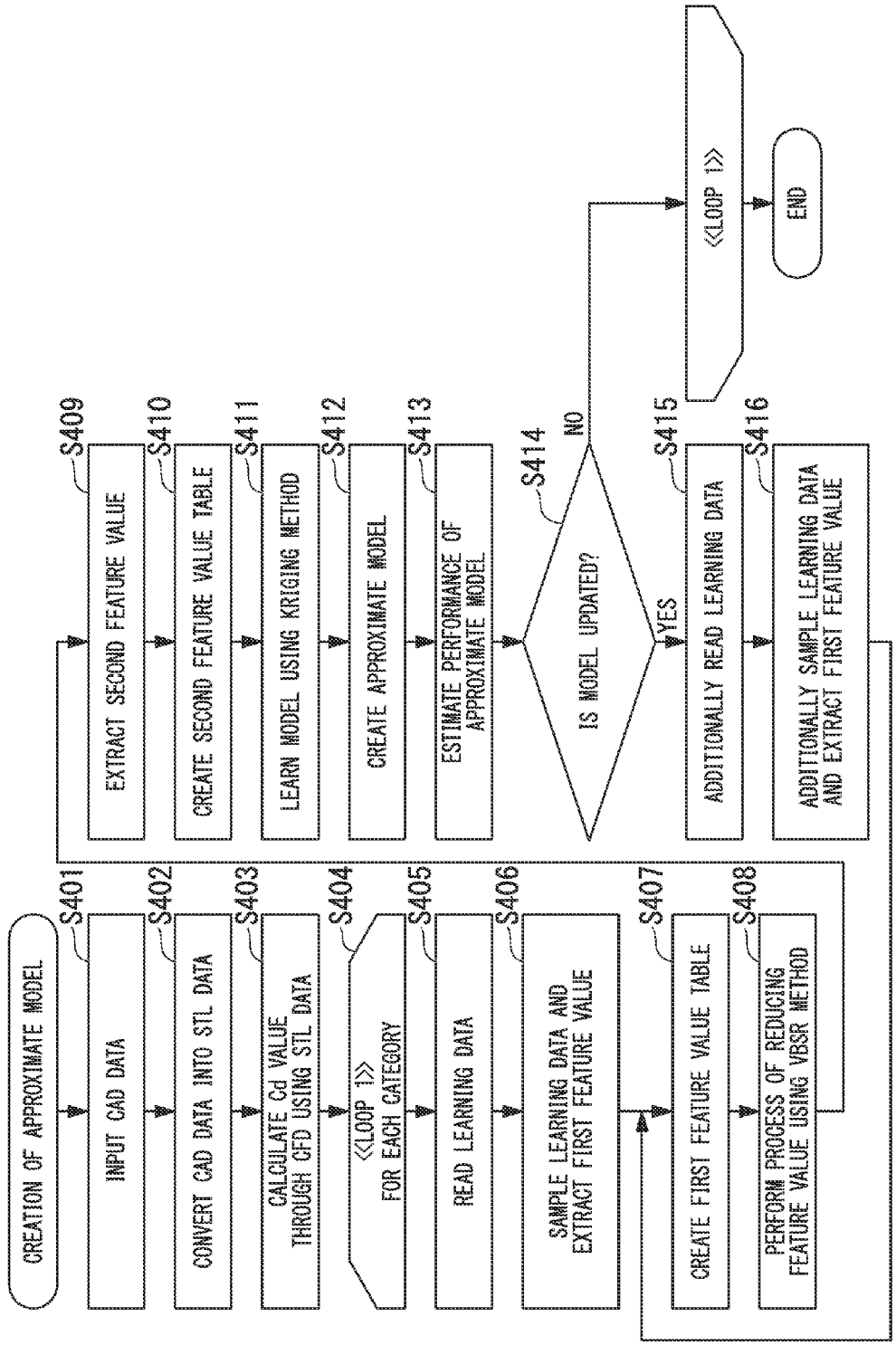
FIG. 8 is a flowchart illustrating the flow of operations of an approximate model creating process in an approximate model creating unit 40 according to the first embodiment.

The operation of the approximate model creating unit 40 will be described below with reference to FIGS. 5 and 8. FIG. 8 is a flowchart illustrating the flow of operations in an approximate model creating process of the approximate model creating unit 40.

First, the sampling unit 46 outputs learning morphing data and test morphing data used to create learning design STL data created based on an experimental design method and test design STL data to the morphing unit 22.

The base design data creating unit 21 performs the process of step S105 of FIG. 3 to read CAD data of a base vehicle (step S401). The base design data creating unit 21 performs the process of step S110 of FIG. 3 to convert the read CAD data into base design STL data. The base design data creating unit 21 stores the created base design STL data in the design data storage unit 11 to correspond to the base vehicle (step S402).

As shown in steps S120 and S125 of FIG. 3, the learning data creating unit 30 creates and stores learning data and the test data in the learning data storage unit 12 by calculating the Cd values through the CFD using the base design STL data, the learning design STL data created by morphing, and the test design STL data and extracting and categorizing the feature values (step S403).

The approximate model creating unit 40 performs the processes of steps S405 to S416 for each category set for the learning data of the learning data storage unit 12 as the process of step S130 of FIG. 3 (step S404).

The first feature value extracting unit 41 reads the learning data in which the category as a current process target is set from the learning data storage unit 12 (step S405). The first feature value extracting unit 41 extracts a set of a feature value and a Cd value from the read learning data (step S406), creates a first feature value table (step S407), and enters the created first feature value table into the learning data storage unit 12 so as to be stored therein.

The second feature value extracting unit 42 removes the feature value not contributing to estimation of the Cd values from the first feature values read from the first feature value table of the learning data storage unit 12 through the use of the technique of using the ARD for a model learning such as a VBSR method (step S408). The second feature value extracting unit 42 extracts the remaining feature values not removed from the first feature values as the second feature values (step S409), creates a second feature value table (step S410), and enters the created second feature value table into the learning data storage unit 12 so as to be stored therein.

The approximate model creating unit 43 reads the second feature values from the second feature value table of the learning data storage unit 12. The approximate model creating unit 43 learns a model based on a kriging method using the feature values of the read second feature values and Equation 13 (step S411) and creates an approximate model which is a kriging prediction expression (step S412).

The performance estimating unit 44 reads test data from the learning data storage unit 12 and calculates the Cd values of the vehicle shape of the test data using the approximate model created by the approximate model creating unit 43 based on the feature values of the test data. The performance estimating unit 44 reads the Cd values of the vehicle shape of the test data acquired through the CFD from the learning data storage unit 12. Then, the performance estimating unit 44 calculates the correlation coefficient rp of index A from the Cd values acquired using the approximate model and the Cd values acquired through the CFD, for example, through the use of Equation 15, and estimates the performance of the approximate model (step S413).

Then the approximate model updating unit 45 determines whether index A satisfies the threshold value set for index A (step S414). That is, when it is determined that index A satisfies the threshold value set for index A, the approximate model updating unit 45 determines that the approximate model can predict the Cd values with satisfactory accuracy (NO in step S414) and enters the created approximate model and the category thereof into the approximate model storage unit 13 in an associated manner. Then, the approximate model creating unit 40 performs the processes of steps S404 to S415 on the next category. When the processes are performed on all the categories, the approximate model creating unit 40 ends the approximate model creating process.

On the other hand, when it is determined that index A does not satisfy the threshold value set for index A, the approximate model updating unit 45 determines that the Cd values cannot be predicted with satisfactory accuracy using the approximate model (YES in step S414) and performs the process of step S415 so as to continue to perform the approximate model creating process.

The first feature value extracting unit 41 specifies learning data in which the category to be processed is set out of the learning data stored in the learning data storage unit 12. The first feature value extracting unit 41 instructs the sampling unit 46 to create morphing data used to create new learning data so as to create learning data other than the currently-sampled learning data out of the specified learning data. Accordingly, the sampling unit 46 creates new learning morphing data through an experimental design method. At this time, the sampling unit 46 extracts morphing data not overlapping with the previously-created learning data (in which the distance in the design space between the newly-created learning data and the currently-sampled learning data is larger than a predetermined distance) and outputs the extracted morphing data as the learning morphing data to the morphing unit 22. The morphing unit 22 performs the morphing process using the fed learning morphing data as described above. The learning data creating unit 30 creates and enters learning data into the learning data storage unit 12 by calculating the Cd values through the CFD using the learning design STL data created through the morphing process and extracting and categorizing the feature values (step S415). The first feature value extracting unit 41 extracts the feature values and the Cd values from the read learning data (step S416), adds the extracted feature values and Cd values to the first feature value table (step S407), and enters the first feature value table into the learning data storage unit 12 so as to be stored therein.

As described above, according to the first embodiment, since the feature values not contributing to estimation of the Cd values are deleted in advance through model learning using the ARD and the kriging method is performed using only the feature values contributing to estimation of the Cd values to create the final approximate model, it is possible to create an approximate model for a shorter time, compared with a case where an approximate model is created using only the kriging method in the related art.

When an approximate model is created using only the kriging method, the feature values serving as noise and not contributing to estimation of the Cd value are reflected in the approximate model.

On the other hand, according to the first embodiment, since the feature values serving as noise are removed through the reduction process, the second feature values contributing to estimation of the Cd value are extracted, and an approximate model is learned and created using the kriging method and the second feature values, it is possible to create an approximate model with higher accuracy, compared with a case according to the related art.

(Detailed Configuration and Operation of Feature Point Determining Unit 50)

Figure 9:
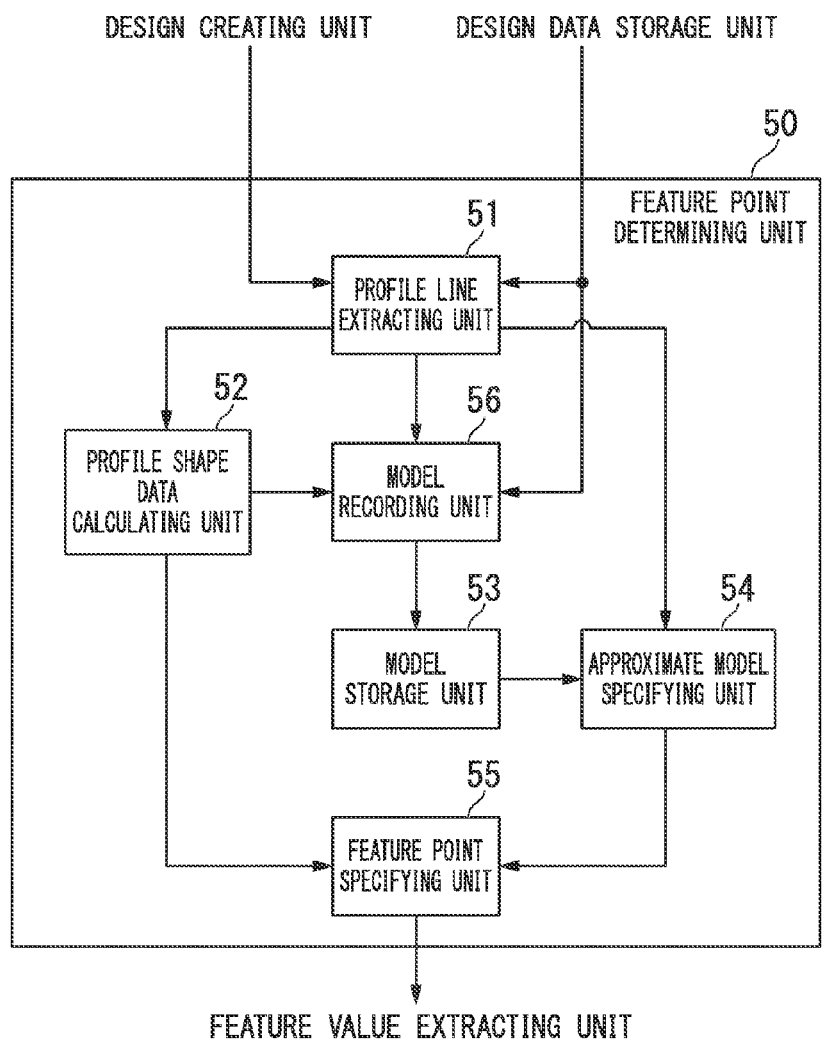
FIG. 9 is a block diagram illustrating a detailed configuration of a feature point determining unit 50 according to the first embodiment.

FIG. 9 is a block diagram illustrating the detailed configuration of the feature point determining unit 50.

As described above, the feature point determining unit 50 matches the vehicle shape of the base vehicle with the vehicle shape of the design vehicle which is created by the designer terminal 9 and from which feature points are extracted, and determines the feature points of the design vehicle corresponding to the feature points of the base vehicle based on the matching result. The feature point determining unit 50 includes a profile line extracting unit 51, a profile shape data calculating unit 52, a model storage unit 53, a similar model specifying unit 54, a feature point specifying unit 55, and a model recording unit 56.

The profile line extracting unit 51 acquires the STL data from the design data storage unit 11 or the design creating unit 92 and extracts the outermost profile line in a cross section of the base vehicle or the design vehicle from the acquired STL data.

The profile shape data calculating unit 52 calculates profile shape data representing information of a line segment connecting the center of gravity of a region surrounded with the extracted profile line to the corresponding point from the profile line extracted by the profile line extracting unit 51 for a plurality of points on the profile line. Specifically, when the length of the line segment connecting the center of gravity of the region surrounded with the profile line to the corresponding point is defined as d and the angle formed by the line segment and the profile line is defined as θ, the profile shape data is complex data expressed by Expression 18.

$$d \cdot e^{j\theta} \quad (18)$$

Here, e represents the base of a natural logarithm.

The model storage unit 53 stores the outermost profile line in a cross section of a base vehicle, the profile shape data of a plurality of points on the profile line and the positions of the feature points on the profile line in an associated manner for a plurality of base vehicles.

The similar model specifying unit 54 reads the profile shape data and the positions of the feature points correlated with the profile line having the highest similarity to the profile line of the design vehicle extracted by the profile line extracting unit 51 from the model storage unit 53.

The feature point specifying unit 55 performs the DP (Dynamic Programmed) matching using the profile shape data of the design vehicle calculated by the profile shape data calculating unit 52 and the profile shape data of the base vehicle read by the similar model specifying unit 54. Then, the feature point specifying unit 55 specifies the positions of the feature points of the design vehicle corresponding to the feature points read by the similar model specifying unit 54.

The model recording unit 56 records the profile line of the base vehicle calculated by the profile line extracting unit 51, the profile shape data calculated by the profile shape data calculating unit 52 using the profile line, and the feature points of the base vehicle to the model storage unit 53 in an associated manner.

Figure 10:
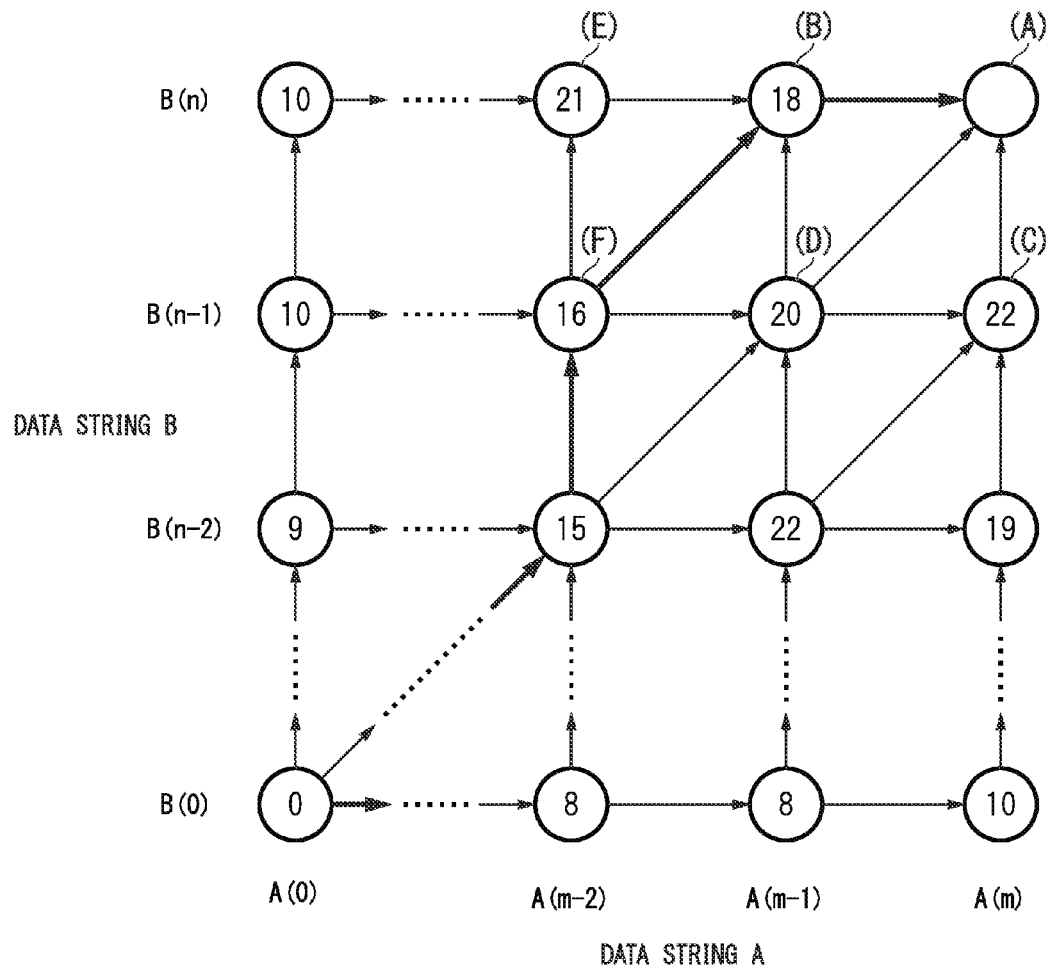
FIG. 10 is a diagram illustrating an example of DP matching.

FIG. 10 is a diagram illustrating an example of the DP matching.

The DP matching will be described below. The DP matching is a method of solving the correspondence between two data strings for each element by merging the search result for the correspondence of partial data strings.

Specifically, an example where the correspondence between data string A including m data pieces of data A(0) to data A(m), data string B including n data pieces of data B(0) to data B(n) is acquired will be described below. First, the correspondence and the cumulative distances between three sets of data strings are calculated. That is, (1) a set of partial data string A' in which tail data A(m) of data string A is deleted and data string B ((B) of FIG. 10), (2) a set of partial data string B' in which tail data B(n) of data string B is deleted and data string A ((C) of FIG. 10), and (3) a set of partial data string A' and partial data string B' ((D) of FIG. 10) are calculated. Then, the correspondence between data string A and data string B is acquired using the correspondence ((B) of FIG. 10) of the set having the smallest cumulative distance out of (1) to (3). At this time, the cumulative distance between data string A and data string B is a value obtained by adding a local distance between the tail data of data string A and the tail data of data string B to the smallest cumulative distance out of (1) to (3).

The cumulative distance and the error value calculated using a partial data string in which the tail data of at least one of two data strings is deleted are used to acquire the correspondence and the cumulative distance of (1) to (3), similarly to the method of calculating the correspondence and the cumulative distance between data string A and data string B.

For example, when it is intended to acquire the correspondence and the cumulative distance between data string A' and data string B including n data pieces of data B, they are calculated using the correspondence and the cumulative distance between the following three sets of data strings. That is, (1) a set of partial data string A″ in which tail data A(m−1) of data string A' is deleted and data string B ((E) of FIG. 10), (2) a set of partial data string A' and data string B' ((D) of FIG. 10), and (3) a set of partial data string A″ and partial data string B' ((F) of FIG. 10) are used.

The method of calculating the cumulative distance using the DP matching is expressed by recurrence formula of Equation 19.

$$g(i, j) = \min \begin{Bmatrix} g(i-1, j) \\ g(i, j-1) \\ g(i-1, j-1) \end{Bmatrix} + d(i, j) \quad (19)$$

Here, g(i, j) represents the cumulative distance between a partial data string including data pieces up to the i-th data piece in data string A and a partial data string including data pieces up to the j-th data piece of data string B. d(i, j) represents the local distance between the i-th data piece of data string A and the j-th data piece of data string B.

The profile shape data calculated by the profile shape data calculating unit 52 will be described below.

Figure 11:
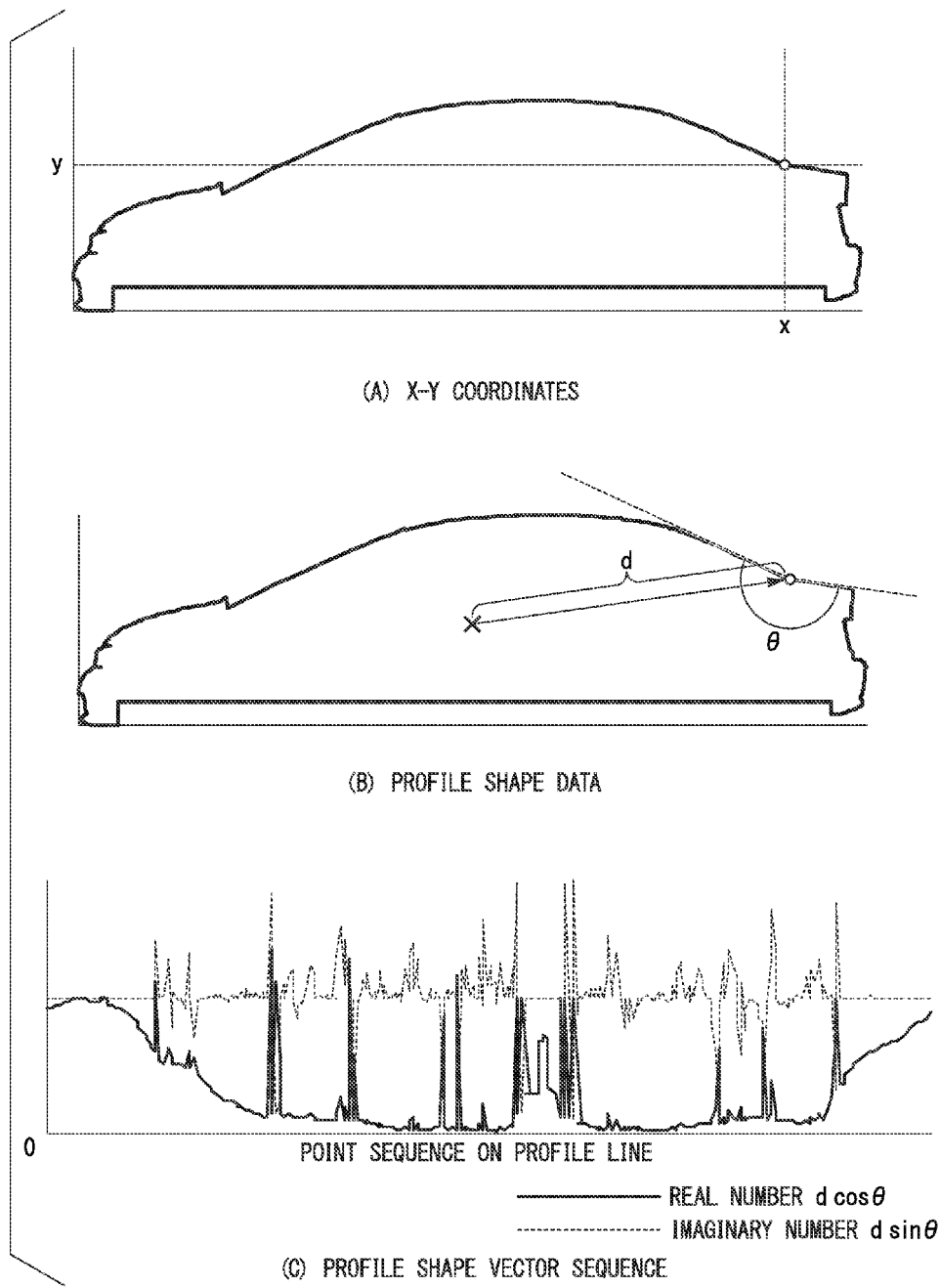
FIG. 11 is a diagram illustrating profile shape data according to the first embodiment.

FIG. 11 is a diagram illustrating the profile shape data.

When it is intended to acquire the correspondence between a profile line and another profile line, as shown in part (A) of FIG. 11, the use of the x coordinate values and the y coordinate values as the points on the profile line is not desirable, because the calculation result of the correspondence is affected by the position or the size of the vehicle. Therefore, in the first embodiment, as shown in part (B) of FIG. 11, the length d of the line segment connecting the center of gravity of a region surrounded with the profile line and a point on the profile line and the angle θ formed by the line segments connecting the corresponding point to two points adjacent to the corresponding point are used. By calculating profile shape data which is complex data having the length d of the line segment as a real part and having the angle θ as the imaginary part for a plurality of points on the profile line, the data strings shown in part (C) of FIG. 11 can be obtained.

The feature point specifying unit 55 calculates the correspondence between the data string of the base vehicle and the data string of the design vehicle using the DP matching.

The detailed operation of the feature point determining unit 50 will be described below.

First, the operation of recording the profile line, the profile shape data, and the feature points of the base vehicle on the model storage unit 53 of the feature point determining unit 50 will be described.

Figure 12:
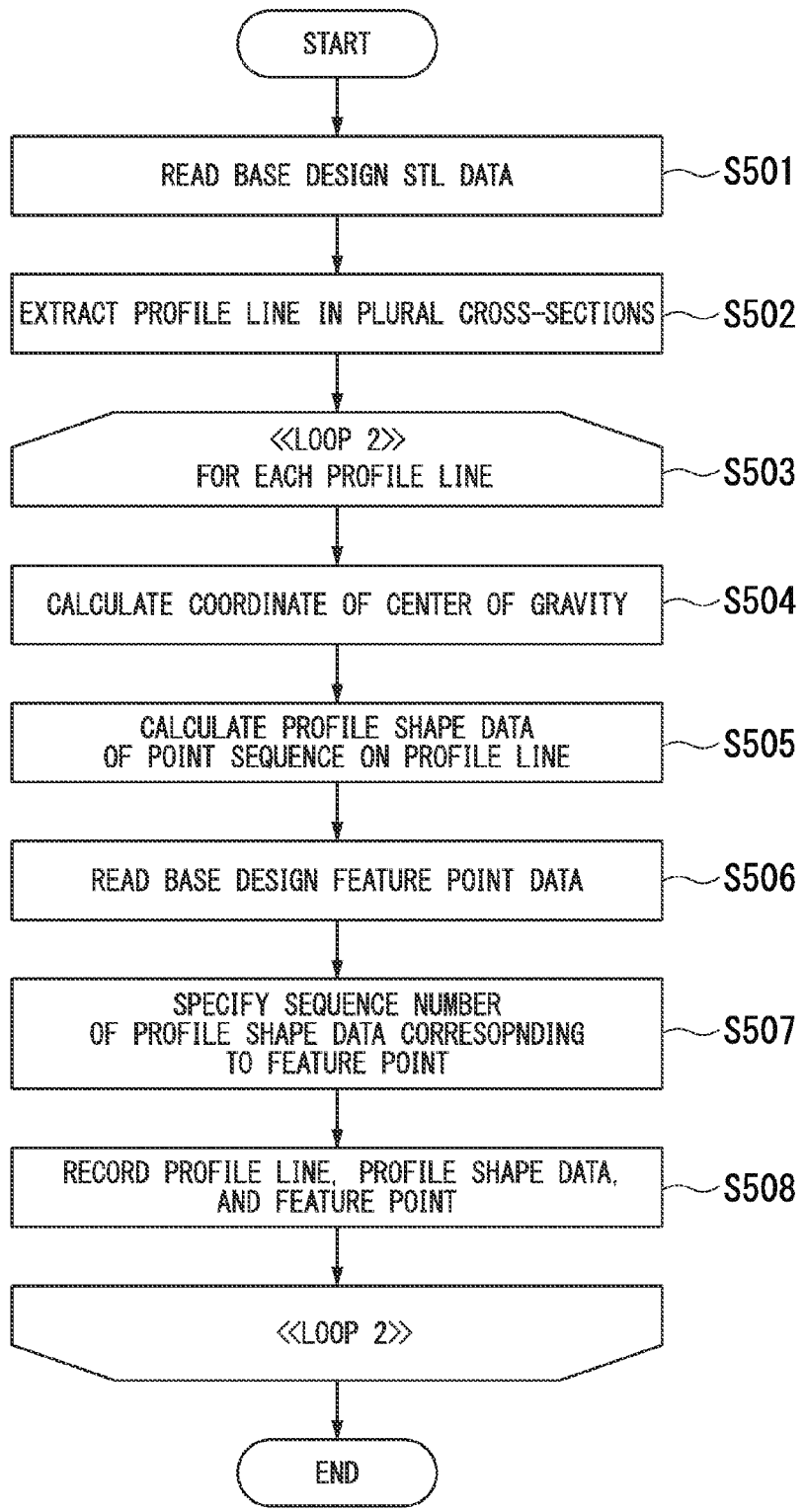
FIG. 12 is a flowchart illustrating the flow of operations of causing the feature point determining unit 50 to record a profile line, profile shape data, and feature points of a base vehicle according to the first embodiment.

FIG. 12 is a flowchart illustrating the flow of operations of causing the feature point determining unit 50 to record the profile line, the profile shape data, and the feature points.

First, the profile line extracting unit 51 reads the base design STL data of a base vehicle from the design data storage unit 11 (step S501). Then, the profile line extracting unit 51 extracts the outermost profile line of the base vehicle in a cross section parallel to the XY plane from the base design STL data for a plurality of cross sections (step S502). The feature point determining unit 50 selects one profile line extracted by the profile line extracting unit 51 and performs the processes of steps S504 to S508 to be described later on all the profile lines (step S503).

The profile shape data calculating unit 52 calculates the coordinate of the center of gravity of a region surrounded with the profile line selected in step S503 (step S504). Then, the profile shape data calculating unit 52 acquires the profile shape data by calculating the length d of the line segment connecting the center of gravity to a point on the profile line and the angle θ formed by the line segments connecting the corresponding point to two points adjacent to the corresponding point for each point sequence on the profile line selected in step S503 (step S505).

Then, the model recording unit 56 reads the base design feature point data from the design data storage unit 11 (step S506) and specifies the sequence number of the data string of the points corresponding to the feature points represented by the base design feature point data (step S507).

The model recording unit 56 records the profile lines extracted by the profile line extracting unit 51, the profile shape data calculated by the profile shape data calculating unit 52, and the sequence number of the specified feature points on the model storage unit 53 in an associated manner (step S508).

When another profile not subjected to the processes of steps S504 to S508 remains, the flow of operations goes back to step S503. On the other hand, when all the profile lines are subjected to the processes, the recording of information on the base vehicle read in step S501 is ended.

The processes of steps S501 to S508 are performed on other base vehicles stored in the design data storage unit 11.

The operations of causing the feature point determining unit 50 to extract feature points from a design vehicle will be described below.

Figure 13:
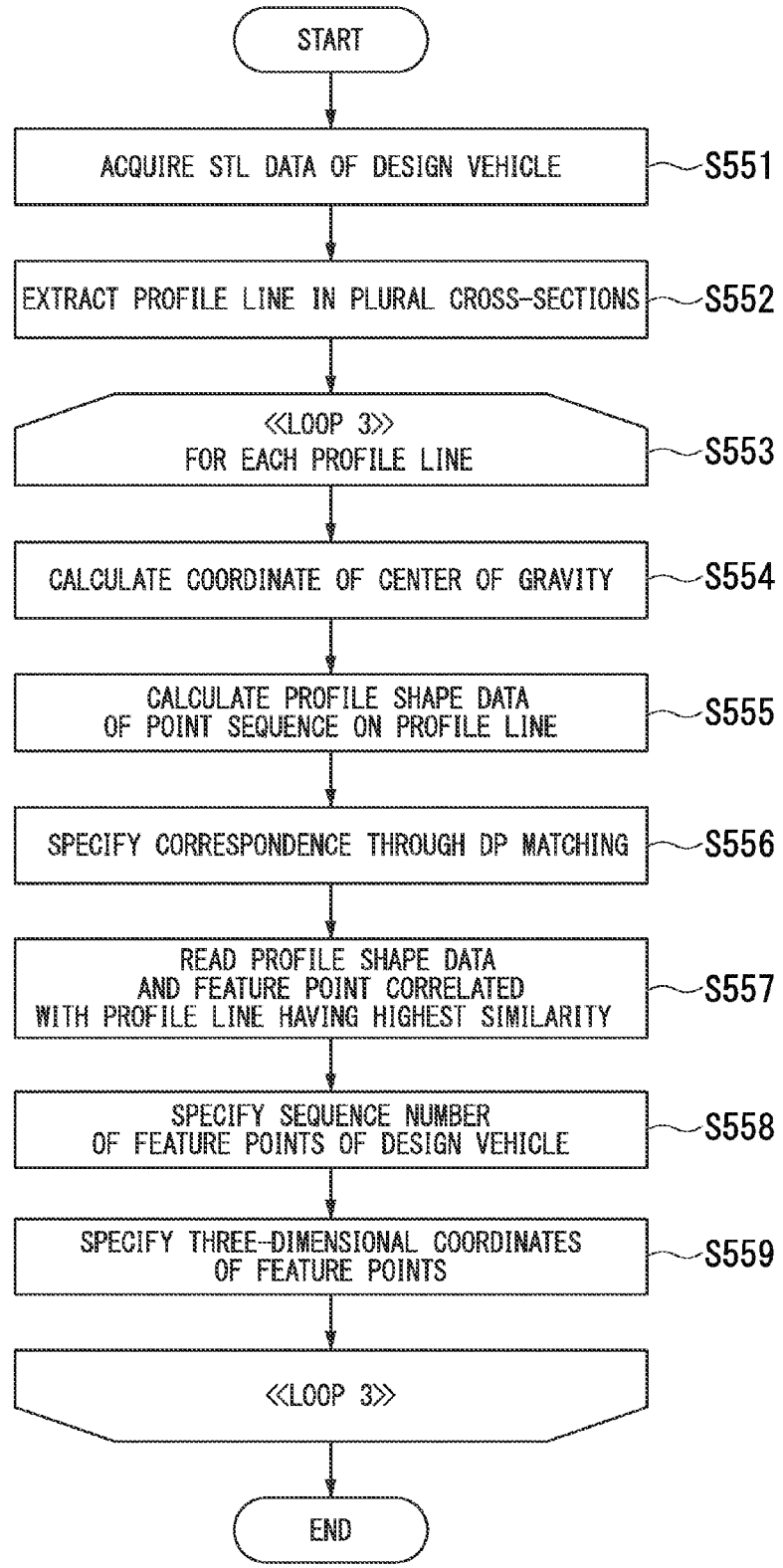
FIG. 13 is a flowchart illustrating the flow of operations of causing the feature point determining unit 50 to extract feature points from a design vehicle according to the first embodiment.

FIG. 13 is a flowchart illustrating the flow of operations of causing the feature point determining unit 50 to extract feature points from a design vehicle.

First, the profile line extracting unit 51 acquires STL data of the design vehicle from the design creating unit 92 of the designer terminal 9 (step S551). Then, the profile line extracting unit 51 extracts the outermost profile line of the design vehicle in a cross section parallel to the XY plane from the acquired STL data for a plurality of cross sections (step S552). The feature point determining unit 50 selects one profile line extracted by the profile line extracting unit 51 and performs the processes of steps S554 to S559 to be described below on all the profile lines (step S553).

The profile shape data calculating unit 52 calculates the coordinate of the center of gravity of a region surrounded with the profile line selected in step S553 (step S554). Then, the profile shape data calculating unit 52 calculates the profile shape data for each point sequence on the profile line selected in step S553 (step S555).

The feature point specifying unit 55 specifies the correspondence by performing the DP matching on the profile shape data calculated by the profile shape data calculating unit 52 based on the profile shape data stored in the model storage unit 53 (step S556). Then, the similar model specifying unit 54 extracts the correspondence having the highest similarity to the profile shape data calculated by the profile shape data calculating unit 52 from the DP matching result of step S556 (step S557).

The feature point specifying unit 55 specifies the sequence number corresponding to the sequence number of the feature points read by the similar model specifying unit 54 based on the correspondence extracted by the similar model specifying unit 54 (step S558). The feature point specifying unit 55 specifies the three-dimensional coordinate of the feature points using the specified sequence number (step S559) and outputs the specified coordinates to the feature value extracting unit 60. Specifically, the feature point specifying unit 55 sets the z coordinates of the cross section extracted by the profile line extracting unit 51 as the z coordinates of the corresponding feature points, and sets the x coordinates and the y coordinates corresponding to the specified sequence number as the x coordinates and the y coordinates of the corresponding feature point.

When a profile line not subjected to the processes of steps S554 to S559 remains, the flow of operations goes back to step S553.

In this way, by performing the processes of steps S554 to S559 on all the profile line, it is possible to extract the three-dimensional coordinates of the feature points in the entire design vehicle.

In the above-mentioned example of the feature point determining unit 50, the feature points are extracted using the profile lines of the cross sections parallel to the XY plane of the vehicle; however, the invention is not limited to this example and cross sections parallel to another plane may be used.

In the above-mentioned example of the feature point determining unit 50, the feature points are extracted using the DP matching as the pattern matching technique; however, the invention is not limited to this example and the pattern matching may be performed using another technique such as a divide-and-conquer method or a genetic algorithm.

In the above-mentioned example of the feature point determining unit 50, only the information on the base vehicle stored in the design data storage unit 11 is entered into the model storage unit 53; however, the invention is not limited to this example and, for example, the model recording unit 56 may record information on design vehicles obtained through the processes of steps S551 to S559 on the model storage unit 53.

In the above-mentioned example of the feature point determining unit 50, the length d of the line segments connecting the center of gravity to the points on the profile line and the angle θ formed by the line segment and the profile line are used as elements of the profile shape data; however, the invention is not limited to this example. For example, even when the profile shape data may be constructed as real data having only the lengths d of the line segments connecting the center of gravity to the points on the profile line as elements, it is possible to determine the feature points in the same way as described in the above-mentioned example. In this case, compared with a case where the angle θ formed by the line segment and the profile line is additionally used, the error range is enlarged and the accuracy is reduced.

Elements other than the length d and the angle θ may be used as the elements of the profile shape data. For example, values (such as brightness value, RGB value, and spatial frequency of brightness) relevant to brightness of the points on the profile line may be introduced as the elements.

It has been stated above that the profile line extracting unit 51 extracts the profile line of a cross section of a vehicle from the STL data and the feature point determining unit 50 determines the feature points using the extracted profile line; however, the invention is not limited to this configuration. For example, a silhouette image may be created from the STL data and the feature points may be determined using the profile line of the silhouette image. The profile line of a cross section of a vehicle may be created by a processing unit other than the feature point determining unit 50 and the profile line may not be extracted by the feature point determining unit 50.

The feature point determining method in the feature point determining unit 50 may be used for processes other than the feature point determining process of a vehicle described herein. For example, the feature point determining method can be used for a process of momently finding the positions of the feature points from a video image which is obtained by imaging an object whose shape varies in time series.

Detailed Configuration and Operation of Approximate Model Applying Unit 70

Figure 14:
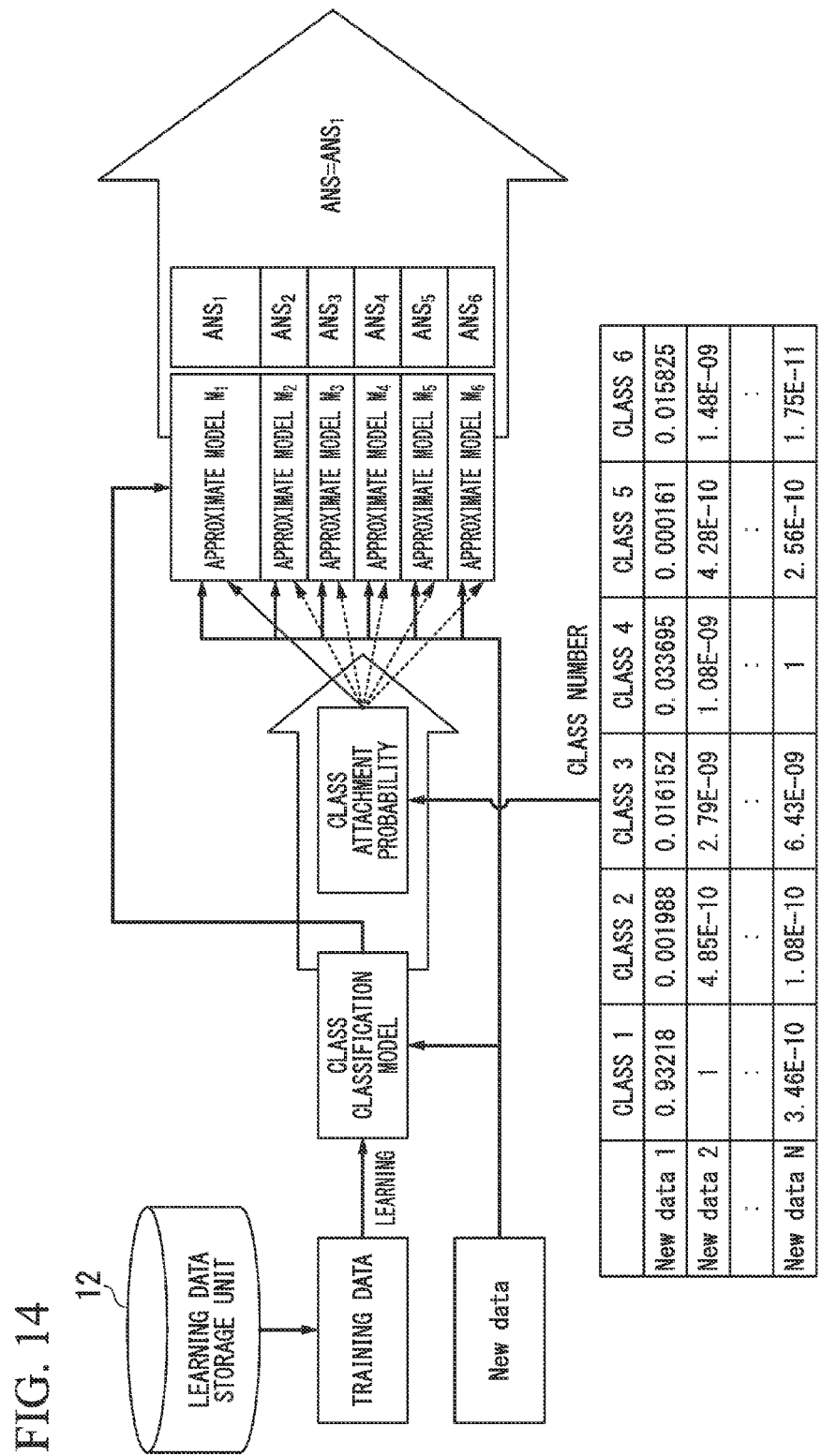
FIG. 14 is a diagram illustrating a model applying process of an approximate model applying unit 70 according to the first embodiment.

FIG. 14 is a diagram illustrating a model applying process in the approximate model applying unit 70.

As shown in the drawing, the approximate model applying unit 70 creates a class classification model for calculating a probability (hereinafter, referred to as "class attachment probability") that input data is attached to each class using the learning data read from the learning data storage unit 12 as training data. A class is a category number. When the class attachment probability of a class c (where c=1, 2, . . . , C) is defined as $P_c$ and the category of the class c is defined as $S_c$, the class attachment probability $P_c$ of the class c represents the probability that a design vehicle belongs to the category $S_c$. An SLR (Sparse Logistic Regression) using a probability deriving expression of logistic regression analysis is used to create the class classification model.

The approximate model applying unit 70 calculates the class attachment probability $P_c$ (where c=1, 2, . . . , C) for the input data which is the feature values of the design vehicle extracted by the feature value extracting unit 60. The approximate model applying unit 70 selects an approximate model classified into the category of the class having the highest class attachment probability out of the calculated class attachment probabilities $P_1, P_2, \ldots,$ and $P_c$ and calculates the aerodynamic performance value which is a solution from the input data using the selected approximate model.

For example, in the drawing, the highest class attachment probability out of the class attachment probabilities $P_1, P_2, \ldots,$ and $P_c$ calculated for the input data New Data 1 is $P_1$. When the approximate model classified into the category $S_c$ is defined as $M_c$ and the solution calculated using the approximate model $M_c$ is defined as $ANS_c$, the approximate model applying unit 70 selects the approximate model $M_1$ classified into the category $S_1$ of class 1 having the highest class attachment probability. The approximate model applying unit 70 acquires the solution $ANS_1$ calculated from New Data 1 using the selected approximate model $M_1$.

Figure 15:
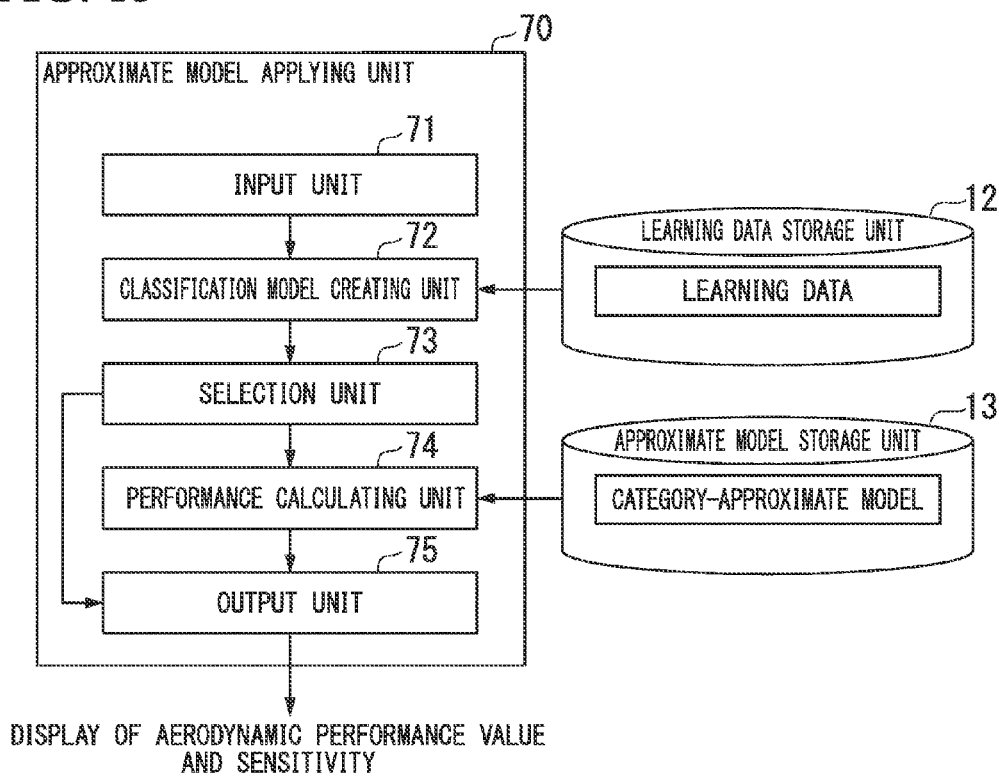
FIG. 15 is a block diagram illustrating a detailed configuration of the approximate model applying unit 70 according to the first embodiment.

FIG. 15 is a block diagram illustrating the detailed configuration of the approximate model applying unit 70. As shown in the drawing, the approximate model applying unit 70 includes a data input unit 71, a classification model creating unit 72, a selection unit 73, a performance calculating unit 74, and an output unit 75.

The data input unit 71 receives an input of feature values of a design vehicle extracted by the feature value extracting unit 60 as input data. The classification model creating unit 72 creates a class classification model from the set of feature value and category of the design vehicle represented by the learning data stored in the learning data storage unit 12. The selection unit 73 calculates the class attachment probability of the design vehicle based on the feature values of the design vehicle using the class classification model created by the classification model creating unit 72, and selects an approximate model to be used based on the calculated class attachment probability. The performance calculating unit 74 reads the approximate model selected by the selection unit 73 from the approximate model storage unit 13 and calculates the aerodynamic performance value based on the feature values of the design vehicle using the read approximate model. The output unit 75 creates sensitivity display screen data based on the information on the colors of parts of the vehicle read from the approximate model storage unit 13 to correspond to the same category as the approximate model selected by the selection unit 73, and outputs the created sensitivity display screen data to the designer terminal 9 along with the aerodynamic performance value.

Figure 16:
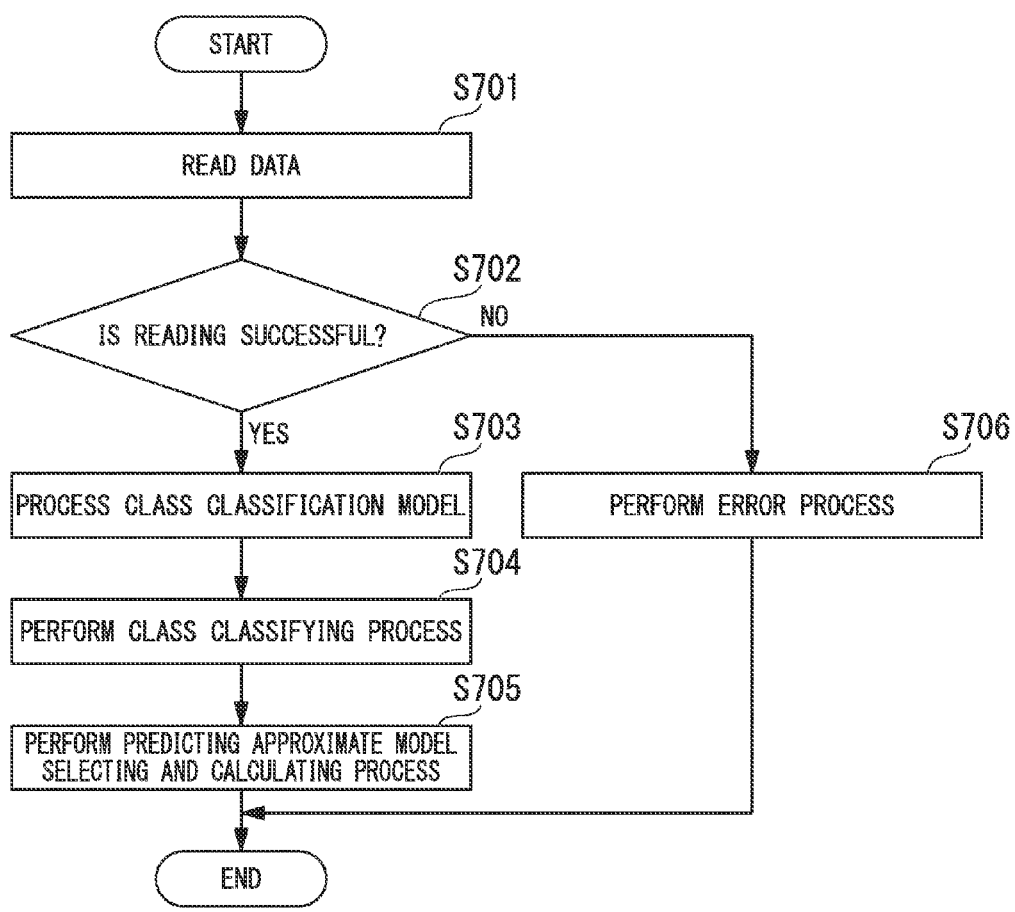
FIG. 16 is a flowchart illustrating the flow of operations of the model applying process in the approximate model applying unit 70 according to the first embodiment.

FIG. 16 is a flowchart illustrating an flow of operations of a model applying process in the approximate model applying unit 70, and shows the detailed processes of steps S225 to S230 of FIG. 4.

When the data input unit 71 receives an input of a feature value of the design vehicle extracted by the feature value extracting unit 60, the classification model creating unit 72 reads the learning data from the learning data storage unit 12 (step S701). When successfully reading the learning data (YES in step S702), the classification model creating unit 72 creates a class classification model from the read learning data through the SLR (step S703).

In the logistic regression analysis, when X represents a vector of a dependent variable, xi represents an explanation variable, and θ represents a weight, the class attachment probability P which is an objective variable is obtained using Equation 21 by maximizing Equation 20. Here, $X=(x_1, x_2, \ldots, x_D)$, $\theta=(\theta_0, \theta_1, \theta_2, \ldots, \theta_D)$, $\theta_d$ represents a feature value $x_d$ (where d=1, 2, ..., D), and D represents the number of types of the feature values. The subscript (c) and (k) represent the classes. The probability $P(S_c|X)$ represents a posterior probability that the category $S_c$ can be obtained when X is given.

$$f_c(X; \theta^{(c)}) = \sum_{d=1}^{D} \theta_d^{(c)} x_d + \theta_0^{(c)} \quad c = 1, \ldots, C \quad (20)$$

$$P = \frac{\exp(f_c(X; \theta^{(c)}))}{\sum_{k=1}^{C} \exp(f_k(X; \theta^{(k)}))} \equiv P(S_c | X) \quad c = 1, \ldots, C \quad (21)$$

From the above description, the relationship between the input x and the output y when there N training data pieces having the existing determination result is expressed by Equation 22.

$$P(y_1, \ldots, y_N | X_1, \ldots, X_N; \theta) = \prod_{n=1}^{N} \prod_{c=1}^{C} P_n^{(c) y_n^{(c)}} \quad (22)$$

The classification model creating unit 72 determines the weight θ so as to maximize Equation 22 using the learning data read from the learning data storage unit 12. It is assumed that the sets of feature values and categories of N vehicles are included in the learning data, the feature value of the n-th vehicle (where n=1, 2, ..., N) is defined as a vector $X_n$ of a dependent variable, $y_n^{(c)}$ when the class is correct is defined as 1, and $y_n^{(c)}$ when the class is not correct is defined as 0. The correctness of the class means that the category $S_c$ of the class c is matched with the category set in the learning data. $P_n^{(c)}$ is calculated by Equation 21.

The classification model creating unit 72 creates an expression of deriving the class attachment probability expressed by Equation 23, that is, the class classification model, using θ determined to maximize Equation 22. Here, t represents a transposition and $X_n$ represents the input data to be classified.

$$P_n^{(c)} = P \frac{\exp(X_n^t \theta^{(c)})}{\sum_{k=1}^{C} \exp(X_n^t \theta^{(k)})} = P(S_c | X_n) \quad (23)$$

In step S703, the selection unit 73 calculates the class attachment probabilities $P_n^{(1)}$ to $P_n^{(C)}$ of the design vehicle using Equation 23 which is the class classification model created by the classification model creating unit 72, where the feature value of the design vehicle input from the feature value extracting unit 60 is $X_n$.

The selection unit 73 selects an approximate model classified into the category having the highest probability (step S704). The performance calculating unit 74 reads the approximate model selected by the selection unit 73 from the approximate model storage unit 13 and calculates the aerodynamic performance value based on the feature values of the design vehicle using the read approximate model (step S705).

The output unit 75 reads the information on the colors of parts of the vehicle stored in the approximate model storage unit 13 based on the category determined to have the highest probability by the selection unit 73 I step S704. The output unit 75 creates the sensitivity display screen data in which the vehicle shape of the design vehicle represented by the design data is displayed in the read colors of the parts, the performance calculating unit 74 outputs the sensitivity display screen data along with the calculated aerodynamic performance value to the designer terminal 9 to display them.

When the reading of the learning data fails in step S702 (NO in step S702), the performance predicting apparatus 1 performs a predetermined error process (step S706).

(Advantages)

According to the above-mentioned first embodiment, by using a plurality of approximate models, it is possible to accurately predict aerodynamic performance of a newly-designed vehicle.

In learning approximate models, since the feature points having an influence on the aerodynamic performance are selected through high-speed model learning and then an approximate model using only the selected feature points is created through accurate model learning, it is possible to accurately and quickly create an approximate model.

By using the approximate models using only the feature values having an influence on the aerodynamic performance, it is possible to reduce the time needed to predict the aerodynamic performance of a designed vehicle.

Since the feature points of a vehicle having a newly-created shape are determined based on the pattern matching with vehicles of which the feature points are known, it is possible to accurately extract the feature points to be used to calculate the aerodynamic performance. Therefore, when creating an approximate model and when predicting the aerodynamic performance using the approximate model, it is possible to improve the prediction accuracy.

Since the aerodynamic performance can be quickly predicted with high accuracy as described above, the workload in designing a vehicle can be reduced, thereby achieving a decrease in cost, a decrease in product price, and a decrease in cost rate. Since the number of trial models decreases, the environmental load of development can be reduced and equipment for trial production can be reduced. In addition, it is possible to improve the aerodynamic performance of a vehicle and to shorten the model change cycle, thereby rapidly responding to users' requests.

Since the time needed to calculate the prediction result of the aerodynamic performance is reduced, a designer can concentrate their efforts on creative activity. Since the aerodynamic performance of more designs can be confirmed, it is possible to improve a designer's aerodynamic sense or design capability.

It is easy to utilize design knowledge. For example, it is possible to accumulate the aerodynamic performance of other companies' vehicles and to use the accumulated information for marketing, as well as to accumulate the design knowledge and to check a designer's specialty. The predicted value of the aerodynamic performance can be used to make decisions.

(Detailed Configuration and Operation of Base Design Recording Unit 80)

Figure 17:
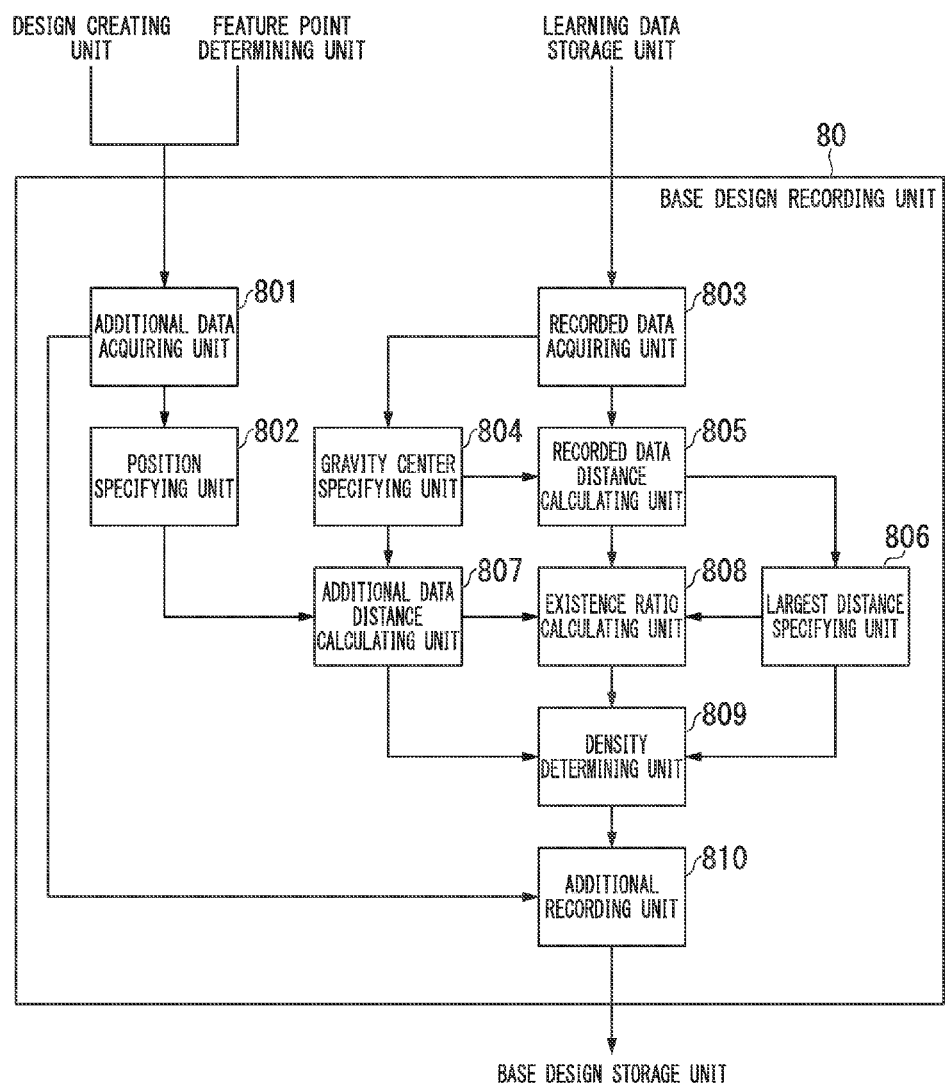
FIG. 17 is a block diagram illustrating a detailed configuration of a base design recording unit 80 according to the first embodiment.

FIG. 17 is a block diagram illustrating the detailed configuration of the base design recording unit 80.

As described above, the base design recording unit 80 records the STL data and the feature point data of a design vehicle newly created by the designer terminal 9 on the design data storage unit 11 as new base design data. On the other hand, since the capacity of the storage unit 10 is limited, it is preferable that data on an approximate model with satisfactory accuracy not be entered into the design data storage unit 11. Here, the learning data recording unit determines whether or not the data of the design vehicle newly created by the designer terminal 9 should be additionally entered into the learning data storage unit 12.

The base design recording unit 80 includes an additional data acquiring unit 801, a position specifying unit 802, a recorded data acquiring unit 803, a gravity center specifying unit 804, a recorded data distance calculating unit 805, a largest distance specifying unit 806, an additional data distance calculating unit 807, an existence ratio calculating unit 808, a density determining unit 809, and an additional recording unit 810.

The additional data acquiring unit 801 acquires the STL data a design vehicle from the design creating unit 92 of the designer terminal 9 and acquires the feature point data of the design vehicle from the feature point determining unit 50.

The position specifying unit 802 calculates an exterior feature value (parameter) representing an exterior feature of a vehicle from the STL data and creates exterior feature data having the calculated exterior feature values as elements. Accordingly, the position specifying unit 802 specifies the position of the additionally-acquired data.

The recorded data acquiring unit 803 acquires the exterior feature value correlated with the learning data for all the learning data stored in the learning data storage unit 12, and creates the exterior feature data which are multidimensional data having the acquired exterior feature values as elements.

The gravity center specifying unit 804 calculates the center of gravity representing the center of gravity of the exterior feature data in a design space (parameter space) using the exterior feature data created by the recorded data acquiring unit 803. Here, the design space means a linear space in which the exterior feature data is arranged.

The recorded data distance calculating unit 805 calculates the distance between the exterior feature data and the center of gravity specified by the gravity center specifying unit 804 for each exterior feature data piece acquired by the recorded data acquiring unit 803.

The largest distance specifying unit 806 specifies the largest distance of the distances calculated by the recorded data distance calculating unit 805.

The additional data distance calculating unit 807 calculates the distance between the exterior feature data created by the position specifying unit 802 and the center of gravity.

The existence ratio calculating unit 808 specifies the distance range including the distance calculated by the additional data distance calculating unit 807 out of the distance ranges obtained by dividing the distance specified by the largest distance specifying unit 806 into 10 parts. The existence ratio calculating unit 808 calculates the ratio of the learning data represented by the exterior feature data which is within the specified distance range based on the number of learning data pieces stored in the learning data storage unit 12.

The density determining unit 809 compares the distance specified by the largest distance specifying unit 806 with the distance calculated by the additional data distance calculating unit 807 and determines whether the density of the exterior feature data at the position specified by the position specifying unit 802 is high based on the ratio calculated by the existence ratio calculating unit 808.

When the density determining unit 809 determines that the density of the data is low, the additional recording unit 810 records the STL data and the feature point data acquired by the additional data acquiring unit 801 on the design data storage unit 11 as new base design data.

The operations of the base design recording unit 80 will be described below.

Figure 18:
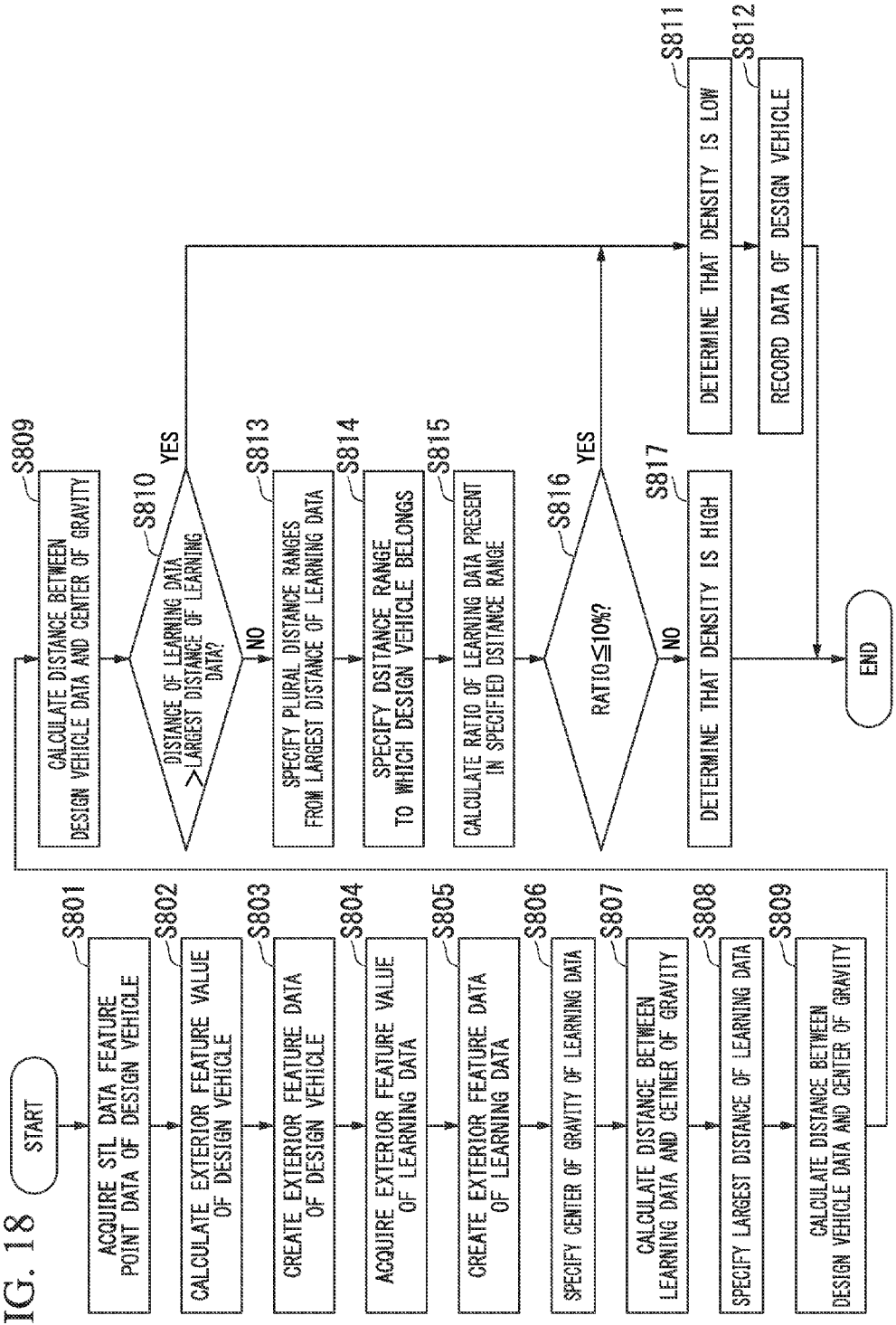
FIG. 18 is a flowchart illustrating the flow of operations of causing the base design recording unit 80 to determine whether to record data of a new design vehicle according to the first embodiment.

FIG. 18 is a flowchart illustrating the flow of operations of the base design recording unit 80.

First, the additional data acquiring unit 801 acquires the STL data of a design vehicle from the design creating unit 92 of the designer terminal 9 and acquires the feature point data of the design vehicle from the feature point determining unit 50 (step S801). Then, the position specifying unit 802 calculates the exterior feature values representing the exterior features of the vehicle from the STL data (step S802). Then, the position specifying unit 802 creates the exterior feature data having the calculated exterior feature values as elements (step S803).

The recorded data acquiring unit 803 acquires the exterior feature values correlated with the learning data for all the learning data stored in the learning data storage unit 12 (step S804). Then the recorded data acquiring unit 803 creates the exterior feature data which is multidimensional data having the acquired exterior feature values (step S805).

The gravity center specifying unit 804 calculates the average value for each element of the exterior feature data created by the recorded data acquiring unit 803 and calculates the center of gravity having the calculated average values as elements (step S806). Then, the recorded data distance calculating unit 805 calculates the distance between the exterior feature data and the center of gravity specified by the gravity center specifying unit 804 for each exterior feature data piece acquired by the recorded data acquiring unit 803 (step S807). The distance d (Manhatan distance) between the data pieces is calculated using Equation 24.

$$d = \sum_{n=1}^{N} |D_n - C_n| \qquad (24)$$

Here, N represents the number of elements of the exterior feature data. $D_n$ represents the n-th element of the exterior feature data created by the recorded data acquiring unit 803. $C_n$ represents the n-th element of the center of gravity. The calculation of the distance is not limited to Equation 24; however, another distance such as a Euclidean distance expressed by Equation 25 may be used.

$$d = \sqrt{\sum_{n=1}^{N} (D_n - C_n)^2} \qquad (25)$$

The largest distance specifying unit 806 specifies the largest distance of the distances calculated by the recorded data distance calculating unit 805 (step S808). Then, the additional data distance calculating unit 807 calculates the distance between the exterior feature data created by the position specifying unit 802 and the center of gravity (step S809).

The density determining unit 809 determines whether the distance calculated by the additional data distance calculating unit 807 is larger than the distance specified by the largest distance specifying unit 806 (step S810). When it is determined that the distance calculated by the additional data distance calculating unit 807 is larger than the distance specified by the largest distance specifying unit 806 (YES in step S810), the density determining unit 809 determines that the density of exterior feature data at the position specified by the position specifying unit 802 is low (step S811). The additional recording unit 810 records the STL data and the feature point data acquired by the additional data acquiring unit 801 on the design data storage unit 11 as new base design data (step S812).

On the other hand, when the density determining unit 809 determines that the distance calculated by the additional data distance calculating unit 807 is not larger than the distance specified by the largest distance specifying unit 806 (NO in step S810), the existence ratio calculating unit 808 specifies a plurality of distance ranges by dividing the distance specified by the largest distance specifying unit 806 into ten parts (step S813). For example, when the distance specified by the largest distance specifying unit 806 is 100, ten distance ranges of 0 to 10, 10 to 20, 20 to 30, 30 to 40, 40 to 50, 50 to 60, 60 to 70, 70 to 80, 80 to 90, and 90 to 100 are specified. Then, the existence ratio calculating unit 808 specifies the distance range including the distance calculated by the additional data distance calculating unit 807 out of the specified distance ranges (step S814). For example, when the distance calculated by the additional data distance calculating unit 807 is 57, the existence ratio calculating unit 808 specifies a distance range of 50 to 60.

Then, the existence ratio calculating unit 808 calculates the ratio of the learning data represented by the exterior feature data included in the specified distance range based on the number of learning data pieces stored in the learning data storage unit 12 (step S815). For example, when the number of learning data pieces is 12,148 and the number of exterior feature data pieces present within the distance range of 50 to 60 is 41, a ratio of 0.34% is calculated.

Then, the density determining unit 809 determines whether the ratio calculated by the existence ratio calculating unit 808 is equal to or less than 10% (step S816). When it is determined that the ratio is equal to or less than 10% (YES in step S816), the density determining unit 809 determines that the density of the exterior feature data at the position specified by the position specifying unit 802 is low (step S811). The additional recording unit 810 records the STL data and the feature point data acquired by the additional data acquiring unit 801 on the design data storage unit 11 as new base design data (step S812).

On the other hand, when it is determined that the ratio is more than 10% (NO in step S816), the density determining unit 809 determines that the density of the exterior feature data at the position specified by the position specifying unit 802 is high (step S817), and ends the flow of operations without recording the data acquired by the additional data acquiring unit 801.

(Advantages)

According to the above-mentioned first embodiment, when the density of the data at the position specified by the position specifying unit 802 is low, the additional recording unit 810 determines that the new data acquired by the additional data acquiring unit 801 should be entered into the design data storage unit 11. That is, the base design recording unit 80 does not record the data of the design vehicle close to the learning data, the amount of which is sufficiently large, on the design data storage unit 11. Accordingly, the data of the approximate model with satisfactory accuracy will not be entered into the design data storage unit 11.

(Second Approximate Model Applying Process)

Figure 20:
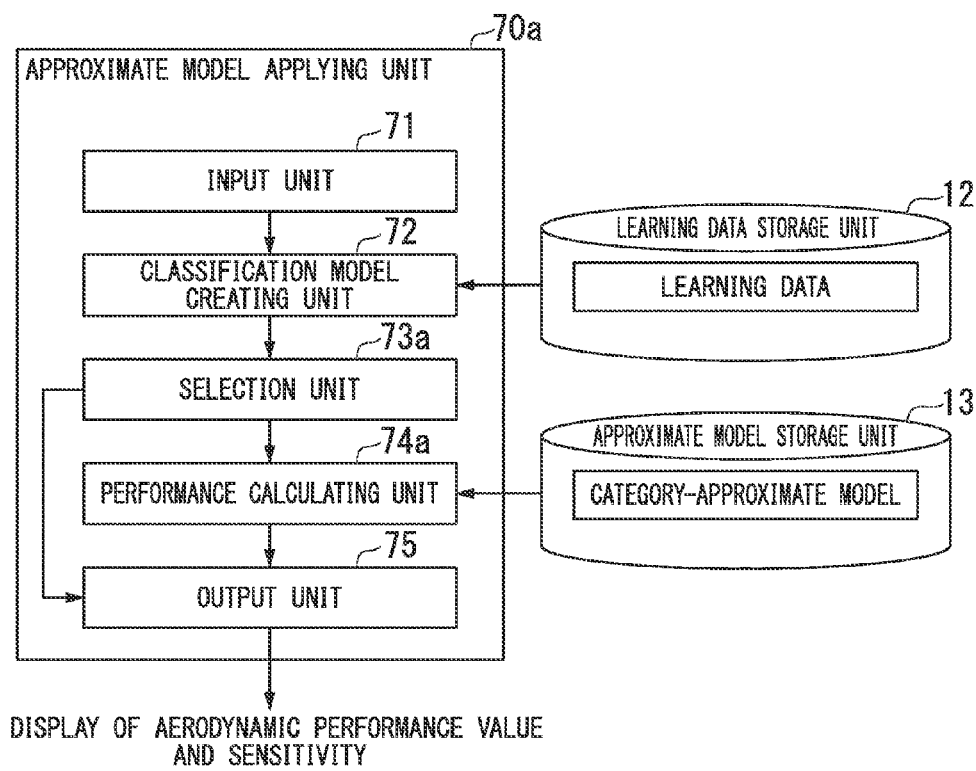
FIG. 20 is a block diagram illustrating a detailed configuration of the approximate model applying unit 70a according to the second embodiment.

The aerodynamic performance value may be calculated based on the feature values of the design vehicle using an approximate model applying unit 70a shown in FIG. 20 (a second embodiment) instead of the approximate model applying unit 70 shown in FIG. 14 in the first embodiment.

Figure 19:
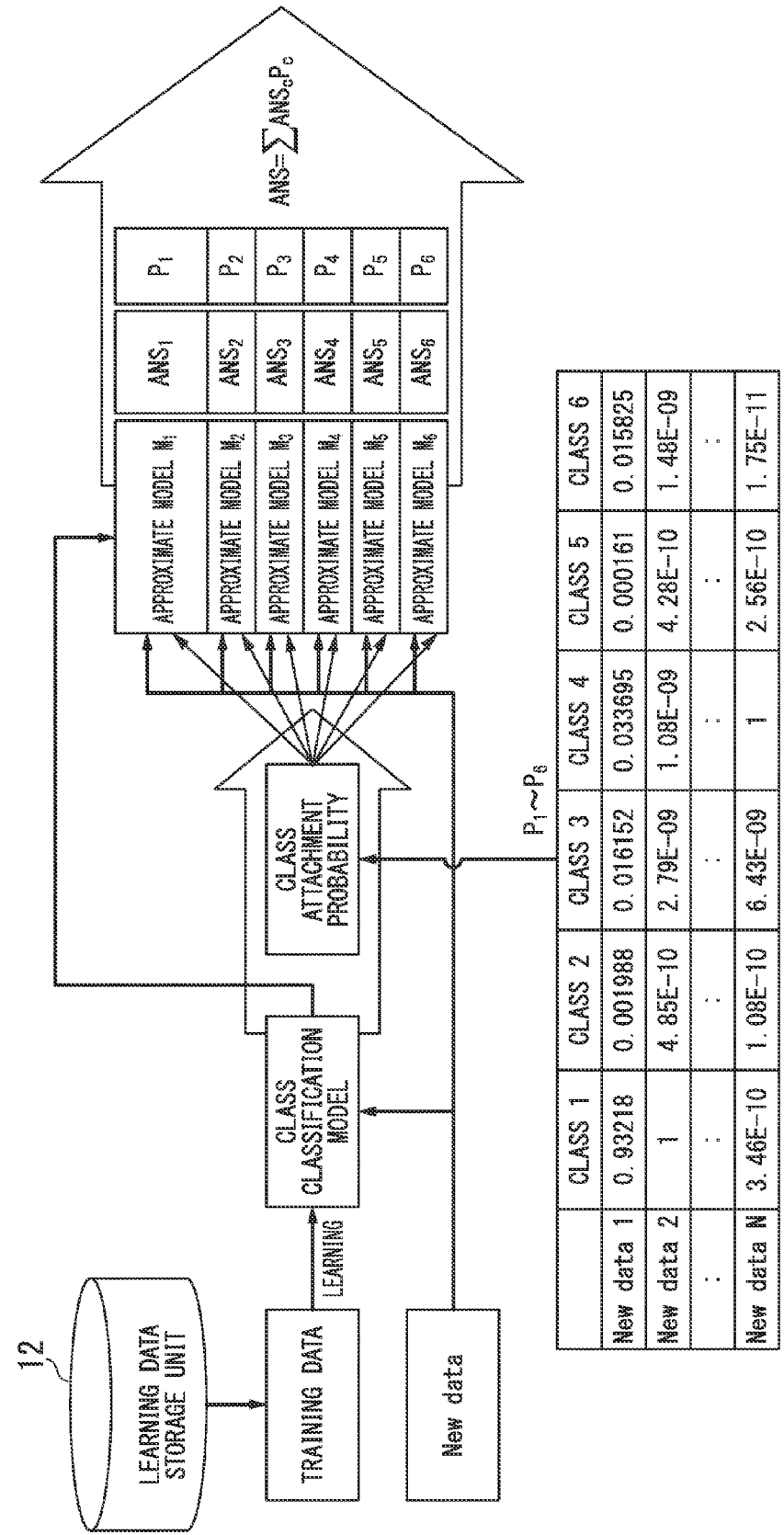
FIG. 19 is a diagram illustrating a model applying process of an approximate model applying unit 70a according to a second embodiment of the invention.

FIG. 19 is a diagram illustrating a model applying process in the approximate model applying unit 70a.

Similarly to the first approximate model applying process, when creating a class classification model using the learning data read from the learning data storage unit 12 as training data, the approximate model applying unit 70a calculates the class attachment probability $P_c$ of each class c (where c=1, 2, ..., C) using the feature values of the design vehicle as input data and using the created class classification model. The approximate model applying unit 70a weights and adds solutions $ANS_c$ calculated from the input data using the approximate models $M_c$ classified into the category $S_c$ based on the class attachment probability $P_c$ corresponding to the approximate model $M_c$ used to calculate the solutions $ANS_c$.

FIG. 20 is a block diagram illustrating the detailed internal configuration of the approximate model applying unit 70a. In this drawing, the same elements as the approximate model applying unit 70 shown in FIG. 15 will be referenced with the same reference numerals and a description thereof will not be repeated here. The approximate model applying unit 70a shown in the drawing is different from the approximate model applying unit 70 shown in FIG. 15, in that a selection unit 73a and a performance calculating unit 74a (calculation unit) are provided instead of the selection unit 73 and the performance calculating unit 74. The selection unit 73a calculates the class attachment probability of a design vehicle based on the feature values of the design vehicle using the class classification model created by the classification model creating unit 72 and selects the approximate models of all categories. The performance calculating unit 74a weights and adds solutions calculated based on the feature values of the design vehicle using the approximate models of all the categories based on the class attachment probability corresponding to the approximate model used to calculate the solutions, and calculates the aerodynamic performance value of the design vehicle.

Figure 21:
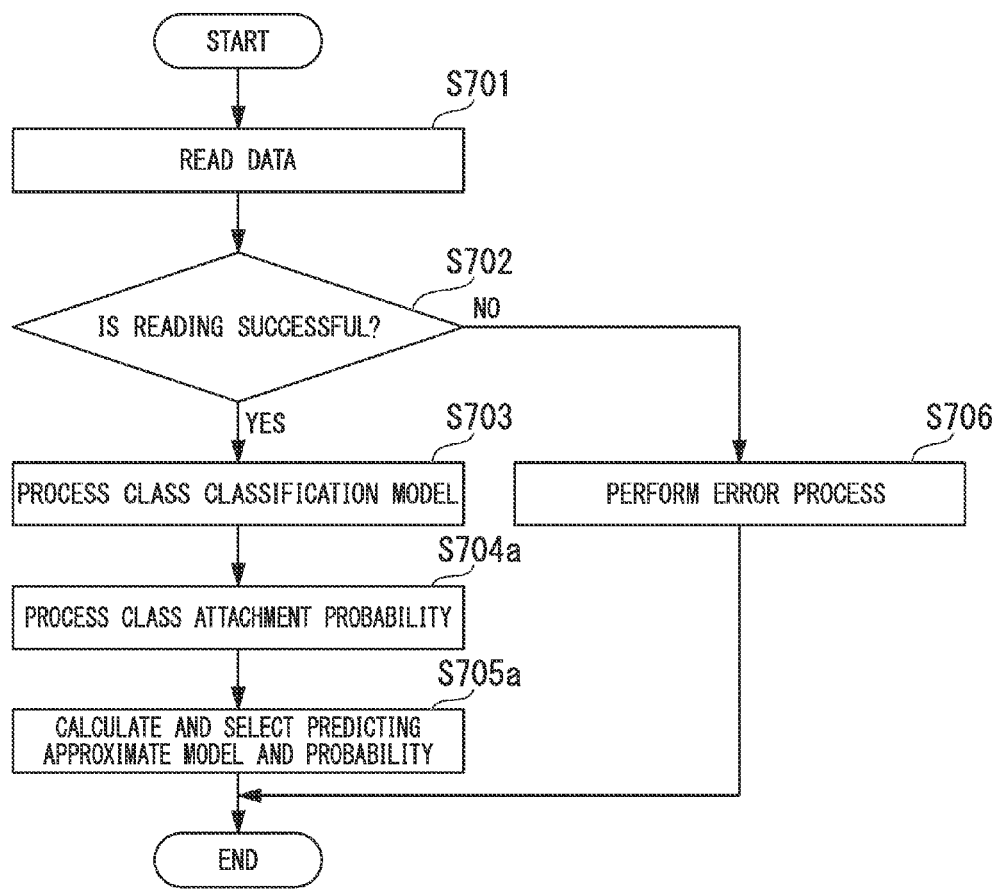
FIG. 21 is a flowchart illustrating the flow of operations of the model applying process in the approximate model applying unit 70a according to the second embodiment.

FIG. 21 is a diagram illustrating the flow of operations of an approximate model applying process in the approximate model applying unit 70a and show the detailed processes of steps S225 to S230 of FIG. 4. In the drawing, the same processes as shown in FIG. 16 will be referenced with the same reference numerals.

The processes of steps S701 to S703 and of step S706 are the same as shown in FIG. 16. That is, when the data input unit 71 receives an input of the feature values of the design vehicle extracted by the feature value extracting unit 60, the classification model creating unit 72 reads the learning data from the learning data storage unit 12 (step S701). When the reading is successful (YES in step S702), the classification model creating unit 72 creates the class classification model from the read learning data (step S703).

In step S703, the selection unit 73a calculates the class attachment probabilities $P_n^{(1)}$ to $P_n^{(C)}$ of the design vehicle using Equation 23 which is the class classification model created by the classification model creating unit 72, where the feature values of the design vehicle are X. The selection unit 73a selects the approximate models (alternatively, approximate models of the categories of which the attachment probability is not 0) $M_1$ to $M_C$ of all the categories (step S704a).

The performance calculating unit 74a calculates the solutions $ANS_1$ to $ANS_C$ based on the feature values of the design vehicle using all the approximate models $M_1$ to $M_C$ selected by the selection unit 73a. The performance calculating unit 74a weights and adds the solutions $ANS_c$ (where c=1, 2, ..., C) using Equation 24 based on the class attachment probability $P_c$, and calculates the aerodynamic performance value (step S705a). Similarly to the first embodiment, the output unit 75 creates and outputs the sensitivity display screen data along with the aerodynamic performance value calculated by the performance calculating unit 74a to the designer terminal 9 to display them.

(Advantages)

According to the above-mentioned second embodiment, by using a plurality of approximate models, it is possible to accurately predict the aerodynamic performance of a newly-designed vehicle.

In learning approximate models, since the feature points having an influence on the aerodynamic performance are selected through high-speed model learning and then an approximate model using only the selected feature points is created through accurate model learning, it is possible to accurately and quickly create an approximate model.

By using the approximate models using only the feature values having an influence on the aerodynamic performance, it is possible to reduce the time needed to predict the aerodynamic performance of a designed vehicle.

Since the feature points of a vehicle having a newly-created shape are determined based on the pattern matching with vehicles of which the feature points are known, it is possible to accurately extract the feature points to be used to calculate the aerodynamic performance. Therefore, when creating an approximate model and when predicting the aerodynamic performance using the approximate model, it is possible to improve the prediction accuracy.

Since the aerodynamic performance can be quickly predicted with high accuracy as described above, the workload in designing a vehicle can be reduced, thereby achieving a decrease in cost, a decrease in product price, and a decrease in cost rate. Since the number of trial models decreases, the environmental load of development can be reduced and equipment for trial production can be reduced. In addition, it is possible to improve the aerodynamic performance of a vehicle and to shorten the model change cycle, thereby rapidly responding to users' requests.

Since the time needed to calculate the prediction result of the aerodynamic performance is reduced, a designer can concentrate their efforts on creative activity. Since the aerodynamic performance of more designs can be confirmed, it is possible to improve a designer's aerodynamic sense or design capability.

It is easy to utilize design knowledge. For example, it is possible to accumulate the aerodynamic performance of other companies' vehicles and to use the accumulated information for marketing, as well as to accumulate the design knowledge and to check a designer's specialty. The predicted value of the aerodynamic performance can be used to make decisions.

A motorcycle may be used as an object of which the functional performance should be predicted. The functional performance to be predicted may be noise or collision safety.

(Others)

The performance predicting apparatus 1 and the designer terminal 9 have a computer system therein. The flow of operations of the base design data creating unit 21, the morphing unit 22, the learning data creating unit 30, the approximate model creating unit 40, the feature point determining unit 50, the feature value extracting unit 60, the approximate model applying unit 70, the approximate model applying unit 70a, and the base design recording unit 80 of the performance predicting apparatus 1 and the design creating unit 92 of the designer terminal 9 are stored in a computer-readable recording medium in the program format, and are performed by causing the computer system to read and execute the program. Here, the computer system includes a CPU, various memories, an OS, and hardware such as peripherals.

The "computer system" also includes a homepage provision environment (or display environment) when a WWW system is used.

The "computer-readable recording medium" includes a portable medium such as a flexible disc, a magneto-optical disc, a ROM, or a CD-ROM or a storage device such as a hard disk built in the computer system. The "computer-readable recording medium" also includes a device dynamically storing a program for a short time like a communication line when the program is transmitted through a network such as the Internet or a communication line such as a telephone line and a device storing a program for a predetermined time like an internal volatile memory of a computer system serving as a server or a client in that case. The program may serve to realize some of the above-described functions or may serve to realize the above-described functions in combination with programs already recorded on the computer system.

Hereinafter, a third embodiment of the invention will be described with reference to the accompanying drawings. In the third embodiment, an example where an object of which functional performance should be predicted is a vehicle and functional performance to be predicted is aerodynamic performance will be described. A vehicle shape and aerodynamic performance of a vehicle have a close relationship. In the third embodiment, approximate models for calculating an aerodynamic performance value (functional performance value) from feature values (physical quantities representing features of an object shape of a structure model) acquired from the vehicle shape (the object shape of a structure model) are created for each category of the vehicle. The approximate models are used to calculate an aerodynamic performance value (that is, a coefficient of drag which will be, hereinafter, referred to as "Cd value") as functional performance of a design vehicle using the feature values from shape data of the vehicle (hereinafter, referred to as "design vehicle") designed by a designer with a terminal.

Figure 22:
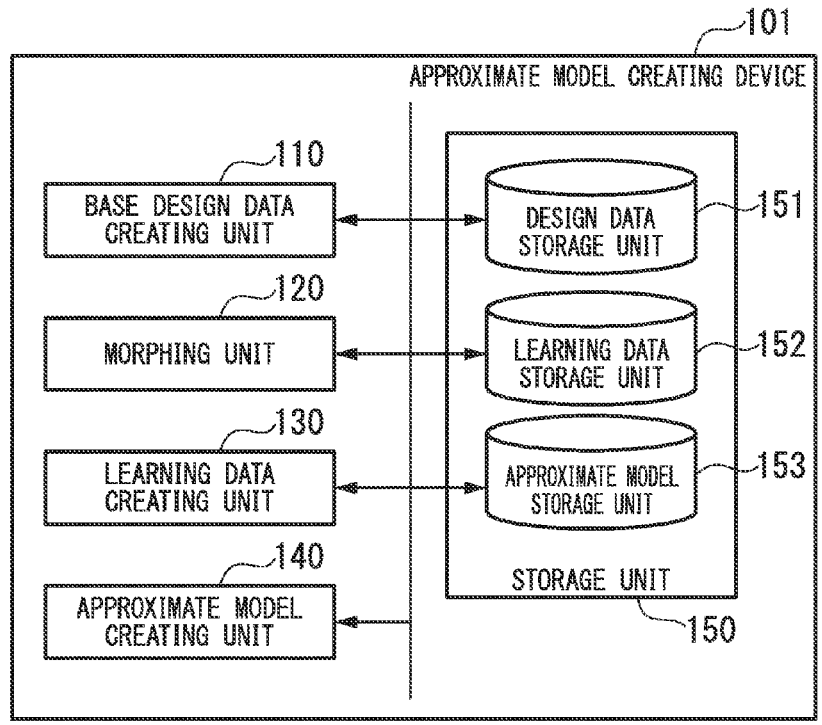
FIG. 22 is a block diagram illustrating a configuration example of an approximate model creating device according to a third embodiment of the invention.

FIG. 22 is a block diagram schematically illustrating a configuration example of an approximate model creating device according to an embodiment of the invention. In FIG. 22, the approximate model creating device 101 and includes a base design data creating unit 110, a morphing unit 120, a learning data creating unit 130, an approximate model creating unit 140, and a storage unit 150.

The storage unit 150 includes a design data storage unit 151, a learning data storage unit 152, and an approximate model storage unit 153.

The design data storage unit 151 stores base design data, learning design ST1 (Standard Triangulated Language) data, and test STL data. The base design data includes base design STL data of a base vehicle and base design feature point data. The base vehicle is a vehicle from which a learning vehicle which is a vehicle for creating an approximate model (response surface: approximating the relationship between responses (the Cd values in the third embodiment) predicted from a plurality of feature values (design variables)) is created through morphing. The base design STL data expresses the vehicle shape of the base vehicle using STL data of a general format for expressing a three-dimensional shape. The base design feature point data represents feature points of the vehicle shape of the base vehicle. The feature points are used to extract a feature value. Examples of the feature value include a positioning coordinate of a predetermined position of a vehicle body, an angle of the surface, and a curvature, as physical quantities representing features of a vehicle shape of a vehicle. The learning design STL data is STL data representing the vehicle shape of a learning vehicle. The test STL data is STL data representing the vehicle shape of a test design used to estimate accuracy of an approximate model under creation.

The learning data storage unit 152 stores learning data, test data, and exterior feature data. The learning data represents feature values, aerodynamic performance values, and categories of each base vehicle and each learning vehicle. The test data represents feature values, aerodynamic performance values, and categories of each test design. The exterior feature data represents exterior features of each base vehicle, each learning vehicle, and each test vehicle.

The approximate model storage unit 153 stores an approximate model of each category. An approximate model is a predicting approximate expression for calculating the aerodynamic performance values by receiving the feature values as an input parameter.

The base design data creating unit 110 creates base design STL data from CAD (Computer Aided Design) data representing the vehicle shape of a base vehicle and enters the created base design STL data into the design data storage unit 151.

The morphing unit 120 deforms the vehicle shape of the base vehicle represented by the base design STL data based on predetermined conditions (learning morphing data to be described later) through a morphing technique according to the related art to create the vehicle shape of a learning vehicle and enters the learning design STL data representing the created vehicle shape into the design data storage unit 151. Similarly, the morphing unit 120 deforms the vehicle shape of the test vehicle represented by the base design STL data based on predetermined conditions (test morphing data to be described later) through a morphing technique according to the related art to create the vehicle shape of a learning vehicle, and enters the test design STL data representing the created vehicle shape into the design data storage unit 151.

The learning data creating unit 130 reads the base design STL data and the learning design STL data, as the STL data used to create the learning data, from the design data storage unit 151. The learning data creating unit 130 calculates the aerodynamic performance values and calculates the feature values of the vehicle shape, through the CFD (Computational Fluid Dynamics) using the STL data used to create the learning data. When categorizing the base vehicles and the learning vehicles based on the exterior feature data created from the STL data used to create the learning data, the learning data creating unit 130 enters the learning data in which the features values, the aerodynamic performance values, and the categories of each base vehicle and each learning vehicle into the learning data storage unit 152.

The learning data creating unit 130 reads the test design STL data, as the STL data used to create the test data, from the design data storage unit 151. The learning data creating unit 130 calculates the aerodynamic performance values and calculates the feature values, through the CFD using the test STL data. When categorizing the base vehicles and the learning vehicles based on the exterior feature data created from the test design STL data, the learning data creating unit 130 enters the test data in which the features values, the aerodynamic performance values, and the categories of each test vehicle into the learning data storage unit 152.

The approximate model creating unit 140 creates an approximate model from the learning data stored in the learning data storage unit 152 by categories, and enters the created approximate models into the approximate model storage unit 153. The approximate model creating unit 140 reads the test data stored in the learning data storage unit 152 and determines the approximation accuracy of the created approximate model using the read test data. Here, the approximate model creating unit 140 inputs the test data to the approximate model, compares the aerodynamic performance value estimated using the approximate model with the aerodynamic performance value of the test data calculated through the CFD, and determines the necessity of an approximate model re-creating process depending on whether the approximation accuracy of the created approximate model is greater than a predetermined threshold value (a correlation coefficient set as a threshold value in case of estimation index A).

Figure 23:
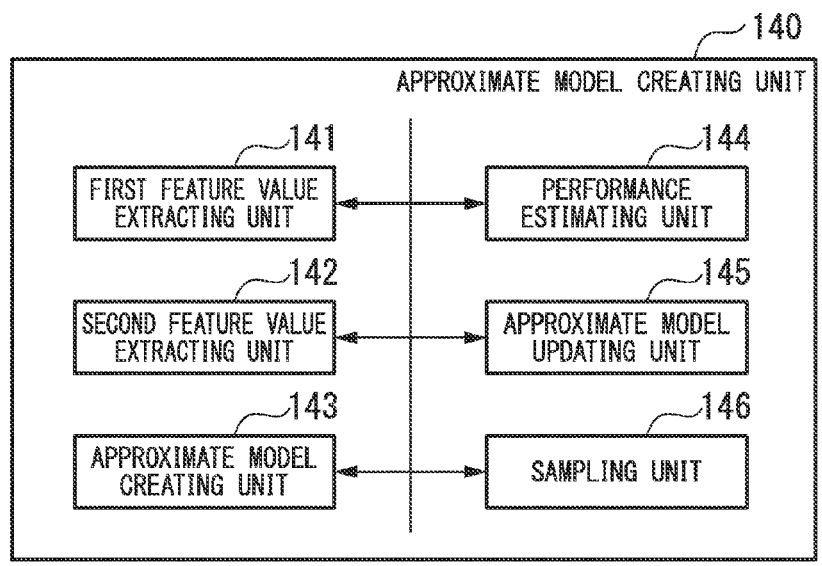
FIG. 23 is a block diagram schematically illustrating a configuration example of an approximate model creating unit 140.

FIG. 23 is a block diagram schematically illustrating a configuration example of the approximate model creating unit 140 in FIG. 22. In FIG. 23, the approximate model creating unit 140 includes a first feature value extracting unit 141, a second feature value extracting unit 142, an approximate model creating unit 143, a performance estimating unit 144, an approximate model updating unit 145, and a sampling unit 146.

The first feature value extracting unit 141 reads the feature values and the Cd values of designs of the base vehicles and the learning vehicles from the learning data stored in the learning data storage unit 152 for each category, and enters the read values into a predetermined feature value table template to create a first feature value table shown in FIG. 24.

In FIG. 24, design D0 to design Dn in the vehicle type column represent the base vehicles or the learning vehicles, and the first feature values including the feature values ($X_1$ to $X_m$) extracted from each vehicle design and the Cd values are shown therein.

Referring to FIG. 23 again, the second feature value extracting unit 142 extracts the second feature values from the first feature values by performing the model learning using the technique of using the ARD (Automatic Relevance Determination) for a model learning such as a VBSR (Variational Bayesian Sparse Progression) technique, and by removing the feature values not contributing to estimation of the Cd values which are aerodynamic performance values from the first feature values (which will be described later in detail).

The second feature value extracting unit 142 enters the feature values and the Cd values extracted for the base vehicle and the learning vehicle into a predetermined feature value table template, and creates the second feature table shown in FIG. 25 for each category.

FIG. 25 is similar to FIG. 24. In FIG. 25, design D0 to design Dn in the vehicle type column represent base vehicles or learning vehicles, and the second feature values ($X_1$ to $X_s$) and the Cd values extracted for each design are described therein. Here, m and s satisfy the relationship of m>s.

Referring to FIG. 23 again, the approximate model crating unit 143 creates an approximate model including a plurality of functions (basis functions) and weighting coefficients of the functions from the second feature values and the Cd values of the second feature value table. Here, the approximate model crating unit 143 performs a model learning process (to be described later) of calculating coefficients (kriging coefficients in case of the kriging method) of the basis functions so as to pass through the feature values through the use of a kriging method or an SVR (Support Vector Regression) method.

The performance estimating unit 144 estimates the prediction accuracy (the approximation accuracy of the prediction result) of the approximate model created by the approximate model creating unit 143 using any one of three indices of index A, index B, and index C.

Index A is a correlation coefficient between a predicted value acquired from the approximate model and a calculated value acquired by calculation using CFD. Index B is a mean square error of the predicted value acquired from the approximate model and the calculated value acquired by calculation using CFD. Index C is the percentage of correct answers representing at what percentage the performance of a design pair can be predicted when the design pair is extracted from pairs used for the model learning.

The approximate model updating unit 145 calculates the approximation accuracy of the approximate model using any one of index A, index B, and index C. The approximate model updating unit 145 determines that an approximate model with predetermined accuracy is created when the used index is greater than a predetermined threshold value, and ends the approximate model creating process. The threshold value used herein is set in advance to correspond to the approximation accuracy necessary for estimation using the approximate model. At this time, the approximate model updating unit 145 extracts and uses a test design newly sampled from the learning data storage unit 152 using the experimental design method, unlike the creation of the approximate model, when calculating the index.

On the other hand, when any one of the indices A, B, and C is not greater than the predetermined threshold value, the approximate model updating unit 145 determines that an approximate model with predetermined accuracy is not created, and continuously performs the approximate model creating process.

The sampling unit 146 creates a plurality of learning morphing data pieces using an experimental design method (such as a Latin hyper square method or an LPτ method). The learning morphing data represents morphing conditions for creating the learning STL data representing a learning vehicle shape so as to uniformly distribute variation magnitudes of coordinates of lattice points in the base design STL data in the design space. This design space is a multidimensional space including an axis representing the varying distance for each lattice point within a coordinate variation allowable range of the lattice points in the base design STL data of a base vehicle. The sampling unit 146 outputs the learning morphing data used to create an approximate model to the morphing unit 120.

The sampling unit 146 creates test morphing data similarly to the learning morphing data and outputs the test morphing data to the morphing unit 120. The test morphing data represents morphing conditions for creating test design STL data used to calculate the approximation accuracy of an approximate model created based on the learning morphing data. The test design STL data represents the vehicle shape of a test design different from that of the learning design STL data.

A case where a Latin hyper square method as an example of the experimental design method is used as a technique of sampling morphing data representing variation data of the lattice points in the base design STL data in the third embodiment will be described below.

Depending on what positions of a vehicle shape are morphed, the positions of the lattice points to be displaced in the design space are changed, and thus the design space is also changed. The process of creating the design space is performed by the sampling unit 146. By allowing a user to input morphing positions, for example, positions selected by the user on a screen of a terminal, such as the roof height of a vehicle, the position of a front tip, and a bumper shape, and the allowable variation range thereof, the sampling unit 146 constructs a design space including the X axis, the Y axis, and the Z axis of the lattice points located at the selected positions as coordinate axes and sets the allowable variation range for each coordinate axis as the range in which the design space is divided into hyper squares.

Figure 26:
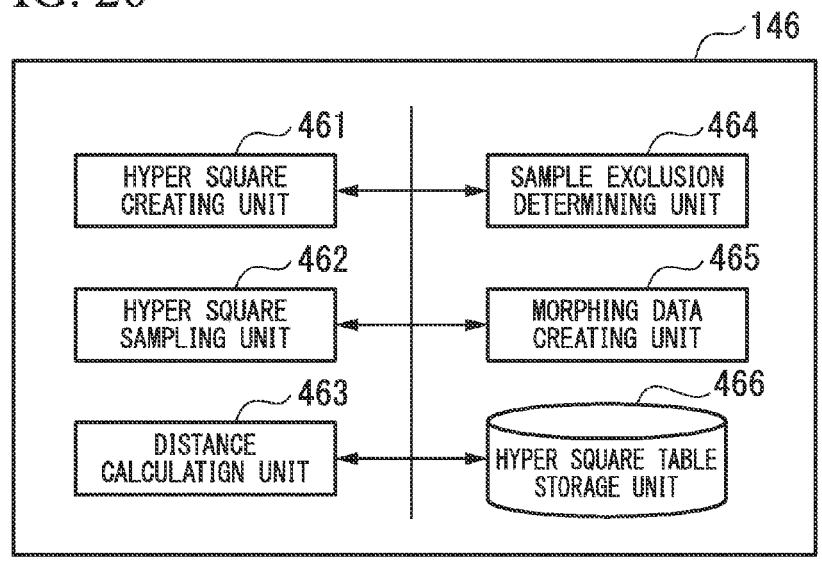
FIG. 26 is a block diagram schematically illustrating a configuration example of a sampling unit 146.

FIG. 26 is a block diagram schematically illustrating a configuration example of the sampling unit 146. FIG. 26, the sampling unit 146 includes a hyper square creating unit 461, a hyper square sampling unit 462, a distance calculating unit 463, a sample exclusion determining unit 464, a morphing data creating unit 465, and a hyper square table storage unit 466. A case where a Latin hyper square method which is an example of the experimental design method is used as a technique of sampling the morphing data representing variation data of each lattice point in the base design STL data in the third embodiment will be described below.

The hyper square creating unit 461 sets an allowable displacement range (that is, a size adjustable range), in which each lattice point of the base design STL data can be displaced (the vehicle shape in the design can be adjusted) in the coordinates of the STL data, to coordinate axes of the displacement directions (X, Y, and Z axes) of the lattice point, and creates a design space of n dimensions ((number of lattice points)×(three dimensions of X, Y, and Z axes)) using the coordinate axes.

The hyper square creating unit 461 divides each of the n-dimensional coordinate axes of the design space into m parts, that is, constructs the design space (a space of the allowable displacement range) using hyper squares (hyper cubic) corresponding to the number of divisions of $m^n$, and enters the central coordinates of the $m^n$ hyper squares into the hyper square table storage unit 466 so as to be stored therein.

The hyper square sampling unit 462 samples hyper squares in the design space using the Latin hyper square method.

That is, the hyper square sampling unit 462 selects a predetermine number of (for example, 100) hyper squares so that the sampled hyper squares are uniformly distributed in the design space. Each hyper square has a displacement coordinate range, and it is assumed hereinafter that the displacement distance within the coordinate range is the same.

Figure 27:
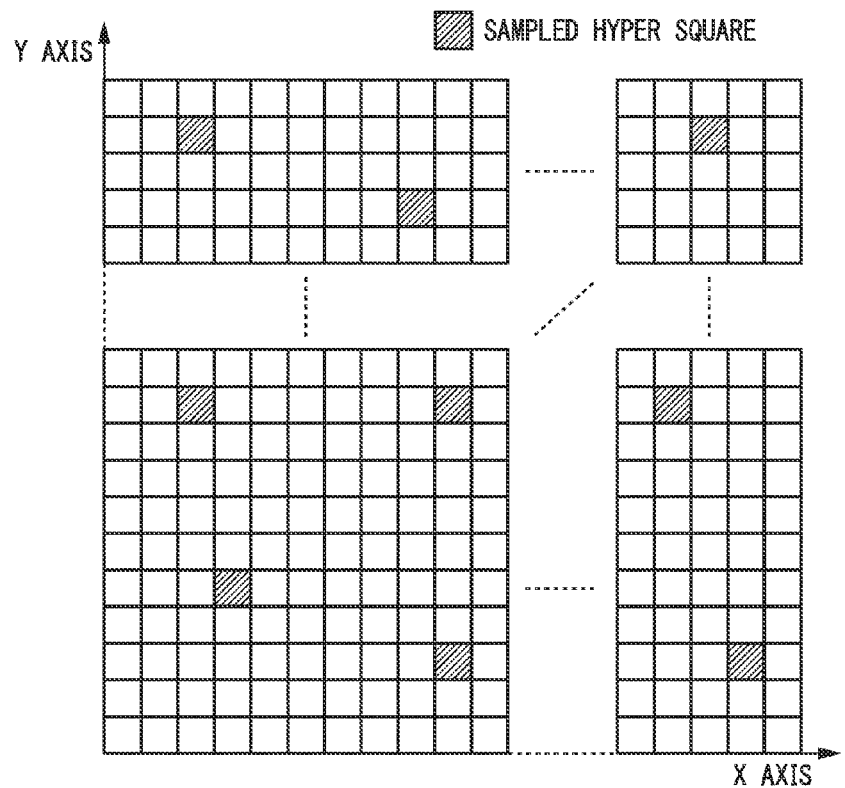
FIG. 27 is a diagram illustrating an example where an n-dimensional coordinate space (an n-dimensional space) of a design space is assumed to be a two-dimensional space.

FIG. 27 is a diagram illustrating an example where the n-dimensional coordinate space (n-dimensional space) of the design space is assumed to be a two-dimensional space. In FIG. 27, lattice points to be displaced in the base design STL data of a base vehicle are shown, that is, the X axis represents a displacement magnitude by which the coordinate position of a lattice point is displaced in the X axis direction and the Y axis represents the displacement magnitude by which the coordinate position of a lattice point is displaced in the Y axis direction. In the allowable displacement range in which the displacement is performed, the X axis is divided into m parts of from $d_{x1}$ to $d_{xm}$ and the Y axis is divided into m parts of from $d_{y1}$ to $d_{ym}$. Therefore, the hyper squares constructed by division are designated by coordinates ($d_{xq}$, $d_{yr}$). Here, the relationship between q and m and the relationship between r and m satisfy $1 \leq q \leq m$, $1 \leq r \leq n$, respectively.

Referring to FIG. 26 again, for example, it is assumed that a lattice point in the base design STL data is displaced in the X axis direction and the Y axis direction. Here, displacement means, for example, that the coordinates of the lattice points are displaced so as to change the curvature of the shape of a vehicle in the three-dimensional space in which the lattice points of the base design STL data are arranged.

In an arrangement of $m^2$ hyper squares (squares in the two-dimensional coordinate system) of m×m which are constructed in a matrix shape by dividing the X axis and the Y axis into m parts, the hyper square sampling unit 462 samples 100 hyper squares (samples the hyper squares as a sample group in the first sampling) using the Latin hyper square method so that a first set number of hyper squares, for example, 100 hyper squares, are uniformly distributed in the arrangement of $m^2$ hyper squares. In the third embodiment, it is assumed that the central coordinate of the selected hyper squares is set for the displacement magnitude. Similarly to the two-dimensional space described with reference to FIG. 27, in an n-dimensional design space, the hyper square sampling unit 462 samples the hyper squares in the design space using the Latin hyper square method so that the selected hyper squares are uniformly distributed in the design space.

When sampling is performed a plurality of times in the m×m arrangement, the distance calculating unit 463 calculates the distances between the coordinate points of newly-sampled hyper squares (a second set number of hyper squares, for example, 50 hyper squares) and all previously-sampled hyper squares (the hyper squares of a sample group) in the n-dimensional space of the design space for each hyper square newly sampled after the first time.

The distance calculating unit 463 sets the smallest distance of the distances between the coordinate points of the newly-sampled hyper squares and all the previously-sampled hyper squares as an estimated distance $d_h$ between the new hyper squares and the previously-sampled hyper squares. The distance calculating unit 463 enters and stores the calculated estimated distances $d_h$ into and in the hyper square table storage unit 466 so as to be correlated with the coordinate points of the newly-sampled hyper squares.

The sample exclusion determining unit 464 reads the estimated distances $d_h$ of the newly-sampled hyper squares from the hyper square table storage unit 466 and compares the read estimated distances $d_h$ with a preset distance threshold value $d_t$.

Here, the sample exclusion determining unit 464 excludes and deletes the newly-sampled hyper squares, which have an estimated distance $d_h$ equal to or less than the distance threshold value $d_t$, from the sampling target. On the other hand, the sample exclusion determining unit 464 sets the newly-sampled hyper squares, which have an estimated distance $d_h$ greater than the distance threshold value $d_t$, as the hyper squares to be sampled.

The preset distance threshold value is set to a distance hardly associated with the CFD difference due to the vehicle shape in spite of displacement, that is, a distance which is the same as the previously-sampled hyper squares.

For example, the distance threshold value $d_t$ is set to $C_1 \times D$. Here, D represents the number of hyper squares sampled at the first time, that is, the number of sampled hyper squares. $C_1$ is a coefficient and satisfies $0 < C_1 \leq 1$. When the sampling is performed a plurality of times, the numerical value of the coefficient $C_1$ may be changed so that the value of the distance threshold value $d_t$ slowly decreases.

The morphing data creating unit 465 reads the displacement magnitudes of the feature values corresponding to the coordinates of the previously-sampled hyper squares including the first-sampled hyper squares and the newly-sampled hyper squares from the hyper square table of the hyper square table storage unit 466, and creates learning morphing data used to create learning data.

The morphing data creating unit 465 creates test morphing data used to create test data from the displacement magnitudes of the feature values of the first-sampled hyper squares using the Latin hyper square method of the hyper square sampling unit 462.

The morphing data creating unit 465 outputs the created learning morphing data and the created test morphing data to the morphing unit 120.

Referring to FIG. 22 again, the morphing unit 120 creates the learning design STL data and the test design STL data by morphing the base design STL data based on the learning morphing data and the test morphing data to displace the lattice points. The morphing unit 120 displaces a lattice point in the base design STL data in the X axis direction and the Y axis direction using the learning and test morphing data. Here, displacement means, for example, that the coordinates of the lattice points are displaced so as to change the curvature of the shape of a vehicle in the three-dimensional space in which the lattice points of the base design STL data are arranged.

The process, which is performed by the second feature value extracting unit 142, of reducing the feature values not contributing to calculation of the Cd value in the first feature values is the same as the process described with reference to Equations 1 to 14 and performed by the second feature value extracting unit 42, and thus a description thereof will not be repeated here.

The process, which is performed by the performance estimating unit 144, of estimating the prediction accuracy of an approximate expression is the same as the process described with reference to Equations 15 to 17 and performed by the performance estimating unit 44, and thus a description thereof will not be repeated here.

Figure 28:
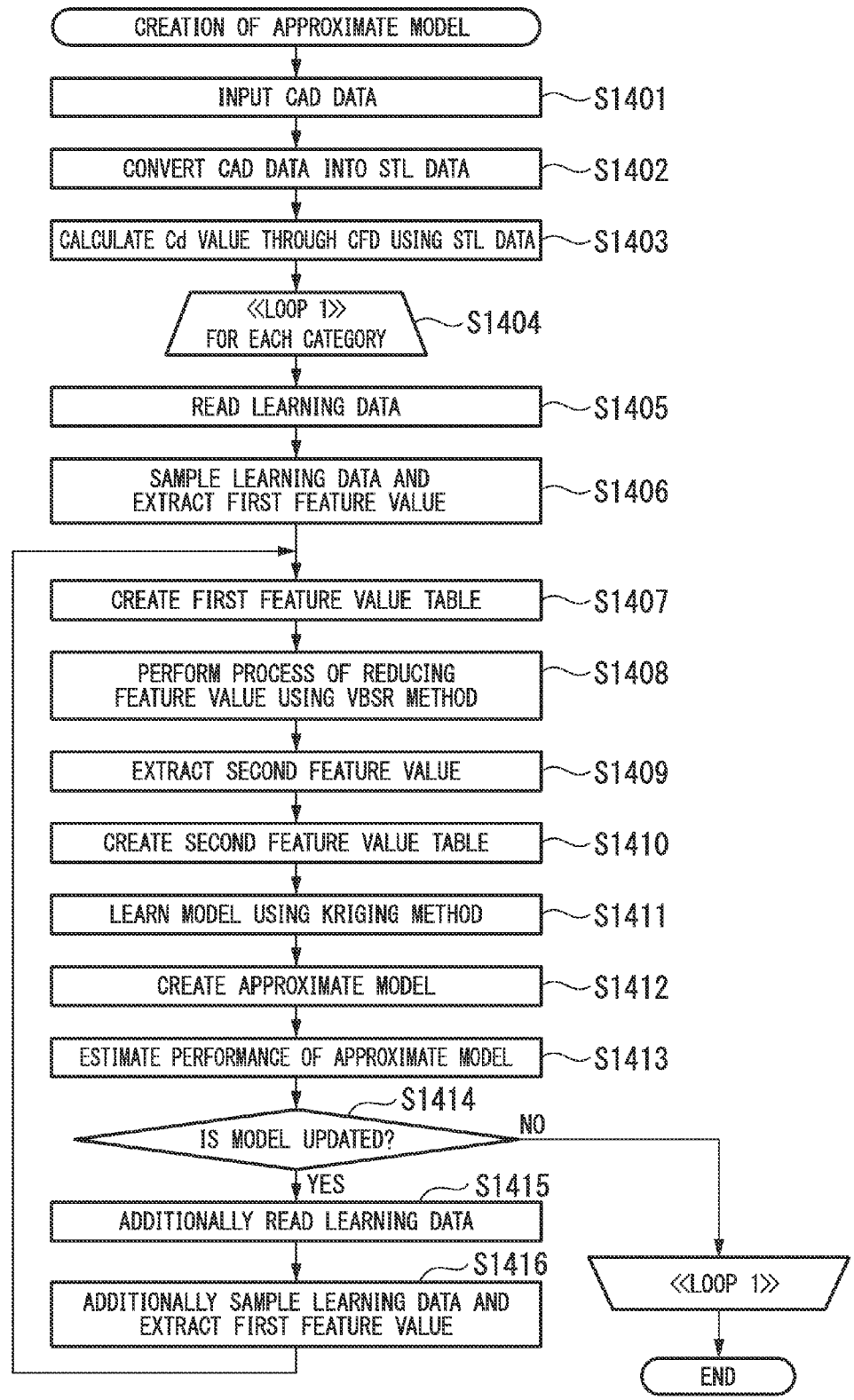
FIG. 28 is a flowchart illustrating the flow of operations of an approximate model creating process in an approximate model creating unit 140.

The operations of the approximate model creating unit 140 will be described below with reference to FIGS. 22, 23, and 28. FIG. 28 is a flowchart illustrating the flow of operations of the approximate model creating process in the approximate model creating unit 140.

The base design data creating unit 110 reads CAD data of a base vehicle from an external device or the like (step S1401). The base design data creating unit 110 converts the read CAD data of the base vehicle into base design STL data. The base design data creating unit 110 enters and stores the created base design STL data into and in the design data storage unit 151 to correspond to the base vehicle (step S1402).

At this time, the sampling unit 146 outputs the learning design STL data created based on the experimental design method and the learning morphing data and the test morphing data used to create the test design STL data to the morphing unit 120. Here, the morphing unit 120 reads the base design STL data from the design data storage unit 151. The morphing unit 120 performs a morphing process of deforming the vehicle shape of the base vehicle under the conditions determined through an experimental design method and creating a vehicle shape of a learning vehicle.

For example, an XYZ coordinate system having an X axis which is a horizontal axis in a front-rear direction of a vehicle, a Y axis which is a horizontal axis in a right-left direction, and a Z axis which is a vertical axis is assumed. The morphing unit 120 deforms the vehicle shape by displacing lattice points, which are located around a part to be deformed as control points out of the lattice points placed on the vehicle shape represented by the base design STL data, in the X direction, the Y direction, and the Z direction. The morphing unit 120 creates learning design STL data representing the vehicle shape of each learning vehicle created through the morphing process under the conditions determined based on the learning morphing data, and enters the created learning design STL data into the design data storage unit 151. Similarly, the morphing unit 120 performs a morphing process of deforming the vehicle shape of the test vehicle and creating the vehicle shape of a test design under the conditions determined based on the test morphing data, creates the test design STL data representing the vehicle shape of each test vehicle, and enters the created test design STL data into the design data storage unit 151.

The learning data creating unit 130 creates and enters the learning data and the test data into the learning data storage unit 152 by calculating the Cd values as the aerodynamic performance values through the CFD using the base design STL data and the learning design STL data and the test design STL data created through the morphing process and extracting and categorizing the feature values (step S1403). Here, the learning data creating unit 130 reads the learning design STL data created by the base design data creating unit 110 and the learning design STL data created by the morphing unit 120, as the STL data used to create the learning data, from the design data storage unit 151. The learning data creating unit 130 creates spatial lattices for the vehicle shape represented by the STL data used to create the learning data, calculates the pressure and the velocity distribution for each lattice through the CFD, and acquires the aerodynamic performance values therefrom. The learning data creating unit 130 calculates the feature values of the vehicle from the STL data used to create the learning data. The learning data creating unit 130 performs the same process as performed when the STL data used to create the learning data is used, acquires the aerodynamic performance values based on the test design STL data read from the design data storage unit 151, and calculates the feature values of the vehicle.

The approximate model creating unit 140 performs the processes of steps S1405 to S1416 as a process of reading sets of the feature value and the aerodynamic performance value of the learning vehicle and the base vehicle in the same category from the learning data stored in the learning data storage unit 152 and creating an approximate model from the read sets of the feature value and the aerodynamic performance value, for each category set in the learning data of the learning data storage unit 152 (step S1404).

The first feature value extracting unit 141 reads the learning data in which the category as a current processing target is set from the learning data storage unit 152 (step S1405). The first feature value extracting unit 141 extracts the set of the feature value and the Cd value from the read learning data (step S1406), creates a first feature value table (step S1407), and enters the first feature value table into the learning data storage unit 152 so as to be stored therein.

Figure 29:
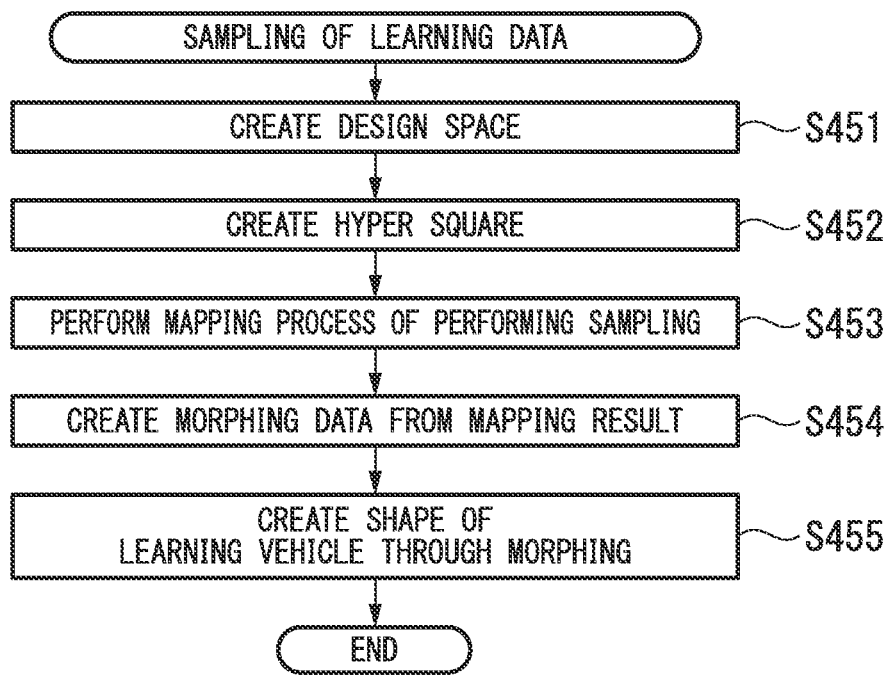
FIG. 29 is a flowchart illustrating the flow of operations of a process of creating learning morphing data and test morphing data.
Figure 30:
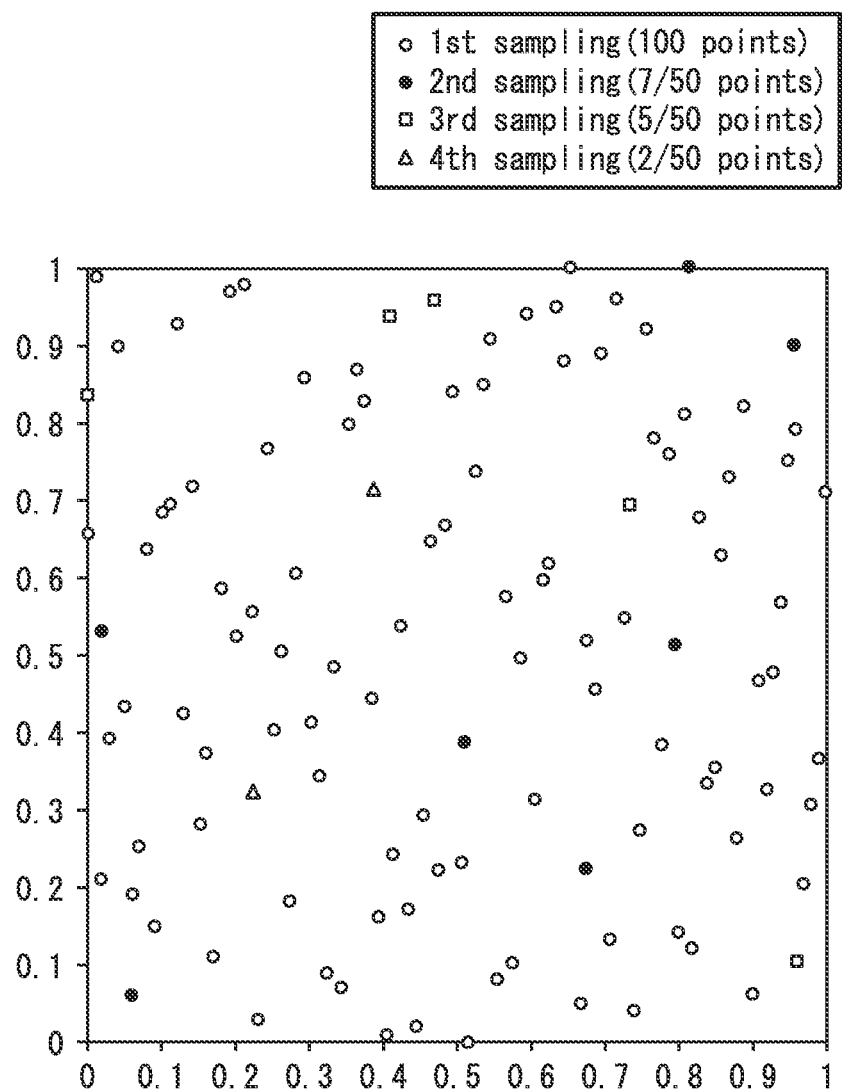
FIG. 30 is a diagram illustrating hyper square sampling using a Latin hyper square method when a design space is two-dimensional.

The process of creating the learning morphing data and the test morphing data which are used to create the learning data and the test data will be described below with reference to FIGS. 29 and 30. This process is performed for each category of vehicles. FIG. 29 is a flowchart illustrating an operation example of the process of creating the learning morphing data and the test morphing data. FIG. 30 is a diagram illustrating an operation of sampling hyper squares using a Latin hyper square method when the design space is a two-dimensional space.

The creation of the learning morphing data will be described below as a representative example; however, the same is true of the creation of the test morphing data.

The hyper square creating unit 461 creates a design space for constructing Latin hyper squares by setting the axes for feature values to be displaced and setting allowable displacement ranges of the feature values on the axes (step S451). When the number of feature values is n, the design space is a n-dimensional space. The hyper square creating unit 461 divides n axes of the design space into m parts to partition the n-dimensional space of the design space into $n^m$ spaces, that is, to create $n^m$ hyper squares in the design space (step S452).

The hyper square sampling unit 462 selects and maps, for example, 100 hyper squares from the $n^m$ hyper squares in the design space using the Latin hyper square method so that the selected hyper squares are uniformly distributed in the design space (step S453). In FIG. 30, black circles (●) indicate the positions of the 100 sampled hyper squares. The hyper square sampling unit 462 enters the coordinates of the sampled hyper squares (displacement data of each feature value) into the hyper square table of the hyper square table storage unit 466 so as to be stored therein.

The morphing data creating unit 465 reads the coordinates of 100 hyper squares corresponding to the category of the vehicle, of which the morphing data should be created, from the hyper square table of the hyper square table storage unit 466. The morphing data creating unit 465 creates one learning morphing data piece from each of the 100 coordinates, that is, 100 learning morphing data pieces, and outputs the created learning morphing data to the morphing unit 120 (step S454). Then, the morphing unit 120 performs a morphing process of displacing the positions of the corresponding lattices in the base design STL data based on the 100 learning morphing data pieces. Accordingly, the morphing unit 120 creates the learning design STL data of 100 learning vehicles from the 100 learning morphing data pieces, and enters the created learning design STL data pieces into the design data storage unit 151 so as to be stored therein.

Figure 31:
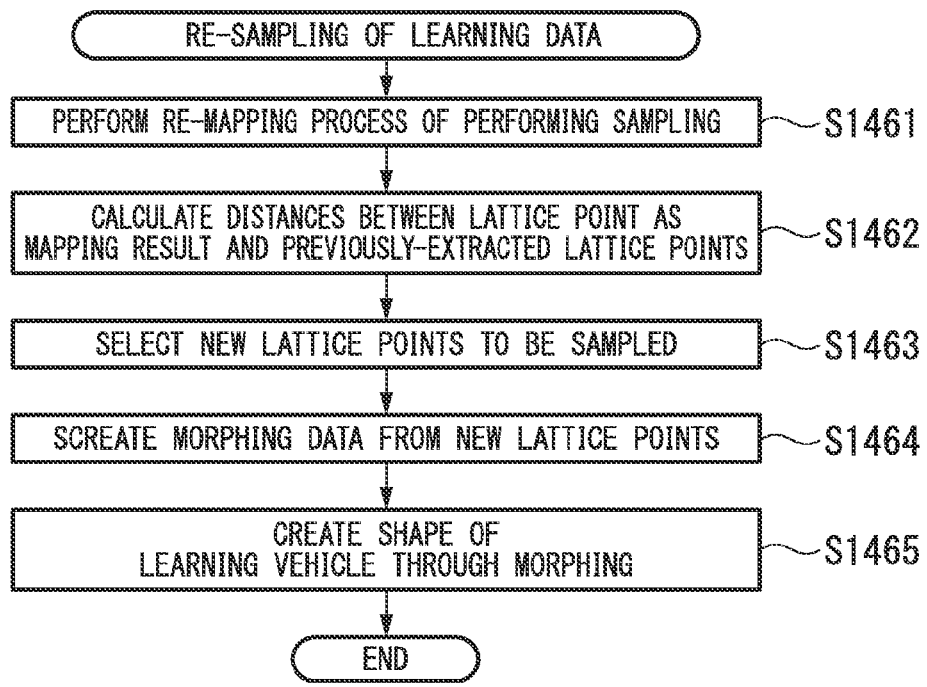
FIG. 31 is a flowchart illustrating the flow of operations of a process of additionally creating test morphing data.

A process of creating learning morphing data to be used to additionally create learning data when the approximation accuracy of an approximate model is less than predetermined index A will be described below with reference to FIGS. 30 and 31. This process of adding a learning vehicle is performed for each category of vehicles. FIG. 31 is a flowchart illustrating the flow of operations of the process of additionally creating test morphing data.

When index A of an approximate model is equal to or less than a predetermined threshold value, the hyper square sampling unit 462 newly selects and maps, for example, 50 hyper squares from the $n^m$ hyper squares in the design space using the Latin hyper square method so that the selected hyper squares are uniformly distributed in the design space (step S461). In FIG. 30, white circles (○) indicate the positions of the newly-sampled hyper squares. The hyper square sampling unit 462 enters the coordinates of the sampled hyper squares (displacement data of each feature value) into the hyper square table of the hyper square table storage unit 466 so as to be stored therein.

Then, the distance calculating unit 463 calculates the distances between the coordinate of the newly-sampled hyper square and the coordinates of the previously-sampled hyper squares for each of the newly-sampled 50 hyper squares. The distance calculating unit 463 selects the smallest distance of the distances between the newly-sampled hyper squares and the previously-sampled hyper squares, and sets the selected smallest distance as an estimated distance $d_h$, which is used as an index for estimating the newly-sampled hyper squares. The distance calculating unit 463 calculates the estimated distance $d_h$ for all the newly-sampled hyper squares (step S462). The distance calculating unit 463 enters and stores the calculated estimated distances $d_h$ into and in the hyper square table of the hyper square table storage unit 466 so as to be correlated with the coordinate points of the newly-sampled hyper squares.

The sample exclusion determining unit 464 reads the estimated distances $d_h$ of the newly-sampled hyper squares from the hyper square table of the hyper square table storage unit 466. The sample exclusion determining unit 464 compares the read estimated distances $d_h$ with a preset distance threshold value $d_t$ and deletes the coordinates of the hyper squares corresponding to the estimated distance $d_h$ equal to or less than the distance threshold value $d_t$ from the hyper square table of the hyper square table storage unit 466. Accordingly, the sample exclusion determining unit 464 selects the hyper squares corresponding to the estimated distance $d_h$ greater than the distance threshold value $d_t$ (step S463). The sample exclusion determining unit 464 merges the coordinates of the newly-sampled and non-deleted hyper squares into the coordinates of the previously-sampled hyper squares. In FIG. 28, seven hyper squares of which the estimated distance $d_h$ is greater than the distance threshold value $d_t$ out of the newly-sampled 50 hyper squares in the second sampling are merged as data used to create a learning vehicle into the data group of the previously-sampled 100 hyper squares. As the result of the second sampling, the coordinates of the 107 sampled hyper squares are written to the hyper square table of the hyper square table storage unit 466.

Then, the morphing data creating unit 465 reads the coordinates of the hyper squares from the hyper square table of the hyper square table storage unit 466 for the category corresponding to the vehicle of which the approximate model is created, and creates the learning morphing data with the coordinate values of the hyper squares as a displacement magnitude (step S464). The morphing data creating unit 465 outputs the created learning morphing data to the morphing unit 120. In the second sampling, that is, after the sampling subsequent to the first sampling of hyper squares, the morphing data creating unit 465 creates seven morphing data pieces from the coordinates of the seven hyper squares newly written to the hyper square table of the hyper square table storage unit 466. The morphing data creating unit 465 outputs the created seven learning morphing data pieces to the morphing unit 120.

The morphing unit 120 performs a morphing process of displacing the positions of the corresponding lattices in the base design STL data based on the seven learning morphing data pieces. Accordingly, the morphing unit 120 creates the learning design STL data of seven learning vehicles from the seven learning morphing data pieces. Then, the morphing unit 120 enters the newly-created seven learning design STL data pieces in addition the previous 100 learning design STL data pieces into the design data storage unit 151 so as to be stored therein (step S465).

A random sampling method may be used instead of the Latin hyper square method as the experimental design method used for the sampling.

The second feature value extracting unit 142 removes the feature values not contributing to estimation of the Cd value from the first feature values read from the first feature value table of the learning data storage unit 152 through the use of the technique using the ARD such as a VBSR method for model learning (step S1408). The second feature value extracting unit 142 extracts the remaining feature values not removed from the first feature values as the second feature values (step S1409), creates the second feature value table (step S1410), and enters the created second feature value table into the learning data storage unit 152 so as to be stored therein. By performing the process of identifying the feature values through the VBSR estimation, it is possible to remove the feature values not contributing or hardly contributing to estimation of the aerodynamic performance value in an approximated model when creating the approximate model for estimating the aerodynamic performance value of a vehicle shape in the specific category.

The approximate model creating unit 143 reads the second feature values from the second feature value table of the learning data storage unit 152. The approximate model creating unit 143 learns a model based on a kriging method using the feature values of the read second feature values and Equation 13 (step S1411) and creates an approximate model which is a kriging prediction expression (step S1412).

The performance estimating unit 144 reads the test data from the learning data storage unit 152 and calculates the Cd values of the vehicle shape of the test data using the approximate model created by the approximate model creating unit 143 based on the feature values of the test data. The performance estimating unit 144 reads the Cd values of the vehicle shape of the test data acquired through the CFD from the learning data storage unit 152. Then, the performance estimating unit 144 calculates the correlation coefficient $r_p$ of index A from the Cd values acquired using the approximate model and the Cd values acquired through the CFD, for example, through the use of Equation 15, and estimates the performance of the approximate model (step S1413).

Then the approximate model updating unit 145 determines whether index A satisfies the threshold value set for index A (step S1414). That is, when it is determined that index A satisfies the threshold value set for index A, the approximate model updating unit 145 determines that the approximate model can predict the Cd values with satisfactory accuracy (NO in step S1414) and enters the created approximate model and the category thereof into the approximate model storage unit 53 in an associated manner. Then, the approximate model creating unit 140 performs the processes of steps S1404 to S1414 on the next category. When the processes are performed on all the categories, the approximate model creating unit 140 ends the approximate model creating process.

On the other hand, when it is determined that index A does not satisfy the threshold value set for index A, the approximate model updating unit 145 determines that the Cd values cannot be predicted with satisfactory accuracy using the approximate model (YES in step S1414) and performs the process of step S1415 so as to continue to perform the approximate model creating process.

The first feature value extracting unit 141 specifies learning data in which the category to be processed is set out of the learning data stored in the learning data storage unit 152. The first feature value extracting unit 141 instructs the sampling unit 146 to create morphing data used to create new learning data so as to create learning data other than the currently-sampled learning data out of the specified learning data. Accordingly, the sampling unit 146 creates new learning morphing data through an experimental design method. At this time, the sampling unit 146 extracts morphing data not overlapping with the previously-created learning data (in which the distance in the design space between the newly-created learning data and the currently-sampled learning data is larger than a predetermined distance) and outputs the extracted morphing data as the learning morphing data to the morphing unit 120.

The morphing unit 120 performs the morphing process using the supplied learning morphing data as described above. The learning data creating unit 130 creates and enters the learning data into the learning data storage unit 152 by calculating the Cd values through the CFD using the learning design STL data created through the morphing process and extracting and categorizing the feature values (step S1415). The first feature value extracting unit 141 extracts the feature values and the Cd values from the read learning data (step S1416), adds the extracted feature values and the extracted Cd values to the first feature table (step S1407), and enters the first feature value table into the learning data storage unit 152 so as to be stored therein.

As described above, in the third embodiment, when approximate models acquired based on a vehicle shape of a base vehicle and vehicle shapes of a predetermined number of learning vehicles created by morphing the base vehicle do not have predetermined approximation accuracy, the vehicle shapes of an additional preset number of learning vehicles are acquired through the morphing and the approximate models are re-created. In the third embodiment, when the vehicle shapes of the learning vehicles are created again by the morphing, it is determined whether the morphing data representing the displacement magnitude for each lattice point of which the coordinate is displaced is matched with the morphing data previously used for the morphing, and thus the learning vehicles to be added do not overlap.

Accordingly, according to the third embodiment, the number of learning data pieces to be used to create the approximate models is increased until the approximation accuracy of the approximate models is in a predetermined range. Accordingly, it is possible to efficiently perform an approximate model creating process with predetermined approximation accuracy without performing an unnecessary morphing process.

According to the third embodiment, since the feature values not contributing to estimation of the Cd values are deleted in advance through model learning using the ARD and the kriging method is performed using only the feature values contributing to estimation of the Cd values to create the final approximate model, it is possible to create an approximate model within a shorter time, compared with a case where an approximate model is created using only the kriging method in the related art.

When an approximate model is created using only the kriging method, the feature values serving as noise and not contributing to estimation of the Cd value are reflected in the approximate model.

On the other hand, according to the third embodiment, since the feature values serving as noise are removed through the reduction process, the second feature values contributing to estimation of the Cd value are extracted, and an approximate model is learned and created using the kriging method and the second feature values, it is possible to create an approximate model with higher accuracy, compared with a case according to the related art.

The program used to realize the functions of the approximate model creating device 101 in FIG. 22 may be recorded on a computer-readable recording medium, and the approximate model creating process and the process of creating morphing data for morphing a base vehicle to create an approximate model may be performed by causing a computer system to read and execute the program recorded on the recording medium. Here, the computer system includes an OS (Operating System) and hardware such as peripherals.

The "computer system" also includes a WWW system having a homepage provision environment (or display environment). The "computer-readable recording medium" includes a portable medium such as a flexible disc, a magneto-optical disc, a ROM, or a CD-ROM or a storage device such as a hard disk built in the computer system. The "computer-readable recording medium" also includes a device storing a program for a predetermined time, like an internal volatile memory (RAM (Random Access Memory)) of a computer system serving as a server or a client when the programs are transmitted through a network such as the Internet or a communication line such as a telephone line. The program may realize some of the above-described functions. The program may realize the above-described functions in combination with a program already recorded in a computer system.

While the embodiments of the invention have been described in detail with reference to the accompanying drawings; however, a specific configuration is not limited to the above embodiments, and various design changes may be made without departing from the scope of the invention.

What is claimed is:

1. A performance predicting apparatus comprising:
an approximate model storage unit configured to store approximate models each of which is associated with one of categories, and which are used to calculate functional performance based on feature values;
a feature value extracting unit configured to extract the feature values from shape data representing a shape of an object;
a selection unit configured to select one of the approximate models to be used from the approximate models stored in the approximate model storage unit depending on the feature values extracted by the feature value extracting unit; and
a performance calculating unit configured to calculate functional performance based on the feature values extracted by the feature value extracting unit using the approximate model selected by the selection unit.

2. The performance predicting apparatus according to claim 1, further comprising an approximate model creating unit configured to create the approximate models associated with the categories using sets of the feature values and functional performance values of a learning object shape.

3. The performance predicting apparatus according to claim 1, wherein the approximate model storage unit stores, in association with the categories, information on colors of parts of the object shape representing a strength of association with the functional performance, and
the performance predicting apparatus further comprises an output unit configured to read the information on colors of parts stored in the approximate model storage unit based on the category corresponding to that of the approximate model selected by the selection unit, and to display the object shape represented by the shape data in the colors of parts represented by the read information.

4. The performance predicting apparatus according to claim 1, further comprising a feature point determining device configured to determine and provide feature points of the object to the feature value extracting unit,
wherein the feature point determining device includes:
a profile shape data calculating unit configured to calculate profile shape data including at least an angle formed by line segments connecting a point to two points adjacent to the point for each of a plurality of points on a profile line of the object;
a model storage unit configured to store profile shape data of a plurality of points on a profile line of a model object approximating the object and positions of feature points on the profile line in an associated manner; and
a feature point specifying unit configured to specify positions of feature points of the object corresponding to the feature points stored in the model storage unit by performing pattern matching on the profile shape data calculated by the profile shape data calculating unit based on the profile shape data stored in the model storage unit.

5. The performance predicting apparatus according to claim 4, wherein the feature point determining device includes a profile line extracting unit configured to extract an outermost profile line in a cross section of the object from three-dimensional data representing the shape of the object, and
the model storage unit stores information of the outermost profile line in a cross section of three-dimensional data representing the shape of the model object as information of the profile line of the model object.

6. The performance predicting apparatus according to claim 5, wherein the profile line extracting unit extracts an outermost profile line of the object in a plurality of cross sections parallel to each other from three-dimensional data representing the shape of the object,
the profile shape data calculating unit calculates the profile shape data of the profile lines extracted by the profile line extracting unit, and
the feature point specifying unit specifies three-dimensional coordinates of the feature points of the object by performing the pattern matching on the profile shape data calculated by the profile shape data calculating unit based on the profile shape data stored in the model storage unit.

7. The performance predicting apparatus according to claim 4, wherein the profile shape data includes lengths of line segments connecting the center of gravity of a region surrounded with the profile line to points on the profile line.

8. The performance predicting apparatus according to claim 4, wherein the model storage unit stores a plurality of sets of information of the profile line and positions of the feature points, and
the feature point specifying unit performs the pattern matching using the set representing the profile line similar to the profile line of the object out of the sets of the information of the profile line and the positions of the feature points stored in the model storage unit.

9. The performance predicting apparatus according to claim 4, further comprising a model recording unit configured to record the profile shape data calculated by the profile shape data calculating unit on the model storage unit.

10. The performance predicting apparatus according to claim 4, wherein the feature point specifying unit performs the pattern matching using DP matching.

11. The performance predicting apparatus according to claim 4, wherein the profile shape data includes values relevant to brightness of points on the profile line.

12. The performance predicting apparatus according to claim 1, further comprising an approximate model creating device configured to create the approximate model,
wherein the approximate model creating device includes:
a first feature value extracting unit configured to create a first feature value table representing a first feature value of each structure model, which is extracted from the shapes of a plurality of structure models;
a second feature value extracting unit configured to extract a second feature value which is a feature value contributing to estimation of the functional performance out of the first feature values of the first feature value table and to create a second feature value table; and
an approximate model creating unit configured to create the approximate model which is an approximate expression for estimating the functional performance using the second feature values in the second feature value table.

13. The performance predicting apparatus according to claim 12, wherein the second feature value extracting unit extracts the first feature value, in which a first weighting coefficient to be multiplied by the first feature values in a linear approximate model is equal to or more than a predetermined reduction threshold value, as the second feature value when creating the linear approximate model representing a linear relationship between the first feature values and the functional performance from a plurality of different shapes of the structure models.

14. The performance predicting apparatus according to claim 13, wherein the second feature value extracting unit performs a process of extracting the second feature values from the first feature values using the linear approximate model in a VBSR method having the first feature value as a main variable and having the functional performance as a dependent variable.

15. The performance predicting apparatus according to claim 12, wherein the approximate model creating unit acquires a second weighting coefficient of each of a plurality of functions from the second feature values and creates the approximate model when constructing the approximate model including the plurality of functions representing correspondence between the functional performance and the second feature values from a plurality of different shapes of the structure models.

16. The performance predicting apparatus according to claim 15, wherein the approximate model creating unit creates the approximate model for estimating the functional performance using an approximate expression in a kriging method having the second feature value as a main variable and having the functional performance as a dependent variable.

17. The performance predicting apparatus according to claim 1, further comprising an approximate model creating device configured to create the approximate model,
wherein the approximate model creating device includes:
a sampling unit configured to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data;
a distance calculating unit configured to calculate distances of the coordinate points of the sample group in the coordinate space for each of the second set number of coordinate points;
a sample exclusion determining unit configured to compare the calculated distances with a predetermined distance threshold value;
a morphing unit configured to perform a morphing process on a base shape using the morphing data to create a learning shape; and
an approximate model creating unit configured to create the approximate model using the base shape and the learning shape,
wherein the sampling unit samples the first set number of coordinate points in the first sampling and samples the second set number of coordinate points in the subsequent sampling when repeatedly sampling the morphing data, and
wherein the sample exclusion determining unit merges the coordinate points, which are sampled by the second set number and of which the distances are greater than the distance threshold value, into the sample group as new morphing data.

18. The performance predicting apparatus according to claim 17, further comprising a performance estimating unit configured to determine approximate accuracy of the approximate model,
    wherein the sampling unit samples test morphing data different from the morphing data used to create the approximate model from the design space,
    the performance estimating unit determines the approximation accuracy using the functional performance value acquired using the test morphing data, and
    the approximate model creating unit re-creates an approximate model based on the morphing data of the sample group including the new morphing data acquired by the sampling unit.

19. The performance predicting apparatus according to claim 17, wherein the experimental design method is a Latin hyper square method, and
    the coordinate axes of the design space are divided into a predetermined division number, hyper squares are constructed in the design space, and the coordinates of the hyper squares are used as the coordinate points.

20. The performance predicting apparatus according to claim 17, wherein the distance threshold value is set as a distance of a coordinate point at which the morphing data sampled at the second time or subsequently thereto have the same morphing result as morphing data in the sample group.

21. The performance predicting apparatus according to claim 1, further comprising a model applying device,
    wherein the model applying device includes:
    a storage unit configured to store a plurality of calculation models used to calculate a solution from input data;
    a data input unit configured to read the input data;
    a calculation model selecting unit configured to select at least one calculation model to be used out of the plurality of calculation models stored in the storage unit based on the input data read by the data input unit; and
    a calculation unit configured to calculate the solution from the input data using the calculation model selected by the calculation model selecting unit.

22. The performance predicting apparatus according to claim 21, wherein the calculation model selecting unit calculates an estimated value quantitatively representing that each of the plurality of calculation models is appropriately applied to the input data and selects the calculation model having the highest estimated value, and
    the calculation unit calculates the solution from the input data using the calculation model selected by the calculation model selecting unit.

23. The performance predicting apparatus according to claim 21, wherein the calculation model selecting unit calculates an estimated value quantitatively representing that each of the plurality of calculation models is appropriately applied to the input data, and selects at least one calculation model to be used out of the plurality of calculation models based on the calculated estimated value, and
    the calculation unit calculates the solution from the input data using the calculation model selected by the calculation model selecting unit and the estimated value calculated from the selected calculation model.

24. The performance predicting apparatus according to claim 23, wherein the calculation unit weights and adds solutions calculated from the input data using the calculation models selected by the calculation model selecting unit based on the estimated values calculated form the calculation models used for the calculation and calculates the solution.

25. The performance predicting apparatus according to claim 21, wherein the plurality of approximate models are classified and one class includes at least one approximate model.

26. The performance predicting apparatus according to claim 1, further comprising a recording permission determining device configured to determine whether new data should be entered into a storage device configured to store data including a plurality of parameters,
    wherein the recording permission determining device includes:
    an additional data acquiring unit configured to acquire new data;
    a position specifying unit configured to specify a position in a parameter space having the parameters of the new data acquired by the additional data acquiring unit as elements;
    a density determining unit configured to determine whether a density of the data stored in the storage device at the position specified by the position specifying unit is high; and
    a recording permission determining unit configured to determine that the new data acquired by the additional data acquiring unit should be entered into the storage device when the density determining unit determines that the density of the data at the position specified by the position specifying unit is low.

27. The performance predicting apparatus according to claim 26, further comprising:
    a gravity center specifying unit configured to specify a position of the center of gravity of a data group stored in the storage device in the parameter space;
    a recorded data distance calculating unit configured to calculate the distance from the center of gravity specified by the gravity center specifying unit to a corresponding data piece for each piece of data stored in the storage device; and
    an additional data distance calculating unit configured to calculate the distance from the center of gravity specified by the gravity center specifying unit to new data acquired by the additional data acquiring unit,
    wherein the density determining unit determines whether the density of the data at the position specified by the position specifying unit is high using the distance calculated by the additional data distance calculating unit and the distance calculated by the recorded data distance calculating unit.

28. The performance predicting apparatus according to claim 27, wherein the density determining unit determines that the density of the data at the position specified by the position specifying unit is low when the distance calculated by the addition data distance calculating unit is larger than the maximum value of the distance of the calculated by the recorded data distance calculating unit.

29. The performance predicting apparatus according to claim 27, further comprising:
    a presence rate calculating unit that calculates a rate of data which is present within a predetermined distance range including the distance calculated by the additional data distance calculating unit based on the number of data pieces stored in the storage device,
    wherein the density determining unit determines that the density of data at the position specified by the position specifying unit is low when the rate calculated by the presence rate calculating unit is equal to or less than a predetermined threshold value.

30. A performance predicting method which is performed by a performance predicting apparatus including an approximate model storage unit configured to store approximate models each of which is associated with one of categories, and which are used to calculate functional performance based on feature values, the performance predicting method comprising:
 a feature value extracting step of causing a feature value extracting unit to extract the feature values from shape data representing a shape of an object;
 a selection step of causing a selection unit to select one of the approximate models to be used from the approximate models stored in the approximate model storage unit depending on the feature values extracted in the feature value extracting step; and
 a performance calculating step of causing a performance calculating unit to calculate functional performance based on the feature values extracted in the feature value extracting step using the approximate model selected in the selection step.

31. The performance predicting method according to claim 30, further comprising a feature point determining step using a feature point determining device configured to determine feature points of an object,
 wherein the feature point determining step includes:
 a step of causing a profile shape data calculating unit to calculate profile shape data including at least an angle formed by line segments connecting a point to two points adjacent to the point for each of a plurality of points on a profile line of the object; and
 a step of causing a feature point specifying unit to specify positions of feature points of the object corresponding to the feature points stored in a model storage unit, which is configured to store profile shape data of a plurality of points on a profile line of a model object approximating the object and positions of feature points on the profile line in an associated manner, by performing pattern matching on the profile shape data calculated by the profile shape data calculating unit based on the profile shape data stored in the model storage unit.

32. The performance predicting method according to claim 30, further comprising an approximate model creating step of creating the approximate model,
 wherein the approximate model creating step includes:
 a first feature value extracting step of causing a first feature value extracting unit to create a first feature value table representing a first feature value of each structure model, which is extracted from the shapes of the plurality of structure models;
 a second feature value extracting step of causing a second feature value extracting unit to extract a second feature value which is a feature value contributing to estimation of the functional performance out of the first feature values of the first feature value table and to create a second feature value table; and
 an approximate model creating step of causing an approximate model creating unit to create the approximate model which is an approximate expression for estimating the functional performance using the second feature values in the second feature value table.

33. The performance predicting method according to claim 30, further comprising an approximate model creating step of creating the approximate model,
 wherein the approximate model creating step includes:
 a sampling step of causing a sampling unit to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data;
 a distance calculating step of causing a distance calculating unit to calculate distances of the coordinate points of the sample group in the coordinate space for each of the second set number of coordinate points;
 a sample exclusion determining step of causing a sample exclusion determining unit to compare the calculated distances with a predetermined distance threshold value;
 a morphing step of causing a morphing unit to perform a morphing process on a base shape using the morphing data to create a learning shape; and
 an approximate model creating step of causing an approximate model creating unit to create the approximate model using the base shape and the learning shape,
 wherein the sampling unit samples the first set number of coordinate points in the first sampling and samples the second set number of coordinate points in the subsequent sampling when repeatedly sampling the morphing data, and
 wherein the sample exclusion determining unit merges the coordinate points, which are sampled by the second set number and of which the distances are greater than the distance threshold value, into the sample group as new morphing data.

34. The performance predicting method according to claim 30, further comprising a model applying step which is performed by the model applying device including a storage unit configured to store a plurality of calculation models used to calculate a solution from input data,
 wherein the model applying step includes:
 a data input step of causing a data input unit to read the input data;
 a selection step of causing a calculation model selecting unit to select at least one calculation model to be used out of the plurality of calculation models stored in the storage unit based on the input data read in the data input step; and
 a calculation step of causing a calculation unit to calculate the solution from the input data using the calculation model selected in the selection step.

35. The performance predicting method according to claim 30, further comprising a recording permission determining step performed by a recording permission determining unit configured to determine whether new data should be entered into a storage device configured to store data including a plurality of parameters,
 wherein the recording permission determining step includes:
 a step of causing an additional data acquiring unit to acquire new data;
 a step of causing a position specifying unit to specify a position in a parameter space having the parameters of the new data acquired by the additional data acquiring unit as elements;
 a step of causing a density determining unit to determine whether a density of the data stored in the storage device at the position specified by the position specifying unit is high; and
 a step of causing a recording permission determining unit to determine that the new data acquired by the additional data acquiring unit should be entered into the storage device when the density determining unit determines that the density of the data at the position specified by the position specifying unit is low.

36. A program causing a computer used as a performance predicting apparatus to serve as:
an approximate model storage unit configured to store approximate models each of which is associated with one of categories, and which are used to calculate functional performance based on feature values;
a feature value extracting unit configured to extract the feature values from shape data representing a shape of an object;
a selection unit configured to select one of the approximate models to be used from the approximate models stored in the approximate model storage unit depending on the feature values extracted by the feature value extracting unit; and
a performance calculating unit configured to calculate functional performance based on the feature values extracted by the feature value extracting unit using the approximate model selected by the selection unit.

37. The program according to claim 36, causing a feature point determining device configured to determine feature points of an object is caused to serve as:
a profile shape data calculating unit configured to calculate profile shape data including at least an angle formed by line segments connecting a point to two points adjacent to the point for each of a plurality of points on a profile line of the object; and
a feature point specifying unit configured to specify positions of feature points of the object corresponding to the feature points stored in a model storage unit, which is configured to store profile shape data of a plurality of points on a profile line of a model object approximating the object and positions of feature points on the profile line in an associated manner, by performing pattern matching on the profile shape data calculated by the profile shape data calculating unit based on the profile shape data stored in the model storage unit, and
wherein the feature point determining device provides the specified feature points to the feature value extracting unit.

38. The program according to claim 36, causing the computer to perform operations of an approximate model creating device configured to create the approximate model,
wherein the computer serves as:
a first feature value extracting unit configured to create a first feature value table representing a first feature value of each structure model, which is extracted from the shapes of the plurality of structure models;
a second feature value extracting unit configured to extract a second feature value which is a feature value contributing to estimation of the functional performance out of the first feature values of the first feature value table and creating a second feature value table; and
an approximate model creating unit configured to create the approximate model which is an approximate expression for estimating the functional performance using the second feature values in the second feature value table.

39. The program according to claim 36, causing the computer to perform an approximate model creating of creating the approximate model,
wherein the computer is caused to serve as:
a sampling unit configured to sample morphing data including combinations of displacement magnitudes of lattice points to be displaced out of lattice points constituting a structure model by sampling a first set number of coordinate points and a second set number of coordinate points in a design space including coordinate axes representing the displacement magnitude of the lattice points to be displaced using an experimental design method and to set the coordinate points sampled by the first set number as a sample group of the morphing data;
a distance calculating unit configured to calculate distances of the coordinate points of the sample group in the coordinate space for each of the second set number of coordinate points;
a sample exclusion determining unit configured to compare the calculated distances with a predetermined distance threshold value;
a morphing unit configured to perform a morphing process on a base shape using the morphing data to create a learning shape; and
an approximate model creating unit configured to create the approximate model using the base shape and the learning shape,
wherein the sampling unit samples the first set number of coordinate points in the first sampling and samples the second set number of coordinate points in the subsequent sampling when repeatedly sampling the morphing data, and
wherein the sample exclusion determining unit merges the coordinate points, which are sampled by the second set number and of which the distances are greater than the distance threshold value, into the sample group as new morphing data.

40. The program according to claim 36, causing the computer used as a model applying device which is a part of the performance predicting apparatus to serve as:
a storage unit configured to store a plurality of calculation models used to calculate a solution from input data;
a data input unit configured to read the input data;
a calculation model selecting unit configured to select at least one calculation model to be used out of the plurality of calculation models stored in the storage unit based on the input data read by the data input unit; and
a calculating unit configured to calculate the solution from the input data using the calculation model selected by the calculation model selecting unit.

41. The program according to claim 36, causing the computer to serve as a recording permission determining device which is a part of the performance predicting apparatus and which is configured to determine whether new data should be entered into a storage device configured to store data including a plurality of parameters,
wherein the recording permission determining device includes:
an additional data acquiring unit configured to acquire new data;
a position specifying unit configured to specify a position in a parameter space having the parameters of the new data acquired by the additional data acquiring unit as elements;
a density determining unit configured to determine whether a density of the data stored in the storage device at the position specified by the position specifying unit is high; and a recording permission determining unit configured to determine that the new data acquired by the additional data acquiring unit should be entered into the storage device when the density determining unit determines that the density of the data at the position specified by the position specifying unit is low.

* * * * *